US012765345B2

(12) United States Patent
Hausmann et al.

(10) Patent No.: US 12,765,345 B2
(45) Date of Patent: Oct. 13, 2026

(54) INTEGRATION OF FULLY ALIGNED VIA THROUGH SELECTIVE DEPOSITION AND RESISTIVITY REDUCTION

(71) Applicant: Lam Research Corporation, Fremont, CA (US)

(72) Inventors: Dennis M. Hausmann, Lake Oswego, OR (US); Pankaj Ghanshyam Ramnani, Pleasanton, CA (US); Kashish Sharma, Tigard, OR (US); Paul C. Lemaire, Portland, OR (US); Arpan Pravin Mahorowala, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 202 days.

(21) Appl. No.: 18/555,507

(22) PCT Filed: Apr. 15, 2022

(86) PCT No.: PCT/US2022/071758
§ 371 (c)(1),
(2) Date: Oct. 13, 2023

(87) PCT Pub. No.: WO2022/221881
PCT Pub. Date: Oct. 20, 2022

(65) Prior Publication Data

US 2024/0030062 A1 Jan. 25, 2024

Related U.S. Application Data

(60) Provisional application No. 63/201,195, filed on Apr. 16, 2021.

(51) Int. Cl.
*H01L 21/76* (2006.01)
*B05D 1/00* (2006.01)
(Continued)

(52) U.S. Cl.
CPC ............ *H10W 20/077* (2026.01); *B05D 1/60* (2013.01); *C23C 16/26* (2013.01); *C23C 16/34* (2013.01);
(Continued)

(58) Field of Classification Search
CPC ......... H01L 21/76834; H01L 23/53295; H01L 21/76829; H01L 21/76832; B05D 1/60;
(Continued)

(56) References Cited

U.S. PATENT DOCUMENTS

| | | |
|---|---|---|
| 5,110,577 A | 5/1992 | Tamor et al. |
| 5,712,000 A | 1/1998 | Wei et al. |

(Continued)

FOREIGN PATENT DOCUMENTS

| | | |
|---|---|---|
| CA | 3113726 A1 | 6/2020 |
| CN | 102892922 A | 1/2013 |

(Continued)

OTHER PUBLICATIONS

CN Office Action dated May 11, 2024 in CN Application No. 202080068732.8 with English translation.

(Continued)

*Primary Examiner* — S M Sohel Imtiaz
(74) *Attorney, Agent, or Firm* — Weaver Austin Villeneuve & Sampson LLP

(57) ABSTRACT

Methods and apparatuses for an integration scheme for forming a fully aligned via using selective deposition of graphene on metal surfaces and selective deposition of an inhibitor layer on exposed barrier surfaces prior to depositing dielectric material are provided.

10 Claims, 10 Drawing Sheets

(51) Int. Cl.

| | |
|---|---|
| ***C23C 16/26*** | (2006.01) |
| ***C23C 16/34*** | (2006.01) |
| ***C23C 16/455*** | (2006.01) |
| ***C23C 16/505*** | (2006.01) |
| ***H01J 37/32*** | (2006.01) |
| ***H10W 20/00*** | (2026.01) |
| ***H10W 20/41*** | (2026.01) |
| ***H10W 20/42*** | (2026.01) |
| ***H10W 20/44*** | (2026.01) |
| ***H10W 20/47*** | (2026.01) |

(52) U.S. Cl.
CPC ...... *C23C 16/45565* (2013.01); *C23C 16/505* (2013.01); *H01J 37/32449* (2013.01); *H01J 37/32899* (2013.01); *H10W 20/038* (2026.01); *H10W 20/048* (2026.01); *H10W 20/069* (2026.01); *H10W 20/42* (2026.01); *H10W 20/425* (2026.01); *H10W 20/4403* (2026.01); *H10W 20/47* (2026.01); *H01J 37/3211* (2013.01); *H01J 37/32357* (2013.01); *H01J 2237/332* (2013.01)

(58) Field of Classification Search
CPC ... C23C 16/26; C23C 16/34; C23C 16/45565; C23C 16/505; C23C 16/04; H01J 37/32449; H01J 37/32899
See application file for complete search history.

(56) References Cited

U.S. PATENT DOCUMENTS

| | | | | |
|---|---|---|---|---|
| 6,451,705 | B1 | 9/2002 | Trapp et al. | |
| 8,084,339 | B2 | 12/2011 | Antonelli et al. | |
| 8,623,761 | B2 | 1/2014 | Bonilla et al. | |
| 9,184,060 | B1 | 11/2015 | Lee | |
| 9,209,136 | B2 | 12/2015 | Barth | |
| 9,337,149 | B2 | 5/2016 | Im et al. | |
| 9,508,801 | B2 | 11/2016 | Franklin et al. | |
| 9,514,932 | B2 | 12/2016 | Mallick et al. | |
| 9,837,270 | B1 | 12/2017 | Varadarajan et al. | |
| 9,865,699 | B2 | 1/2018 | Kondo et al. | |
| 10,453,681 | B2 * | 10/2019 | Tapily | H01L 21/02175 |
| 10,465,291 | B2 | 11/2019 | Yeh et al. | |
| 11,075,113 | B2 | 7/2021 | Lee et al. | |
| 11,205,618 | B2 | 12/2021 | Yang et al. | |
| 11,626,282 | B2 | 4/2023 | Lee et al. | |
| 11,682,622 | B2 | 6/2023 | Byun et al. | |
| 11,887,850 | B2 | 1/2024 | Shin et al. | |
| 12,354,880 | B2 | 7/2025 | Belau et al. | |
| 12,368,075 | B2 | 7/2025 | Varadarajan et al. | |
| 2003/0096504 | A1 | 5/2003 | Ryu et al. | |
| 2006/0264060 | A1 | 11/2006 | Ramaswamy et al. | |
| 2006/0292846 | A1 | 12/2006 | Pinto et al. | |
| 2007/0032054 | A1 | 2/2007 | Ramaswamy et al. | |
| 2007/0032082 | A1 | 2/2007 | Ramaswamy et al. | |
| 2008/0188081 | A1 | 8/2008 | Chi et al. | |
| 2008/0265301 | A1 | 10/2008 | Fang et al. | |
| 2008/0296736 | A1 | 12/2008 | Fu et al. | |
| 2012/0080661 | A1 | 4/2012 | Saito et al. | |
| 2012/0080796 | A1 | 4/2012 | Wada et al. | |
| 2012/0139114 | A1 | 6/2012 | Zhang et al. | |
| 2012/0276743 | A1 | 11/2012 | Won et al. | |
| 2013/0059450 | A1 | 3/2013 | Le Gouil et al. | |
| 2013/0089988 | A1 | 4/2013 | Wang et al. | |
| 2013/0113102 | A1 * | 5/2013 | Bao | H01L 21/76843 977/734 |
| 2013/0302940 | A1 | 11/2013 | Avouris et al. | |
| 2014/0045342 | A1 | 2/2014 | Mallick et al. | |
| 2014/0127896 | A1 | 5/2014 | Bonilla et al. | |
| 2014/0284802 | A1 | 9/2014 | Sakata et al. | |
| 2014/0356549 | A1 | 12/2014 | Varadarajan | |
| 2014/0367857 | A1 | 12/2014 | Yang et al. | |
| 2015/0041981 | A1 | 2/2015 | Bao et al. | |
| 2015/0079342 | A1 | 3/2015 | Boyd et al. | |
| 2015/0093915 | A1 | 4/2015 | Reddy et al. | |
| 2015/0132968 | A1 | 5/2015 | Ren et al. | |
| 2015/0232343 | A1 | 8/2015 | Liu et al. | |
| 2015/0303056 | A1 | 10/2015 | Varadarajan et al. | |
| 2015/0332932 | A1 | 11/2015 | Hirotsu et al. | |
| 2015/0371851 | A1 | 12/2015 | Lee et al. | |
| 2016/0005648 | A1 * | 1/2016 | Yang | H01L 21/76829 438/653 |
| 2016/0017484 | A1 | 1/2016 | Kikuchi et al. | |
| 2016/0035676 | A1 | 2/2016 | Im et al. | |
| 2016/0056384 | A1 | 2/2016 | Barth | |
| 2016/0075560 | A1 | 3/2016 | Kagaya et al. | |
| 2016/0087028 | A1 | 3/2016 | Hirota et al. | |
| 2016/0204204 | A1 | 7/2016 | Franklin et al. | |
| 2016/0270237 | A1 | 9/2016 | Cho et al. | |
| 2017/0029942 | A1 | 2/2017 | Matsumoto | |
| 2017/0051399 | A1 | 2/2017 | Veerasamy | |
| 2017/0076955 | A1 | 3/2017 | Hudson et al. | |
| 2017/0148640 | A1 | 5/2017 | Wang et al. | |
| 2017/0178899 | A1 | 6/2017 | Kabansky et al. | |
| 2017/0301537 | A1 | 10/2017 | Behera et al. | |
| 2017/0372899 | A1 | 12/2017 | Yang et al. | |
| 2018/0033727 | A1 | 2/2018 | Lee et al. | |
| 2018/0148832 | A1 | 5/2018 | Chatterjee et al. | |
| 2018/0182612 | A1 | 6/2018 | Fukuoka et al. | |
| 2018/0182664 | A1 | 6/2018 | McHugh et al. | |
| 2018/0301335 | A1 | 10/2018 | Tapily et al. | |
| 2018/0350913 | A1 | 12/2018 | Yang et al. | |
| 2019/0010604 | A1 | 1/2019 | Boyd et al. | |
| 2019/0057862 | A1 | 2/2019 | Yang et al. | |
| 2019/0074164 | A1 | 3/2019 | Li | |
| 2019/0085457 | A1 | 3/2019 | Ifuku et al. | |
| 2019/0093227 | A1 | 3/2019 | Yeh et al. | |
| 2019/0144283 | A1 | 5/2019 | Jakobsen et al. | |
| 2019/0161351 | A1 | 5/2019 | Song et al. | |
| 2019/0233942 | A1 | 8/2019 | Haberle et al. | |
| 2019/0288132 | A1 | 9/2019 | Wang et al. | |
| 2019/0345609 | A1 | 11/2019 | Chen et al. | |
| 2019/0363048 | A1 | 11/2019 | Zhao et al. | |
| 2019/0393030 | A1 | 12/2019 | Jiang et al. | |
| 2020/0048762 | A1 * | 2/2020 | Ke | C23C 16/04 |
| 2020/0118924 | A1 | 4/2020 | Yang et al. | |
| 2020/0216949 | A1 | 7/2020 | Bhuyan et al. | |
| 2021/0020444 | A1 * | 1/2021 | Tapily | H01L 21/0228 |
| 2021/0028149 | A1 | 1/2021 | Makala et al. | |
| 2021/0082832 | A1 * | 3/2021 | Yang | H01L 21/76829 |
| 2021/0125929 | A1 * | 4/2021 | Shin | H01L 21/76834 |
| 2021/0151348 | A1 | 5/2021 | Utsuno et al. | |
| 2021/0210346 | A1 | 7/2021 | Shin et al. | |
| 2022/0130572 | A1 | 4/2022 | Deemer et al. | |
| 2022/0139823 | A1 * | 5/2022 | Lin | H01L 23/53209 257/774 |
| 2022/0157711 | A1 | 5/2022 | Lee et al. | |
| 2022/0375722 | A1 | 11/2022 | Varadarajan et al. | |
| 2022/0399230 | A1 | 12/2022 | Varadarajan et al. | |
| 2023/0081817 | A1 | 3/2023 | Belau et al. | |
| 2023/0245924 | A1 | 8/2023 | Narkeviciute et al. | |
| 2024/0213159 | A1 | 6/2024 | Parbatani et al. | |
| 2024/0282570 | A1 | 8/2024 | Varadarajan et al. | |
| 2024/0332128 | A1 | 10/2024 | Uzoh et al. | |
| 2024/0356062 | A1 | 10/2024 | Hersam et al. | |
| 2024/0395544 | A1 | 11/2024 | Sharma et al. | |
| 2025/0096036 | A1 | 3/2025 | Parbatani et al. | |

FOREIGN PATENT DOCUMENTS

| | | | |
|---|---|---|---|
| CN | 103981507 | A | 8/2014 |
| CN | 104141113 | A | 11/2014 |
| CN | 105702630 | A | 6/2016 |
| CN | 107833825 | A | 3/2018 |
| CN | 115428141 | A | 12/2022 |
| CN | 117981070 | A | 5/2024 |
| CN | 117999646 | A | 5/2024 |
| DE | 102013113853 | A1 | 6/2015 |
| DE | 102018110189 | A1 | 10/2019 |
| EP | 3510624 | B1 | 2/2021 |
| JP | H04176868 | A | 6/1992 |
| JP | H0594970 | A | 4/1993 |

(56) References Cited

FOREIGN PATENT DOCUMENTS

| | | | | |
|---|---|---|---|---|
| JP | H07169747 A | | 7/1995 | |
| JP | H1053883 A | | 2/1998 | |
| JP | 2000311890 A | | 11/2000 | |
| JP | 2011190156 A | | 9/2011 | |
| JP | 2013510071 A | | 3/2013 | |
| JP | 2015073096 A | | 4/2015 | |
| JP | 2015519748 A | | 7/2015 | |
| JP | 2015519749 A | | 7/2015 | |
| JP | 2015211139 A | | 11/2015 | |
| JP | 2016105465 A | | 6/2016 | |
| JP | 2017512181 A | | 5/2017 | |
| JP | 2018076604 A | | 5/2018 | |
| JP | 2018105998 A | | 7/2018 | |
| JP | 2018182328 A | | 11/2018 | |
| JP | 2020017728 A | | 1/2020 | |
| JP | 6648563 B2 | | 2/2020 | |
| JP | 2023514831 A | | 4/2023 | |
| JP | 2023531617 A | | 7/2023 | |
| JP | 2024518276 A | | 5/2024 | |
| KR | 20150116570 A | | 10/2015 | |
| KR | 20160000863 A | | 1/2016 | |
| KR | 101633039 B1 | * | 6/2016 | H01L 21/76834 |
| KR | 20180075898 A | | 7/2018 | |
| KR | 20200011197 A | | 2/2020 | |
| KR | 20200112446 A | | 10/2020 | |
| KR | 102320089 B1 | | 10/2021 | |
| KR | 20220143731 A | | 10/2022 | |
| KR | 20230028788 A | | 3/2023 | |
| KR | 102580008 B1 | | 9/2023 | |
| KR | 20230167695 A | | 12/2023 | |
| TW | 201304059 A | | 1/2013 | |
| TW | 201438062 A | | 10/2014 | |
| TW | 201500572 A | | 1/2015 | |
| TW | 201706455 A | | 2/2017 | |
| TW | 201810592 A | | 3/2018 | |
| TW | 201819283 A | | 6/2018 | |
| TW | 201833364 A | | 9/2018 | |
| TW | 201839912 A | | 11/2018 | |
| TW | 201919992 A | | 6/2019 | |
| TW | 202124273 A | | 7/2021 | |
| WO | WO-2013172792 A1 | | 11/2013 | |
| WO | WO-2014110446 A2 | | 7/2014 | |
| WO | WO-2019212986 A1 | | 11/2019 | |
| WO | WO-2019246191 A1 | | 12/2019 | |
| WO | WO-2020023378 A1 | | 1/2020 | |
| WO | WO-2021067118 A1 | | 4/2021 | |
| WO | WO-2021168134 A1 | | 8/2021 | |
| WO | WO-2021262527 A1 | | 12/2021 | |
| WO | WO-2022221881 A1 | | 10/2022 | |
| WO | WO-2022271525 A1 | | 12/2022 | |
| WO | WO-2023004328 A1 | | 1/2023 | |
| WO | WO-2023004329 A1 | | 1/2023 | |
| WO | WO-2023023009 A1 | | 2/2023 | |
| WO | WO-2024102081 A1 | | 5/2024 | |

OTHER PUBLICATIONS

Hiramatsu, M., et al., "Initial Growth Process of Carbon Nanowalls Synthesized by Radical Injection Plasma-enhanced Chemical Vapor Deposition," Journal of Applied Physics, 2009, vol. 106, 094302, pp. 1-7.

Hiramatsu, M., etal., "Fabrication of Carbon Nanowalls using Novel Plasma Processing," Japanese Journal of Applied Physics, 2006, vol. 45(6B), pp. 5522-5527.

Hori, M., et aL, "Radical-controlled Plasma Processing for Nanofabrication," Journal of Physics D: Applied Physics, 2011, vol. 44, 174027, pp. 1-17.

International Preliminary Report on Patentability and Written Opinion dated Apr. 11, 2024 in PCT Application No. PCT/US2022/077307.

International Preliminary Report on Patentability and Written Opinion dated Jan. 4, 2024 in PCT Application No. PCT/US2022/033777.

International Preliminary Report on Patentability dated Oct. 26, 2023, in Application No. PCT/US2022/071758.

International Preliminary Reporton Patentability and Written Opinion dated Feb. 1, 2024 in PCT Application No. PCT/US2022/073905.

International Preliminary Reporton Patentability and Written Opinion dated Feb. 1, 2024 in PCT Application No. PCT/US2022/073906.

JP Office Action dated Nov. 5, 2024 in JP Application No. 2022-519665 with English translation.

JP Office Action dated Oct. 8, 2024 in JP Application No. 2022-549012 with English translation.

TW Office Action dated May 23, 2024 in TW Application No. 109133813 with English translation.

TW Office Action dated May 31, 2024 in TW Application No. 110105693 with English translation.

TW Office Action dated Oct. 30, 2024 in TW Application No. 109133813 with English translation.

U.S. Advisory Action dated Jun. 27, 2024 in U.S. Appl. No. 17/753,776.

U.S. Final Office Action dated Apr. 19, 2024 in U.S. Appl. No. 17/753,776.

U.S. Non-Final Office Action dated Dec. 22, 2023 in U.S. Appl. No. 17/753,776.

U.S. Non-Final Office Action dated Oct. 10, 2024 in U.S. Appl. No. 17/904,046.

U.S. Appl. No. 18/291,532, inventor Parbatani A, filed on Jan. 23, 2024.

Zhang, Y., et al., "Low Temperature Remote Plasma Enhanced Atomic Layer Deposition of Graphene and Characterization of Its Atomic Level Structure," Journal of Materials Chemistry c 2014, vol. 2, pp. 7570-7574.

Boyd, et al., 'Single-step deposition of high-mobility graphene at reduced temperatures' Nature Comm., Mar. 18, 2015, pp. 1-8.

International Preliminary Report on Patentability dated Jan. 5, 2023, in PCT Application PCT/US2021/037885.

International Preliminary Report on Patentability dated Sep. 1, 2022, in PCT Application No. PCT/US2021/018606.

International Search Report and Written Opinion dated Jun. 9, 2021 issued in Application No. PCT/US2021/018606.

International Search Report and Written Opinion dated Nov. 11, 2022 in PCT Application No. PCT/US2022/073906.

International Preliminary Report on Patentability and Written Opinion dated Aug. 25, 2022 in Application No. PCT/US2021/015650.

International Preliminary Report on Patentability dated Apr. 14, 2022 from PCT/US2020/052549.

International Search Report and Written Opinion dated Aug. 5, 2022, in Application No. PCT/US2022/071758.

International Search Report and Written Opinion dated Jan. 13, 2021, in PCT Application No. PCT/US2020/052549.

International Search Report and Written Opinion dated Jan. 20, 2023 in PCT Application No. PCT/US2022/077307.

International Search Report and Written Opinion dated Jul. 8, 2021 in PCT Application No. PCT/US2021/015650.

International Search Report and Written Opinion dated Nov. 16, 2022 in PCT Application No. PCT/US2022/073905.

International Search Report and Written Opinion dated Oct. 7, 2021, in PCT Application No. PCT/US2021/037885.

International Search Report and Written Opinion dated Oct. 13, 2022, in PCT Application No. PCT/US2022/033777.

Nogami, T. et al., "Electromigration and Line R of Graphene Capped Cu Dual Damascene Interconnect", 2021 IEEE International Electron Devices Meeting (IEDM). IEEE, 2021, 4 pages.

U.S. Restriction requirement dated Jun. 22, 2023, in U.S. Appl. No. 17/753,776.

CN Office Action dated Dec 3, 2025 in CN Application No. 202080068732.8, with English Translation.

CN Office Action dated Jan. 9, 2025 in CN Application No. 202080068732.8 with English translation.

CN Office Action dated Mar. 22, 2025 in CN Application No. 202080068732.8, with English Translation.

JP Office Action dated Dec 16, 2025 in JP Application No. 2023-562820, with English Translation.

(56) References Cited

OTHER PUBLICATIONS

JP Office Action dated Jul. 8, 2025 in JP Application No. 2022-519665, with English Translation.
JP Office Action dated Jun. 17, 2025 in JP Application No. 2022-577465, with English Translation.
KR Decision for Grant and Search Report dated Jul. 23, 2025 in KR Application No. 10-2022-7032313, with English translation.
KR Decision to Grant and Search Report dated Jan. 24, 2026 in KR Application No. 10-2022-7031230, with English translation.
KR Office Action dated Apr. 8, 2025 in KR Application No. 10-2022-7031230, with English Translation.
KR Office Action dated Aug. 21, 2025 in KR Application No. 10-2022-7045903, with English Translation.
KR Office Action dated Feb. 6, 2026 in KR Application No. 10-2024-7006109, with English Translation.
KR Office Action dated Feb. 6, 2026 in KR Application No. 10-2024-7006110, with English Translation.
KR Office Action dated Jan. 26, 2026 in KR Application No. 10-2023-7002700, with English Translation.
KR Office Action dated Jul. 17, 2025 in KR Application No. 10-2022-7014699, with English Translation.
KR Office Action dated Jun. 13, 2025 in KR Application No. 10-2023-7002700, with English Translation.
KR Office Action dated Mar. 9, 2026 in KR Application No. 10-2023-7002700, with English Translation.
KR Office Action dated May 8, 2025 in KR Application No. 10-2022-7032313, with English Translation.
SG Search Report and Written Opinion dated Jul. 14, 2025 in SG Application No. 11202252324M.
SG Search Report and Written Opinion dated Jul. 18, 2025 in SG Application No. 11202261351U.
SG Written Opinion dated Jan. 9, 2025 in SG Application No. 11202202928P.
Singh S V., et al., "A Hard Graphite like Hydrogenated Amorphous Carbon Grown at High Deposition Rate," Applied Physics Letter, Jun. 2008, vol. 92, pp. 1-4.
Singh S V., et al., "Hard Graphitelike Hydrogenated Amorphous Carbon Grown at High Rates by a Remote Plasma," Journal of Applied Physics, Jan. 2010, vol. 107, pp. 1-11.
TW Notice of Allowance and Search Report dated Jan. 28, 2026 in TW Application No. 111114441, with English translation.
TW Office Action and Search Report dated Feb. 5, 2026 in TW Application No. 111122791, with English Translation.
TW Office Action and Search Report dated Jan. 8, 2026 in TW Application No. 111127321, with English Translation.
TW Office Action dated Feb. 26, 2026 in TW Application No. 111136482, with English Translation.
TW Office Action dated Jan. 7, 2025 in TW Application No. 110122691 with English translation.
TW Office Action dated Jul. 29, 2025 in TW Application No. 114107015, with English Translation.
U.S. Corrected Notice of Allowance dated Jun. 17, 2025 in U.S. Appl. No. 17/904,046.
U.S. Corrected Notice of Allowance dated Jun. 24, 2025 in U.S. Appl. No. 17/904,361.
U.S. Corrected Notice of Allowance dated Mar. 28, 2025 in U.S. Appl. No. 17/904,361.
U.S. Final Office Action dated Jul. 29, 2025 in U.S. Appl. No. 17/753,776.
U.S. Final Office Action dated Mar. 10, 2026 in U.S. Appl. No. 17/753,776.
US Non-Final Office Action dated Apr. 24, 2025 in U.S. Appl. No. 17/753,776.
U.S. Non-Final Office Action dated Feb. 9, 2026 in U.S. Appl. No. 18/569,100.
U.S. Non-Final Office Action dated Mar. 19, 2026 in U.S. Appl. No. 18/291,200.
U.S. Non-Final Office Action dated Mar. 20, 2026 in U.S. Appl. No. 18/291,532.
US Non-Final Office Action dated May 20, 2025 in U.S. Appl. No. 18/002,043.
U.S. Non-Final Office Action dated Nov. 10, 2025 in U.S. Appl. No. 17/753,776.
U.S. Non-Final Office Action dated Oct. 6, 2025 in U.S. Appl. No. 18/002,043.
U.S. Notice of Allowance dated Mar. 12, 2025 in U.S. Appl. No. 17/904,046.
U.S. Notice of Allowance dated Mar. 19, 2025 in U.S. Appl. No. 17/904,361.
Wrobel, A M., et al., "Remote Hydrogen Plasma Chemical Vapor Deposition from (Dimethylsilyl) (trimethylsilyl)methane. 1. Kinetics of the Process; Chemical and Morphological Structure of Deposited Silicon-Carbon Films," Chemistry of Materials, 2003, vol. 15 (8), pp. 1749-1756.
KR Decision for Grant and Search Report dated Aug. 4, 2026 in KR Application No. 10-2022-7045903, with English translation.
SG Written Opinion dated Jul. 7, 2026 in SG Application No. 11202252324M.

* cited by examiner

INTEGRATION OF FULLY ALIGNED VIA THROUGH SELECTIVE DEPOSITION AND RESISTIVITY REDUCTION

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in their entireties and for all purposes.

BACKGROUND

Graphene is an allotrope of carbon in which the atoms are arrayed in a single atom sheet in a regular hexagonal pattern. Graphene has attracted interest in many fields and industries because of its high electrical conductivity, high thermal conductivity, good mechanical strength and toughness, optical transparency, and high electron mobility, among other favorable properties. Interest in graphene is growing in the semiconductor industry.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

One aspect involves a method for processing substrates, the method including: providing a semiconductor substrate, where the semiconductor substrate includes a metal layer formed in a dielectric layer and a barrier layer between the metal layer and the dielectric layer, the metal layer having an exposed metal surface and the barrier layer having an exposed barrier surface; selectively depositing graphene on the exposed metal surface; after selectively depositing graphene on the exposed metal surface, selectively depositing an inhibitor layer on the exposed barrier surface; and selectively depositing a dielectric material on the dielectric layer.

In various embodiments, the inhibitor layer is selectively deposited on the exposed barrier surface before the dielectric material is selectively deposited on the dielectric layer.

In various embodiments, the inhibitor layer is a dielectric material.

In various embodiments, the inhibitor layer is a material such as one or more of amides, beta-diketonates, and halides.

In various embodiments, the inhibitor layer includes molecules having a hydrocarbon group. In some embodiments, the hydrocarbon group is one or more of alkanes, alkenes, and alkynes.

In various embodiments, the inhibitor layer is deposited using an organometallic deposition precursor.

In various embodiments, the inhibitor layer is deposited using reactants such as one or more of alcohols and amides.

In various embodiments, the barrier layer comprises a metal nitride. In some embodiments, the metal nitride is one or more of titanium nitride, tungsten nitride, and tantalum nitride.

In various embodiments, the inhibitor layer is deposited by atomic layer deposition.

In various embodiments, the inhibitor layer is deposited under plasma-free conditions.

In various embodiments, a surface of the graphene is free or substantially free of hydrogen-terminated sites and hydroxyl-terminated sites.

In various embodiments, the graphene inhibits deposition of the dielectric material on the graphene when the dielectric material is selectively deposited on the dielectric layer.

In various embodiments, the inhibitor layer inhibits deposition of the dielectric material on the barrier layer when the dielectric material is selectively deposited on the dielectric layer.

In various embodiments, the dielectric material includes a metal oxide. In some embodiments, the metal oxide includes aluminum oxide, hafnium oxide, zirconium oxide, yttrium oxide, zinc oxide, titanium oxide, or combinations thereof.

In various embodiments, dielectric material includes a low-k dielectric material. In some embodiments, the method also includes depositing a metal oxide on the low-k dielectric material and the graphene, where the metal oxide has a different etch selectivity than the low-k dielectric material and a thickness of the low-k dielectric material is at least two times greater than a thickness of the metal oxide.

In various embodiments, the metal layer includes copper, cobalt, ruthenium, nickel, molybdenum, or combinations thereof.

In various embodiments, the method also includes exposing the graphene to a non-direct plasma to modify a surface of the graphene to form a modified surface; and depositing a metal oxide on the modified surface of the graphene and the dielectric material by a thermal-based deposition technique. In some embodiments, depositing the metal oxide includes depositing aluminum oxide by atomic layer deposition (ALD). In some embodiments, the non-direct plasma includes radicals of hydrogen mixed with radicals of oxygen, ammonia, nitrogen, or combinations thereof.

In various embodiments, the method also includes removing the graphene; and depositing a metal oxide on the exposed metal surface and the dielectric material.

In various embodiments, the method also includes removing the graphene; and depositing a hermetic barrier on the exposed metal surface and the dielectric material.

In various embodiments, selectively depositing the graphene on the exposed metal surface includes: flowing one or more hydrocarbon precursors into a reaction chamber and towards the semiconductor substrate; generating, from a hydrogen source gas, radicals of hydrogen in a remote plasma source; and introducing the radicals of hydrogen into the reaction chamber and towards the semiconductor substrate, wherein the radicals of hydrogen react with the one or more hydrocarbon precursors to deposit the graphene on the exposed metal surface.

Another aspect involves a semiconductor device having: a first dielectric layer; a barrier layer lining the first dielectric layer; a first metal layer formed in the first dielectric layer on the barrier layer; a selective graphene film selectively formed on atop surface of the first metal layer relative to the first dielectric layer; a selective inhibitor layer selectively formed on a top surface of the barrier layer relative to the selective graphene film and the first dielectric layer; and a selective dielectric layer selectively formed on a top surface of the first dielectric layer relative to the first metal layer and the barrier layer.

Another aspect involves an apparatus for processing substrates, the apparatus including: one or more process chambers, each process chamber including a chuck; one or more gas inlets into the process chambers and associated flow-control hardware; and a controller having at least one processor and a memory, whereby the at least one processor and the memory are communicatively connected with one another, the at least one processor is at least operatively connected with the flow-control hardware, and the memory stores computer-executable instructions for controlling the at least one processor to at least control the flow-control hardware to: cause introduction of a hydrocarbon precursor to selectively deposit graphene on an exposed metal surface of a substrate; cause introduction of an organometallic deposition precursor to selectively deposit an inhibitor layer on an exposed barrier surface of the substrate; and cause introduction of a dielectric deposition precursor to selectively form a dielectric material on a dielectric layer on the substrate. In various embodiments, the instructions also include instructions for causing any one or more of the above operations performed in accordance with certain methods.

These and other aspects are described further below with reference to the drawings.

DETAILED DESCRIPTION

Figure 1:
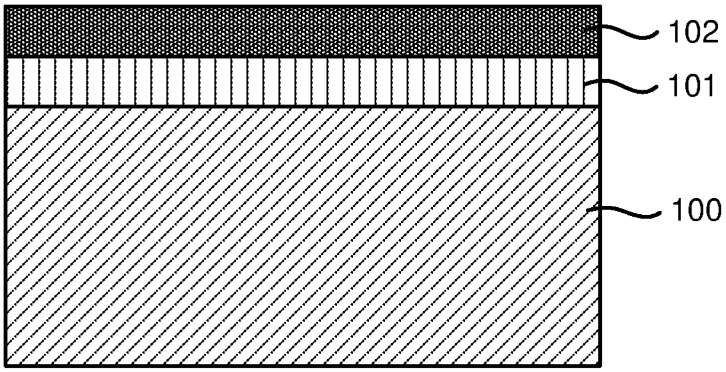
FIG. 1 illustrates a cross-sectional schematic of a substrate stack in accordance with certain disclosed embodiments to some implementations.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

In the present disclosure, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication. A wafer or substrate used in the semiconductor device industry typically has a diameter of 200 mm, or 300 mm, or 450 mm. The following detailed description assumes the present disclosure is implemented on a wafer. However, the present disclosure is not so limited. The work piece may be of various shapes, sizes, and materials. In addition to semiconductor wafers, other work pieces that may take advantage of the present disclosure include various articles such as printed circuit boards and the like.

There is a growing interest in synthesizing large-area graphene films in semiconductor applications. However, there are many challenges associated with production of graphene in sufficient quantities and under suitable conditions for semiconductor integration. Many production methods suffer from low surface coverage because of the difficulty of growing graphene with minimal defects. Thus, scalability to produce large-area graphene films presents a particular problem, especially large-area graphene films on semiconductor wafers. Furthermore, graphene films are typically grown by thermal chemical vapor deposition (CVD). Thermal CVD methods are generally favored for synthesis of large-area, high-quality graphene. However, thermal CVD of graphene may be performed at elevated temperatures, which may not necessarily be compatible with semiconductor applications. Under such high temperatures, various materials such as semiconductors and metals on semiconductor wafers may be physically damaged. The thermal CVD process involves at least two steps: activation of gaseous precursors and chemical reaction to form a stable, solid film on a suitable substrate. In thermal CVD, activation of gaseous precursors can occur by thermal decomposition. At elevated temperatures, hydrocarbon precursors thermally decompose and adsorb onto a substrate surface. Hydrocarbon radicals are chemically reactive and may interact with the substrate surface. The substrate surface may be a metal surface that acts as a catalyst for nucleation and growth of graphene. Without being limited by any theory, the catalytic metal surface may dehydrogenate the hydrocarbon radicals so that carbon atoms may bond with other carbon atoms, thereby promoting nucleation and growth of graphene. Various transition metals such as copper have been recognized as catalysts for nucleation and growth of graphene.

Activation of hydrocarbon species and graphene growth can depend on factors such as temperature and the metal surface on which graphene is grown. In addition, graphene growth can depend on carbon solubility on the metal surface. If the metal has high carbon solubility, carbon more easily dissolves in the metal and tends to precipitate on the metal surface. This generally leads to less uniform graphene layers and more microstructural defects owing to multiple nucleation sites and an unpredictable quantity of segregated carbon on the metal surface. Nickel substrates, for example, have high carbon solubility and typically lead to multiple layers of low-quality graphene or disordered carbon. If the metal has low carbon solubility, carbon dissolves less easily in the metal and this results in an extensive surface migration of carbon atoms on the metal surface and minimal diffusion into bulk metal. This generally leads to more uniform graphene layers and fewer microstructural defects owing to more controlled growth. Copper substrates, for example, have low carbon solubility and result in epitaxial growth of high-quality graphene. The high-quality graphene may be grown as a single layer, bilayer, or few-layer graphene film.

Plasma-enhanced chemical vapor deposition (PECVD) is another method of depositing graphene. Whereas thermal CVD methods activate hydrocarbon precursors by thermal decomposition, energized electrons generated by plasma cause ionization, excitation, and dissociation of hydrocarbon precursors in PECVD methods. The plasma may be formed in-situ or remotely. Hydrocarbon precursors (e.g., methane) may be activated in a plasma and a substrate is exposed to the plasma. The plasma may be generated using a radio-frequency (RF) plasma source, microwave (MW) plasma source, surface wave (SW) plasma source, or remote plasma source. By way of an example, molecular hydrogen and methane gas may be introduced in a reaction chamber and direct RF plasma may be ignited to promote graphene growth on a substrate. With PECVD, graphene growth in some PECVD methods may be performed at lower temperatures compared to thermal CVD methods. Moreover, graphene growth in some PECVD methods may be accomplished on non-metal substrates such as dielectric materials. In other words, plasma-based methods may deposit graphene in the absence of metal catalysts. Plasma-based methods may deposit graphene at lower temperatures and without the assistance of metal catalysts.

FIG. 1 illustrates a cross-sectional schematic of an example substrate having a metal surface with graphene deposited thereon according to some implementations. The substrate 100 can be any wafer, semiconductor wafer, partially fabricated integrated circuit, printed circuit board, display screen, or other appropriate workpiece. In some implementations, the substrate 100 is a semiconductor substrate such as a silicon (Si) substrate. The substrate 100 can include a metal surface 101. As discussed below, the metal surface 101 can also be referred to as a temperature sensitive underlayer. In some implementations, the metal surface 101 can include any appropriate metal such as a transition metal. For example, the metal surface 101 can include copper (Cu), ruthenium (Ru), nickel (Ni), molybdenum (Mo), cobalt (Co), or combinations thereof. A graphene film 102 can be deposited on the metal surface 101.

In some implementations, depositing the graphene film 102 on the metal surface 101 of the substrate 100 may be accomplished by remote hydrogen plasma CVD. In some other implementations, depositing the graphene film 102 on the metal surface 101 of the substrate 100 may be accomplished using any suitable deposition technique such as thermal CVD or PECVD. A remote hydrogen plasma CVD method may deposit the graphene film 102 at low temperatures that are compatible with semiconductor processing, such as back end of line (BEOL) semiconductor processing. In some implementations, the graphene film 102 may be deposited at temperatures of about 200° C. to about 500° C., or below about 500° C., below about 450° C., below about 400° C., below about 350° C., below about 300° C., or about 200° C. to about 400° C.

When depositing the graphene film 102 using remote hydrogen plasma CVD, a hydrocarbon precursor is flowed to the metal surface 101 of the substrate 100 and hydrogen radicals are generated in a remote plasma source upstream of the hydrocarbon precursor flow. The hydrogen radicals interact with the hydrocarbon precursor to activate the hydrocarbon precursor downstream from the remote plasma source, and the activated hydrocarbon precursor interacts with the metal surface 101 to cause graphene film 102 to deposit. In some implementations, the hydrocarbon precursor includes an alkene group or alkyne group.

In some implementations of the present disclosure, the substrate 100 can include a temperature sensitive underlayer 101. The temperature sensitive underlayer 101 may have a temperature sensitive limit. Above the temperature sensitive limit of the temperature sensitive underlayer 101, the temperature sensitive underlayer 101 melts or is otherwise physically damaged. The temperature sensitive limit may be about 400° C. to about 700° C. for many materials of the temperature sensitive underlayer 101. Some thermal CVD methods and some conventional plasma-based CVD methods may exceed the temperature sensitive limit of the temperature sensitive underlayer 101. Examples of temperature sensitive underlayers 101 can include transition metals such as copper, cobalt, and ruthenium. In some implementations, a graphene film 102 is deposited on the temperature sensitive underlayer 101. In some implementations, the graphene film 102 is deposited at sufficiently low temperatures that do not melt or otherwise physically damage the temperature sensitive underlayer 101. The substrate 100 may be a semiconductor wafer or semiconductor workpiece. Hence, the graphene film 102 may be deposited as a large-area graphene film on the substrate 100 at full wafer level.

In some implementations, the graphene film 102 is deposited using remote hydrogen plasma CVD. As used herein, the term "remote" in literature may generally refer to the remoteness of the substrate from the plasma. As used herein, a "remote plasma" may refer to a plasma in which plasma generation occurs at a location that is remote from the substrate. Here, the remote hydrogen plasma may contain hydrogen radicals but does not contain carbon radicals. Instead, carbon radicals are generated downstream from a remote plasma source. This means that in the "remote plasma" of some implementations, precursor gas is not introduced into the plasma-generating region. Hydrocarbon precursors are independently flowed into a reaction chamber and are activated by hydrogen radicals generated from the remote plasma source. Moreover, the carbon radicals are generated from hydrocarbon precursors containing alkene or alkyne groups. In fact, hydrocarbon precursors that are alkanes (e.g., methane) do not deposit in implementations involving remote hydrogen plasma CVD. When using the remote hydrogen plasma CVD method, graphene deposition selectively deposits on metal surfaces. Graphene does not deposit on dielectric or other non-metal surfaces. Graphene does not deposit on barrier material, such as tantalum nitride. The remote hydrogen plasma CVD method is an example method that can deposit high-quality graphene film at low temperatures suitable for semiconductor applications. For example, a high-quality graphene film can serve as a barrier layer in damascene or dual damascene structures. Further, the high-quality graphene can serve as a capping layer on top of the metal surface, which reduces resistance by reducing surface scattering. However, it will be understood that the high-quality graphene film may be used in a wide number of industrial applications, such as fabrication of fully aligned vias.

Fabrication of semiconductor devices sometimes involves forming fully aligned vias. Graphene may be particularly useful for forming fully aligned vias because it can be deposited selectively on metal material without depositing on dielectric material.

Figure 2:
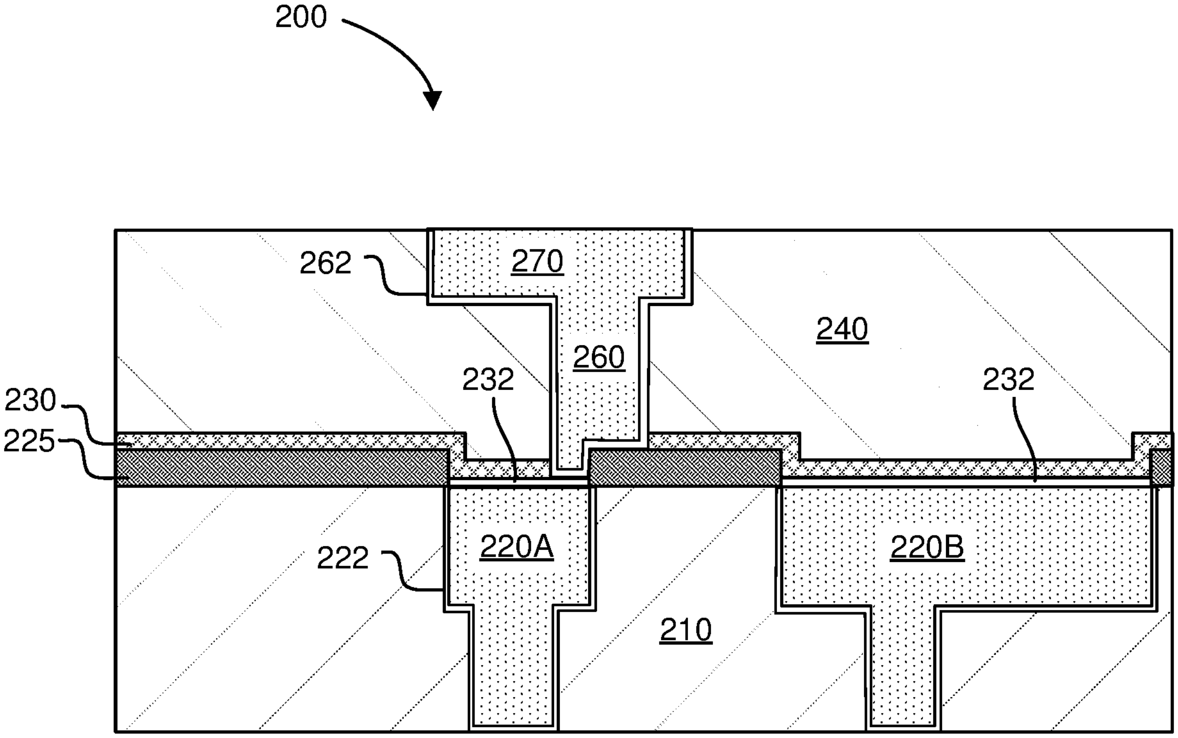
FIG. 2 shows a cross-sectional schematic illustration of an example semiconductor device having a selective graphene film and a selective dielectric layer in a dual damascene structure in accordance with certain disclosed embodiments.

FIG. 2 shows a cross-sectional schematic illustration of an example semiconductor device having a graphene film and a selective dielectric layer in a dual damascene structure according to some implementations. A semiconductor device 200 includes a first dielectric layer 210 and a first metal layer 220A formed in the first dielectric layer 210. The semiconductor device 200 may further include a neighboring first metal layer 220B formed in the first dielectric layer 210, where the first metal layer 220A is adjacent to the neighboring first metal layer 220B without contacting the neighboring first metal layer 220B. Each of the first metal layer 220A and the neighboring first metal layer 220B is lined with a first barrier layer 222. The first barrier layer 222 may provide a diffusion barrier layer and/or liner layer at an interface between the first metal layer 220A and the first dielectric layer 210 as well as between the neighboring first metal layer 220B and the first dielectric layer 210.

In some implementations, each of the first metal layer 220A and the neighboring first metal layer 220B includes copper, cobalt, ruthenium, nickel, molybdenum, or combinations thereof. For example, each of the first metal layer 220A and the neighboring first metal layer 220B includes copper. In some implementations, the first dielectric layer 210 includes any suitable dielectric material such as silicon oxide or doped silicon carbide.

The semiconductor device 200 further includes a selective graphene film 232 formed on an exposed surface of the first metal layer 220A. The selective graphene film 232 is selectively deposited on the first metal layer 220A relative to the first dielectric layer 210. In some implementations, the selective graphene film 232 is also formed on an exposed surface of the neighboring first metal layer 220B. The selective graphene film 232 may have a thickness or about 3 Å to about 20 Å or about 5 Å to about 10 Å. The selective graphene film 232 is deposited on the top surface of the first metal layer 220A by flowing one or more hydrocarbon precursors toward the semiconductor device 200, generating from a hydrogen source gas radicals of hydrogen in a remote plasma source, and introducing the radicals of hydrogen toward the semiconductor device 200, where the radicals of hydrogen are introduced upstream from the one or more hydrocarbon precursors, where the radicals of hydrogen react with the one or more hydrocarbon precursors in an environment adjacent to at least the first metal layer 220A to deposit the selective graphene film 232. The one or more hydrocarbon precursors may each include an alkene or alkyne group. In some instances, the hydrogen source gas may be provided in a helium carrier at a concentration of about 1% to about 25% hydrogen or about 1% to about 10% hydrogen. The selective graphene film 232 is deposited at a low deposition temperature, where the low deposition temperature may be about 200° C. to about 400° C., about 250° C. to about 400° C., or about 200° C. to about 300° C.

The semiconductor device 200 further includes a selective dielectric layer 225 formed on a top surface of the first dielectric layer 210. The selective dielectric layer 225 is selectively deposited on the first dielectric layer 210 relative to the first metal layer 220A and the neighboring first metal layer 220B. The selective dielectric layer 225 may have a thickness of about 1 nm to about 10 nm. In some implementations, the selective dielectric layer 225 includes a low-k dielectric material such as silicon oxynitride, silicon oxycarbide, or silicon oxycarbonitride. In some implementations, the selective dielectric layer 225 is deposited on the first dielectric layer 210 using a non-direct plasma deposition technique such as remote hydrogen plasma CVD.

In some implementations, the semiconductor device 200 further includes an etch stop layer 230 over the selective dielectric layer 225 and the selective graphene film 232, where the etch stop layer 230 includes a metal oxide. Examples of metal oxides include aluminum oxide, hafnium oxide, zirconium oxide, yttrium oxide, zinc oxide, titanium oxide, or combinations thereof. In some implementations, the etch stop layer 230 includes aluminum oxide. The etch stop layer 230 may have a thickness of about 5 Å to about 30 Å. In some implementations, the etch stop layer 230 is deposited over the selective dielectric layer 225 and the selective graphene film 232 using a thermal deposition technique such as thermal ALD or thermal CVD.

The semiconductor device 200 may further include a second dielectric layer 240 over the etch stop layer 230. The second dielectric layer 240 includes any suitable dielectric material such as silicon oxide or doped silicon carbide. The etch stop layer 230 may have an etch selectivity different than the second dielectric layer 240. For example, the etch stop layer 230 may have an etch resistance equal to or greater than ten times that of an etch resistance of the second dielectric layer 240 when one or more recesses are formed in the second dielectric layer 240. That way, etching through the second dielectric layer 240 does not result in etching the selective graphene film 232. The selective dielectric layer 225 may have an etch selectivity different than the etch stop layer 230.

A recess or opening is formed through the second dielectric layer 240 and filled with an electrically conductive material to form a via 260 and a second metal layer 270 over the via 260. The second metal layer 270 is positioned over the first metal layer 220A, and the via 260 is positioned between the selective graphene film 232 and the second metal layer 270. The via 260 provides electrical interconnection between the first metal layer 220A and the second metal layer 270. The via 260 and the second metal layer 270 may be lined with a second barrier layer 262. The second barrier layer 262 may provide a diffusion barrier layer and/or liner layer at an interface between the via 260 and the second dielectric layer 240 as well as between the neighboring second metal layer 270 and the second dielectric layer 240. In some implementations, each of the via 260 and the second metal layer 270 includes copper, cobalt, ruthenium, nickel, molybdenum, or combinations thereof. For example, each of the via 260 and the second metal layer 270 includes copper.

As shown in FIG. 2, the selective graphene film 232 is positioned at an interface between the via 260 and the first metal layer 220A. The selective graphene film 232 serves as an inhibitor so that the selective dielectric layer 225 is deposited on the first dielectric layer 210 relative to the first metal layer 220A and the neighboring first metal layer 220B. The selective graphene film 232 is not removed after the selective dielectric layer 225 is deposited. The selective graphene film 232 lowers an electrical resistance at the via 260 because of reduced electron scattering. The selective dielectric layer 225 ensures that the via 260 is a fully aligned via, and the selective dielectric layer 225 provides additional spacing between the via 260 and the neighboring first metal layer 220B.

Figure 3A:
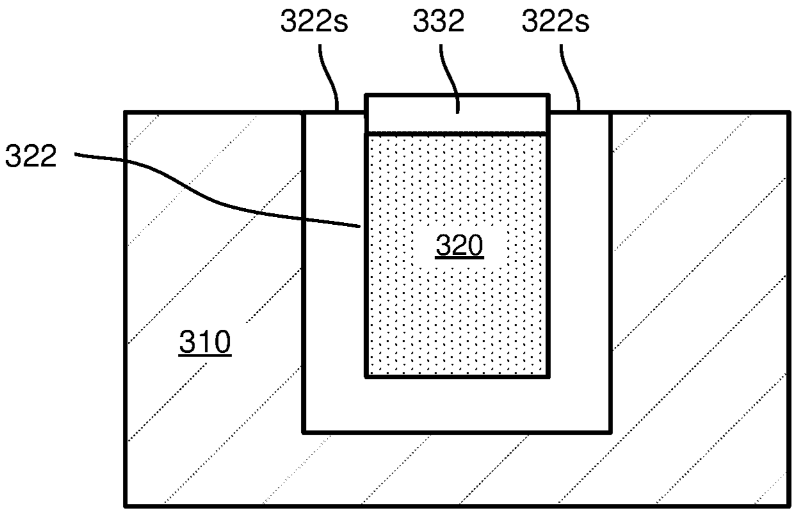
FIGS. 3A and 3B show cross-sectional schematics of a process of deposition of dielectric on a substrate having selective graphene on a metal surface.
Figure 3B:
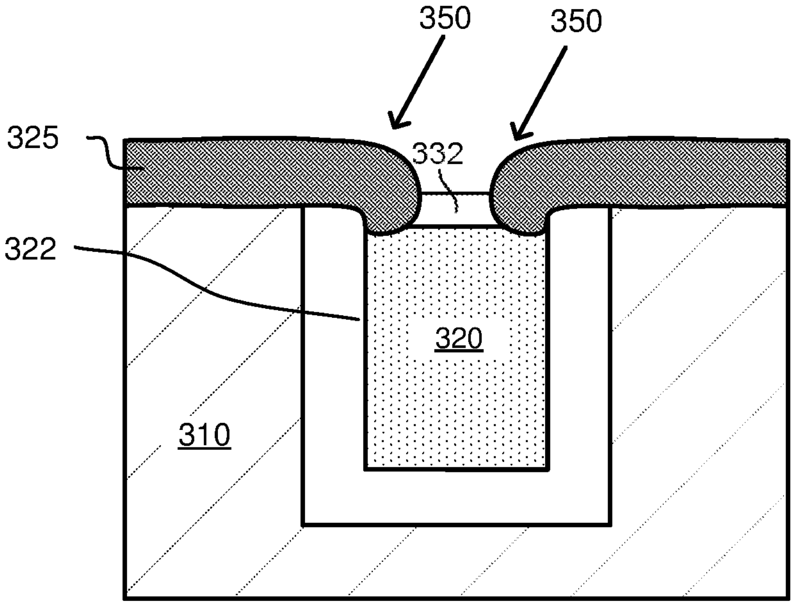

As shown in FIG. 2, when graphene is used, via 260 is fully aligned. However, because graphene selectively deposits on metal relative to non-metal surfaces, during selective deposition, little or no graphene is deposited on the exposed barrier surface of barrier layer 322. In some embodiments, the barrier material is not an elemental metal layer. The barrier material may be metal-containing. The barrier material may be a transition metal nitride. In some embodiments, the barrier material is a metal nitride material. For example, the barrier material may be tantalum nitride. Tantalum nitride may be used as a barrier when the via is filled with copper, tantalum, or ruthenium metal. However, graphene does not selectively deposit on tantalum nitride or other transition metal surfaces. Thus, when selective dielectric layer 325 is deposited, a "mushrooming" effect forms over the feature opening of the via, such as shown in FIG. 3B. FIG. 3A includes an example dielectric layer 310 whereby barrier layer 322 is formed within the via, and metal layer 320 is filled within the via. Selective graphene film 332 is selectively deposited on the exposed surface of metal layer 320, but no graphene is deposited on exposed surfaces 322s. The selective graphene film 332 may form a non-planar surface with exposed surfaces 322s. The mushroom effect may occur regardless of whether the selective graphene film 332 forms a planar surface with exposed surfaces 322s because the dielectric material on the exposed surfaces 322s does not have any selective graphene film 332 deposited on it and thus the selective dielectric layer 325 may be deposited on the exposed surfaces 322s, thereby still forming a mushroom effect ad the interface between the selective graphene film 332 and barrier layer 322. When selective dielectric layer 325 is deposited on dielectric layer 310 in FIG. 3B, a curved "mushroom" effect or overhang is formed over the feature opening shown with arrows 350. Overhand is not compatible with formation of fully aligned vias.

While some inhibitor deposition techniques may be used to prevent deposition of the dielectric material on the exposed barrier surface, such deposition techniques would also deposit the inhibitor material on the exposed metal as well.

Provided herein are methods of integrating deposition of graphene on metal surfaces to selectively deposit dielectric material on dielectric material while inhibiting deposition on exposed barrier surfaces. Methods involve selectively depositing graphene before depositing an inhibitor on the exposed barrier material, and then depositing selective dielectric material onto the dielectric surfaces, thereby achieving selectivity to both metal and exposed barrier surfaces.

Certain embodiments herein involve depositing selective deposition of graphene. Graphene may be selectively deposited on metal surfaces relative to dielectric surfaces. Graphene acts as an inhibitor that promotes selective deposition of materials on the dielectric surfaces while inhibiting deposition on the metal surfaces. Graphene films are generally stable at elevated temperatures. Graphene films may be incorporated during semiconductor integration since graphene films deposited on metal surfaces may lower an effective resistivity of metal lines due to reduced electron scattering. In some implementations, graphene films do not necessarily require subsequent removal in semiconductor manufacturing applications. In some other implementations, however, graphene may be removed after selective deposition of the dielectric material, and subsequent deposition operations may occur anywhere.

Figure 4A:
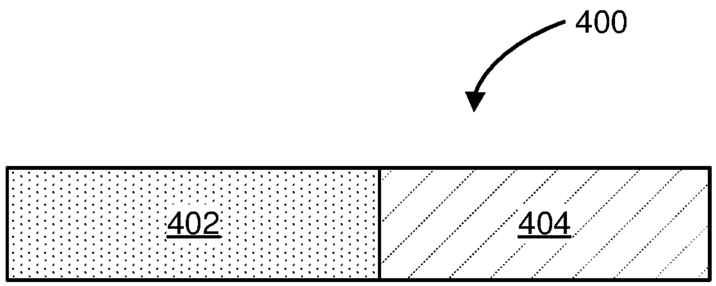
FIGS. 4A-4E show cross-sectional schematics of a process of selective deposition using graphene as an inhibitor in accordance with certain disclosed embodiments.

FIG. 4A illustrates a cross-sectional schematic of an example semiconductor substrate 400 including a dielectric layer 404 adjacent to a metal layer 402. In some implementations, the metal layer 402 may be formed in the dielectric layer 404, where the dielectric layer 404 may be an interlayer dielectric for a damascene or dual damascene structure. A recess may be etched through the dielectric layer 404, where the recess may be patterned and formed using a suitable lithography process. The recess may be filled with an electrically conductive material to form the metal layer 402. In some implementations, the metal layer 402 includes copper, ruthenium, aluminum, nickel, cobalt, tungsten, molybdenum, or combinations thereof. A diffusion barrier layer and/or liner layer may be lined between the metal layer 402 and the dielectric layer 404. The diffusion barrier layer may limit diffusion of metal atoms into the dielectric layer 404. Each of the metal layer 402 and the dielectric layer 404 have exposed top surfaces.

Figure 4B:
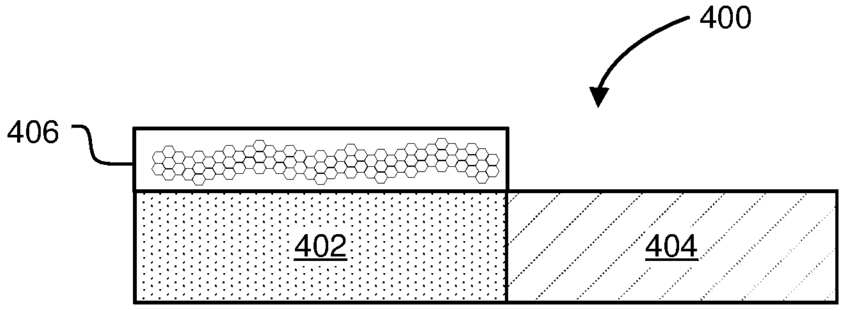

FIG. 4B illustrates a cross-sectional schematic of the semiconductor substrate 400 of FIG. 4A, where a graphene film 406 is selectively deposited on the metal layer 402. The graphene film 406 is formed on the metal layer 402 without being formed, placed, or otherwise positioned on the dielectric layer 404. The graphene film 406 may include high-quality graphene, where the graphene film 406 is a single layer graphene film, bilayer graphene film, or few layer graphene film. The graphene film 406 may be free of defective sites on which deposition precursors of dielectric materials may nucleate. The electrically conductive properties of the graphene film 406 may lower the effective resistivity of the metal layer 402 when electrically connected to a via (not shown) due to reduced electron scattering. In some implementations, the graphene film 406 may be deposited using a remote hydrogen plasma CVD process as described above. In some implementations, the graphene film 406 may be deposited at a low deposition temperature of about 200° C. to about 300° C. In some implementations, the graphene film 406 has a thickness of about 3 Å to about 20 Å or about 5 Å to about 10 Å.

Figure 4C:
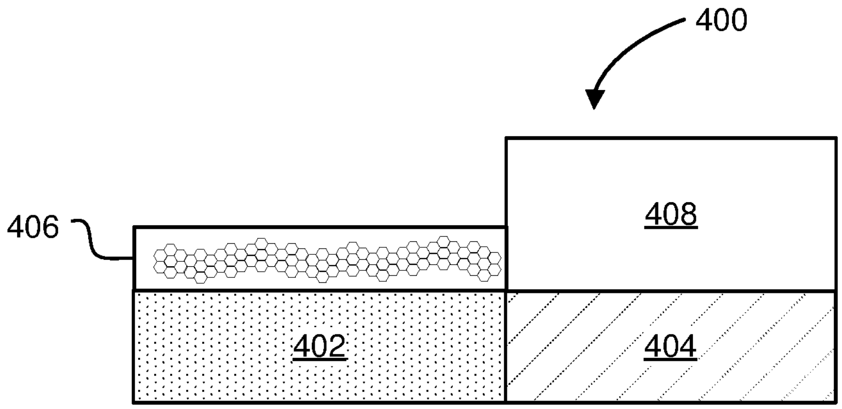

FIG. 4C illustrates a cross-sectional schematic of the semiconductor substrate 400 of FIG. 4B, where a first dielectric material 408 is selectively deposited on the dielectric layer 404. The first dielectric material 408 is deposited on the dielectric layer 404 without being formed, placed, or otherwise positioned on the top surface of the graphene film 406. The graphene film 406 inhibits deposition of the first dielectric material 408 on the metal layer 402. In some implementations, the first dielectric material 408 may be deposited in a manner that is non-damaging to the graphene film 406. In some implementations, the first dielectric material 408 may include a metal oxide such as aluminum oxide, where the metal oxide may be deposited using a thermal-based deposition technique such as ALD. In some implementations, the metal oxide may have a thickness of about 5 Å to about 60 Å. The first dielectric material 408 may serve as an etch stop layer. In some implementations, the first dielectric material 408 may include a low-k dielectric material such as silicon oxycarbide, silicon oxynitride, or silicon oxycarbonitride, where the low-k dielectric material may be deposited by a non-direct plasma deposition technique such as remote hydrogen plasma CVD. In some implementations, the low-k dielectric material may have a thickness of about 1 nm to about 10 nm. The first dielectric material 408 may serve as a spacer layer in a fully aligned patterning scheme.

Figure 4D:
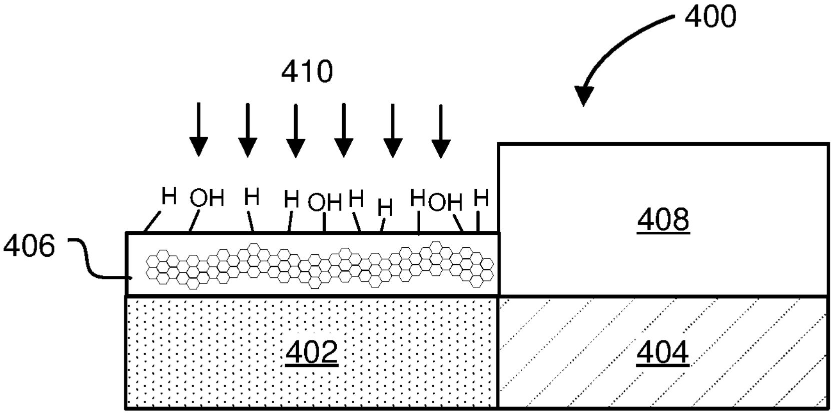

FIG. 4D illustrates a cross-sectional schematic of the semiconductor substrate 400 of FIG. 4C, where the graphene film 406 is exposed to treatment conditions 410 to cause surface modification of the graphene film 406. The modified surface of the graphene film 406 may be characterized by more defective sites for nucleation, where the defective sites may include defective sites of hydrogen-terminated sites and/or hydroxyl-terminated sites. In some implementations, the treatment conditions 410 may include exposure to remote plasma such as a remote hydrogen plasma. The remote plasma may additionally or alternatively include oxygen, nitrogen, ammonia, or combinations thereof. In some implementations, the treatment conditions 410 include exposure to one or more deposition operations. Over enough deposition operations, the surface of the graphene film 406 may eventually become functionalized so that nucleation can take place on the graphene film 406. In some implementations, the treatment conditions 410 include exposing the graphene film 406 to enough delay for the graphene film 406 to degrade in quality over time. Such treatment conditions 410 may include, for example, exposing the graphene film 406 to an air break for an extended duration. Though not shown in FIG. 4D, the graphene film 406 may alternatively be removed rather than modified. Removing the graphene film 406 may facilitate subsequent deposition anywhere on the semiconductor substrate 400 without the graphene film 406 serving as an inhibitor.

Figure 4E:
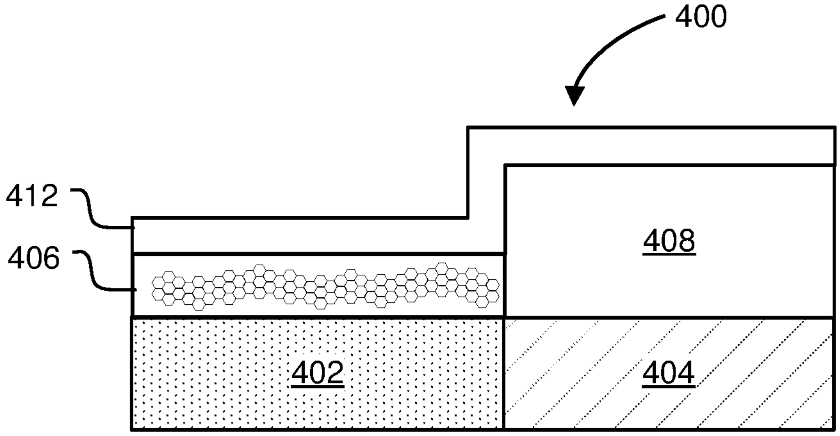

FIG. 4E illustrates a cross-sectional schematic of the semiconductor substrate 400 of FIG. 4D, where a second dielectric material 412 is deposited over the graphene film 406 and the first dielectric material 408. The graphene film 406 may be conditioned to promote deposition following the treatment conditions 410 in FIG. 4D. In some implementations, the second dielectric material 412 includes a metal oxide such as aluminum oxide, hafnium oxide, zirconium oxide, yttrium oxide, zinc oxide, titanium oxide, or combinations thereof. The metal oxide may be deposited by a thermal-based deposition technique such as thermal ALD. The metal oxide may serve as an etch stop layer. In some implementations, the second dielectric material 412 includes a hermetic barrier such as silicon oxycarbide, silicon carbonitride, or silicon oxycarbonitride. The hermetic barrier may be deposited by a non-direct plasma deposition technique such as remote hydrogen plasma CVD. The hermetic barrier may serve to encapsulate and protect the graphene film 406. It will be understood that in implementations where the graphene film 406 is removed, the second dielectric material 412 may be deposited using any suitable deposition technique. The second dielectric material 412 may be deposited over the metal layer 402 and the first dielectric material 408.

Figure 5:
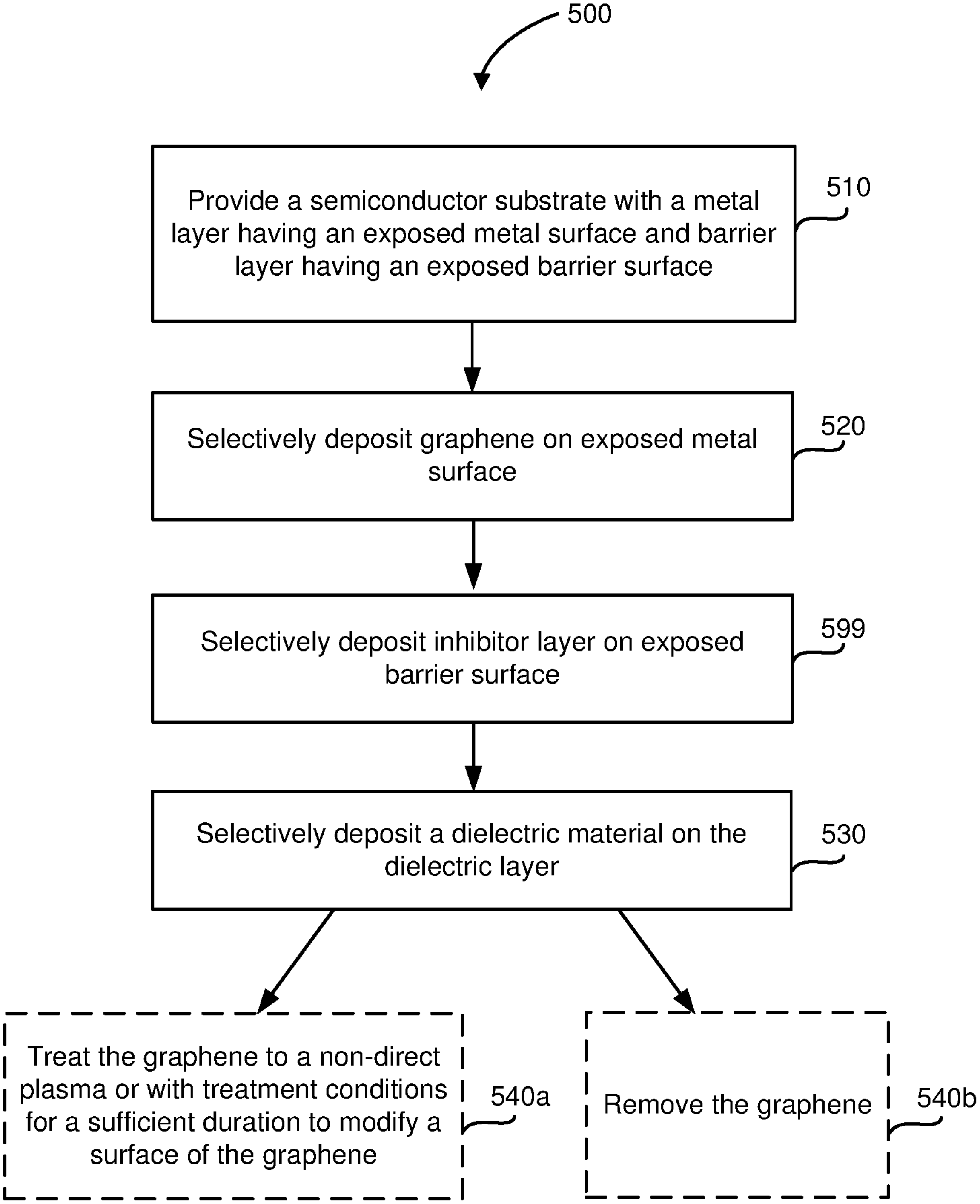
FIG. 5 illustrates a flow diagram of an example method of selective deposition using graphene in accordance with certain disclosed embodiments.

FIG. 5 illustrates a flow diagram of an example method of selective deposition using graphene and an inhibitor layer on a exposed surface of a barrier layer according to some implementations. The operations of a process 500 may be performed in different orders and/or with different, fewer, or additional operations. The operations of the process 500 are described with reference to an example process of selective deposition in FIGS. 6A-6D where graphene is used as an inhibitor on metal and a dielectric material is used as an inhibitor layer on exposed barrier surfaces. One or more operations of the process 500 may be performed using a plasma processing apparatus shown in FIG. 8. In some implementations, the operations of the process 500 may be implemented, at least in part, according to software stored in one or more non-transitory computer readable media.

Process 500 includes an operation 510 where a semiconductor substrate is provided, where the semiconductor substrate includes a metal layer formed in a dielectric layer. The metal layer has an exposed metal surface. The semiconductor substrate may be a silicon wafer, such as a 200-mm wafer, 300-mm wafer, or a 450-mm wafer, including wafers having one or more layers of material, such as dielectric, conducting, or semiconducting materials deposited thereon. The dielectric layer may be a low-k dielectric material such as silicon oxide or doped silicon carbide. Low-k dielectric materials may have a dielectric constant equal to or less than about 4.0. In some implementations, the dielectric layer may be an ultralow-k dielectric material such as a fluorine-doped or carbon-doped silicon oxide. Ultralow-k dielectric materials may have a dielectric constant equal to or less than about 2.5. In some implementations, the metal layer may be a metallization layer in a metallization scheme, where the metal layer may include any suitable electrically conductive material such as copper, ruthenium, aluminum, nickel, cobalt, tungsten, molybdenum, or combinations thereof. In some implementations, the metal layer may be treated prior to deposition of graphene on the metal layer, where treatment may serve to at least polish the metal layer or remove impurities. For example, the exposed metal surface of the metal layer may be exposed to a reducing agent to reduce metal oxides. In some implementations, a barrier layer is formed between the metal layer and the dielectric layer. The barrier layer is a transition metal nitride. The barrier layer may be a mixture of metal and metal nitride material in some embodiments. In some embodiments, the barrier layer is a tantalum-containing layer. In some embodiments, the barrier layer is a tantalum nitride. In some embodiments, the barrier layer is a mixture of tantalum metal and tantalum nitride. In some embodiments, the barrier layer is a tungsten-containing layer. Other examples of barrier layer materials include tungsten and tungsten nitride.

Figure 6A:
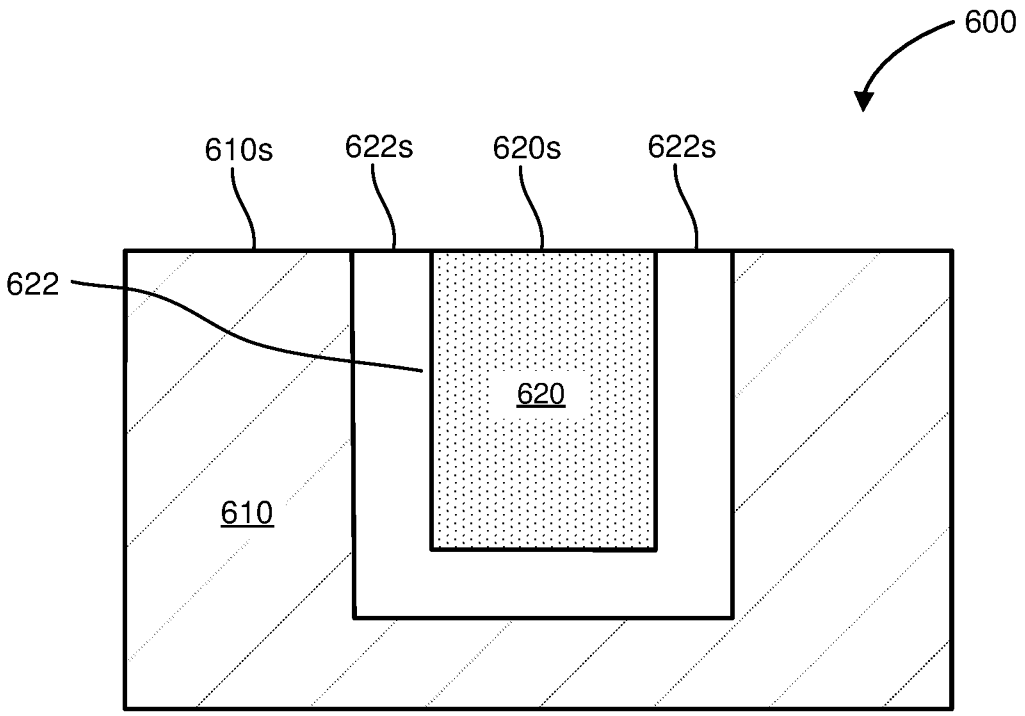
FIGS. 6A-6D show cross-sectional schematics of a process of selective deposition using graphene with an inhibitor in accordance with certain disclosed embodiments.

FIG. 6A shows an example substrate 600 having dielectric layer 610 with an example via that is lined with a barrier layer 622 and filled with metal layer 620. The surface of the substrate 600 includes an exposed metal surface 620*s* and exposed barrier surfaces 622*s* between exposed dielectric surfaces 610*s*. Although not shown in this particular example, in some embodiments, the metal layer 620 may be formed in the dielectric layer 610 where the dielectric layer 610 is an interlayer dielectric for a damascene or dual damascene structure. The via may be etched through the dielectric layer 610 and a barrier layer 622 is deposited over the via before depositing metal layer 620, which may include copper, ruthenium, aluminum, nickel, cobalt, tungsten, molybdenum, or combinations thereof.

Returning to FIG. 5, process 500 includes an operation 520 whereby graphene is selectively deposited on the exposed metal surface. The graphene is selectively deposited on the exposed metal surface relative to other surfaces, including dielectric surfaces. In some implementations, the graphene is selectively deposited on the exposed metal surface using a remote hydrogen plasma CVD process, thermal CVD process, PECVD process, or other suitable deposition process. For example, the graphene is selectively deposited on the exposed metal surface using a remote hydrogen plasma CVD process as described above.

In some implementations, the graphene deposited on the exposed metal surface is high-quality graphene. High-quality graphene serves as an effective inhibitor because of the limited number of sites on which films can nucleate. Without defective sites such as hydrogen-terminated sites or hydroxyl-terminated sites, various precursors are unable to nucleate on the surface of the graphene. For example, ALD or CVD of metal oxides may be unable to nucleate on high-quality graphene if precursors for such metal oxides are unable to adsorb on the high-quality graphene. High-quality graphene may be characterized by being free or substantially free of hydrogen-terminated sites and hydroxyl-terminated sites. High-quality graphene may be characterized by a 2D peak that is significantly greater than a G peak in a Raman spectrum, and a D peak that is negligible in the Raman spectrum. In some implementations, the 2D peak is at least two times greater than the G peak in the Raman spectrum.

Graphene may be deposited under conditions where the semiconductor substrate is maintained at a deposition temperature less than a semiconductor processing temperature limit during selective deposition of the graphene. In some implementations, the semiconductor processing temperature limit may correspond to a temperature sensitive limit of materials or components in the semiconductor substrate. For example, the temperature sensitive limit may be about 400° C. for copper and about 450° C. for ruthenium. In some implementations, the semiconductor processing temperature limit is about 400° C. Thus, the deposition temperature may be less than about 400° C., less than about 350° C., less than about 300° C., about 200° C. to about 400° C., or about 200°

C. to about 300° C. Higher temperatures may reduce the quality of graphene. Graphene may be deposited and processed under conditions so that the graphene causes nucleation delay. Not only does deposition temperature affect the properties of graphene, but deposition time, precursor flow rate, and other parameters can influence the properties of graphene. Generally speaking, shorter deposition times and higher precursor flow rates can provide graphene with improved nucleation delay. In some implementations, graphene with nucleation delay can be provided by annealing. For instance, annealing the graphene at an elevated temperature of about 300° C. to about 450° C. (e.g., about 400° C.) for a duration of about 20 seconds to about 3 minutes (e.g., 1 minute) can remove functional groups and make the graphene very difficult to nucleate on.

In some implementations, the graphene may be selectively deposited on the exposed metal surface without depositing on the dielectric layer. Selectively depositing the graphene on the exposed metal surface may include flowing one or more hydrocarbon precursors into a reaction chamber and towards the semiconductor substrate, generating radicals of hydrogen in a remote plasma source from a hydrogen source gas, and introducing the radicals of hydrogen into the reaction chamber and towards the semiconductor substrate, where the radicals of hydrogen react with the one or more hydrocarbon precursors to deposit the graphene on the exposed metal surface. The one or more hydrocarbon precursors are provided downstream from the radicals of hydrogen. In some implementations, the one or more hydrocarbon precursors include an alkene or alkyne group.

Figure 6B:
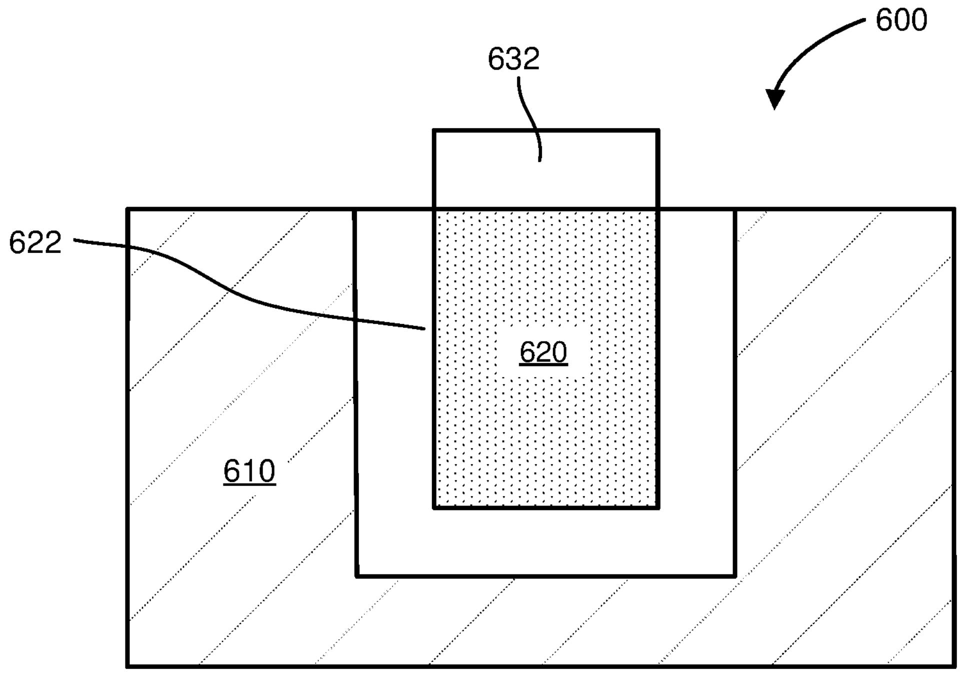
Figure 7:
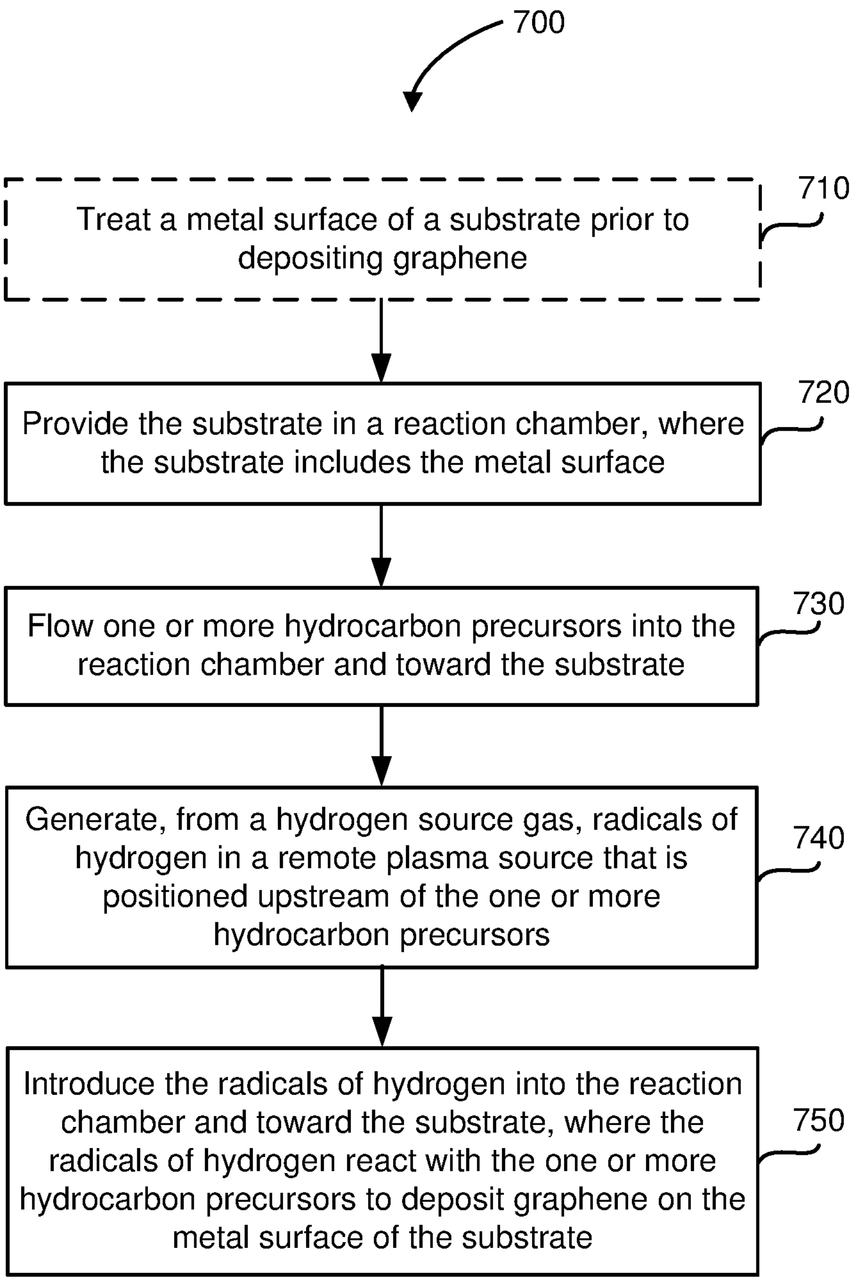
FIG. 7 illustrates a flow diagram of an example method of depositing graphene on a metal surface of a substrate in accordance with certain disclosed embodiments.

FIG. 6B shows the substrate 600 from FIG. 6A whereby graphene 632 is selectively deposited on the exposed metal surface 620*s*. The graphene may be deposited using any of the process conditions described above with respect to FIG. 4B. Graphene may be deposited using a process such as shown in FIG. 7 and further described below. In some embodiments, the graphene 632 is deposited such that the top horizontal surface of the graphene 632 is flush with the exposed barrier surfaces 622*s*. In some embodiments, the graphene 632 is deposited such that the top horizontal surface of the graphene 632 is non-planar with the exposed barrier surfaces 622*s*. The amount of non-planar overgrowth of the graphene 632 may not necessarily affect the function and efficacy of using certain disclosed embodiments, because the function of the graphene is to prevent deposition of dielectric on the exposed metal surface, and the function of the inhibitor layer is to prevent deposition of dielectric on the exposed barrier surface. Additionally, the relative thicknesses of graphene and the inhibitor layer may vary and various thicknesses may be suitable to prevent deposition of the selective dielectric material on the exposed barrier surface and exposed metal surface.

Returning to FIG. 5, in an operation 599 of the process 500, an inhibitor layer is deposited on the exposed barrier surface. The inhibitor layer includes molecular inhibitors. This inhibitor layer may be referred to as a barrier inhibitor layer. The inhibitor layer may be deposited using atomic layer deposition, chemical vapor deposition, plasma-enhanced atomic layer deposition, plasma-enhanced chemical vapor deposition, or any other suitable technique.

The material of the inhibitor layer may be a dielectric material. The material may be any material that can bind to tantalum nitride and cobalt, including silanes, alkylsilanes alcohols, amines, beta-diketonates, and halides. The inhibitor layer may include molecules having a CxHy head group, where x=1-20 and y=2x, 2x+2, or 2x+1. The inhibitor layer may include molecules having a hydrocarbon group, such as a methyl group, ethyl group, propyl group, butyl group, pentyl group, hexyl group, heptyl group, octyl group, nonyl group, decyl group, undecyl group, and dodecyl group. In some embodiments, the inhibitor layer includes molecules having a hydrocarbon group with more than 12 carbons in a carbon chain. In various embodiments, the inhibitor layer deposits selectively on the exposed barrier surface but does not deposit on the exposed graphene surface or exposed dielectric surface.

Silanes include compounds with four substituents on silicon, including but not limited to organosilicon compounds. Examples include 1-(triethoxysilyl)-2-(diethoxymethylsilyl)ethane, 1,2,3,4,5,6-hexamethoxy-1,2,3,4,5,6,-hexamethylcyclohexasilane, 1,2-dimethoxy-1,1,2,2-tetramethyldisilane, 1,4-dioxa-2,3,5,6-tetrasilacyclohexane, 2-tetramethyldisilane, bis-triethoxysilylethane (BTEOSE), bis-triethoxysilylmethane (BTEOSM), butasilanes, cyclobutasilane, cycloheptasilane, cyclohexasilane, cyclooctasilane, cyclopentasilane, decabutaoxycyclopentasilane, diethoxymethylsilane (DEMS), diethoxysilane (DES), dimethoxymethylsilane, dimethoxysilane (DMOS), dimethyldiethoxysilane (DMDEOS), dimethyldimethoxysilane (DMDMOS), disilane, dodecamethoxycyclohexasilane, ethylsilane, heptasilane, hexaethoxydisilane (HEODS), hexaethoxydislazoxane (HEDS-H), hexamethoxydisilane (HMODS), hexamethoxydisilazoxane (HMDS-H), hexamethoxydisiloxane (HMODS), hexamethyldisilazane (HMDS), hexasilane, hydrogen silsesquioxane, methyl hexamethoxydisilazoxane (HMDS-$CH_3$), methyl-diethoxysilane (MDES), methyl-dimethoxysilane (MDMS), methylsilane, methylsilatrane, methyltriethoxyorthosilicate (MTEOS), methyltriethoxysilane ($CH_3Si(OCH_2)_3$, methyl-triethoxysilane (MTES), methyltrimethoxysilane (MTMOS), methyl-trimethoxysilane (MTMS), nonamethoxytrisilazoxane (NMTS), octaethoxycyclobutasilane OctaHydro POSS™ (Polyhedral Oligomeric Silsesquioxane), octamethoxycyclicsilazoxane (OMCS), octamethoxydodecasiloxane (OMODDS), octamethoxytrisiloxane (OMOTS), octamethyl-1,4-dioxa-2,3,5,6-tetrasilacyclohexane, octamethylcyclotetrasiloxane (OMCTS), octasilanes, pentasilanes, silane (SiH4), Silatrane, T8-hydridospherosiloxane, tert-butoxydisilane, tetraacetoxysilane Si(OAc)4, tetraethoxysilane (TEOS), tetraisocyanatesilane (TICS), tetramethoxy silane, tetramethoxysiloxane (TMOS), tetramethylcyclotetrasiloxane (TMCTS), tetramethylorthosilicate (TMOS), tetramethylsilane (4MS), tetraoxymethylcyclotetrasiloxane (TOMCTS), tetravinyltetramethylcyclotetrasiloxane (TVTMCTS), triacetoxysilane SiH(OAc)3, triethoxysilane (TES), triethoxysilane $SiH(OEt)_3$, triethoxysiloxane (TRIES), trimethoxymethylsilane (TMOMS), trimethoxysilane (TMS or TriMOS), trimethoxysilane SiH(OMe)3, trimethoxysiloxane (TRIMOS), trimethylmethoxysilane (TMMOS), trimethylsilane (3MS), triphenylethoxysilane, trisilane, and tri-t-butoxylsilanol.

Amines may be primary, secondary, tertiary, or quaternary (for example, tetraalkylammonium compounds). Example amines include methylamine, dimethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines.

The inhibitor layer may be deposited using particular deposition precursors. In some embodiments, the deposition precursor may be a silane such as an alkylsilane.

The silicon-containing deposition precursor may be reacted with a reactant to form the inhibitor layer. Example reactants include alcohols, such as any organic alcohol with at least one hydroxyl functional group. Example alcohols include primary alcohols ($RCH_2OH$ where R is any substituent including H), secondary alcohols ($R_1R_2CHOH$ where $R_1$ and $R_2$ are any substituents including H), and tertiary alcohols ($R_1R_2R_3COH$ where $R_1$, $R_2$, and $R_3$ are any substituents including H). Example alcohols include methanol, ethanol, propanol, butanol, pentanol, hexanol, heptanol, octanol, nonanol, decanol, undecanol, dodecyl alcohol, and isomers thereof. Alcohols may have longer carbon chains than those listed above.

Example reactants include amides, such as any organic amide with at least one amide functional group, including amide groups (organic compounds having $O{=}CR_1{-}NR_2R_3$ where $R_1$, $R_2$, and $R_3$ are any substituents including H), simple amides (organic compounds having $O{=}CR{-}NH_2$ where R is any substituent including H), and substituted amides (organic compounds having $O{=}CR_1{-}NH{-}R_2$ where $R_1$ and $R_2$ are any substituents including H). Example amides include formamide, ethanamide, propanamide, butanamide, pentanamide, hexanamide, heptanamide, octanamide, nonanamide, decanamide, undecanamide, dodecyl amide, and isomers thereof.

In some embodiments, the inhibitor layer is deposited in plasma-free conditions. In some embodiments, the inhibitor layer is deposited in thermal conditions. In thermal conditions, the deposition may be performed at a temperature of about 25° C. to about 400° C.

The inhibitor layer may be deposited by ALD using cycles. ALD is a technique that deposits thin layers of material using sequential self-limiting reactions. ALD processes use surface-mediated deposition reactions to deposit films on a layer-by-layer basis in cycles. As an example, an ALD cycle may include the following operations: (i) delivery/adsorption of a precursor, (ii) purging of precursor from the chamber, (iii) delivery of a second reactant and optionally ignite plasma, and (iv) purging of byproducts from the chamber. The reaction between the second reactant and the adsorbed precursor to form a film on the surface of a substrate affects the film composition and properties, such as nonuniformity, stress, wet etch rate, dry etch rate, electrical properties (e.g., breakdown voltage and leakage current), etc.

Unlike a chemical vapor deposition (CVD) technique, ALD processes use surface-mediated deposition reactions to deposit films on a layer-by-layer basis. In one example of an ALD process, a substrate surface that includes a population of surface active sites is exposed to a gas phase distribution of a first precursor, such as a silicon-containing precursor, in a dose provided to a chamber housing a substrate. Molecules of this first precursor are adsorbed onto the substrate surface, including chemisorbed species and/or physisorbed molecules of the first precursor. It should be understood that when a compound is adsorbed onto the substrate surface as described herein, the adsorbed layer may include the compound as well as derivatives of the compound. For example, an adsorbed layer of a silicon-containing precursor may include the silicon-containing precursor as well as derivatives of the silicon-containing precursor. After a first precursor dose, the chamber is then evacuated to remove most or all of first precursor remaining in gas phase so that mostly or only the adsorbed species remain. In some implementations, the chamber may not be fully evacuated. For example, the reactor may be evacuated such that the partial pressure of the first precursor in gas phase is sufficiently low to mitigate a reaction. A second reactant, such as an oxygen-containing gas, is introduced to the chamber so that some of these molecules react with the first precursor adsorbed on the surface. In some processes, the second precursor reacts immediately with the adsorbed first precursor. In other embodiments, the second reactant reacts only after a source of activation is applied temporally. The chamber may then be evacuated again to remove unbound second reactant molecules. As described above, in some embodiments the chamber may not be completely evacuated. Additional ALD cycles may be used to build film thickness.

In some implementations, the ALD methods include plasma activation. As described herein, the ALD methods and apparatuses described herein may be conformal film deposition (CFD) methods, which are described generally in U.S. patent application Ser. No. 13/084,399 (now U.S. Pat. No. 8,728,956), filed Apr. 11, 2011, and titled "PLASMA ACTIVATED CONFORMAL FILM DEPOSITION," and in U.S. patent application Ser. No. 13/084,305, filed Apr. 11, 2011, and titled "SILICON NITRIDE FILMS AND METHODS," which are herein incorporated by reference in their entireties.

In various embodiments, the inhibitor layer is a dense, non-permeable film. In various embodiments, the inhibitor layer is deposited using at least about 2 cycles of ALD. In various embodiments, the inhibitor layer is deposited to a thickness of at least about 10 Å, or to a thickness of about 10 Å to about 200 Å. In various embodiments, the inhibitor layer is deposited to the thickness such that the surface of the inhibitor layer is flush with the surface of the graphene layer.

The deposition temperature, pressure, and other process conditions during deposition of the inhibitor layer may be the same as the deposition temperature, pressure, and other process conditions used during deposition of graphene in operation 520 and/or deposition of the dielectric material in an operation 530, or both.

Operation 599 may be integrated with operations 520, 530, or both. In various embodiments, selective deposition of the inhibitor layer is performed in the same chamber or in the same station as the chamber or station in an apparatus used to deposit graphene. In some embodiments, selective deposition of the inhibitor layer is performed in the same chamber or in the same station as the chamber or station in an apparatus used to deposit the dielectric layer. In various embodiments, selective deposition of the inhibitor layer and selective deposition of graphene are performed without breaking vacuum. In various embodiments, selective deposition of the inhibitor layer and selective deposition of the dielectric material are performed without breaking vacuum. In some embodiments, selective deposition of the graphene, selective deposition of the inhibitor layer, and selective deposition of the dielectric material are performed without breaking vacuum.

Operation 599 is performed before operation 530. In various embodiments, operation 599 is performed after depositing graphene on an exposed metal surface and before selectively depositing a dielectric material on the dielectric layer.

Figure 6C:
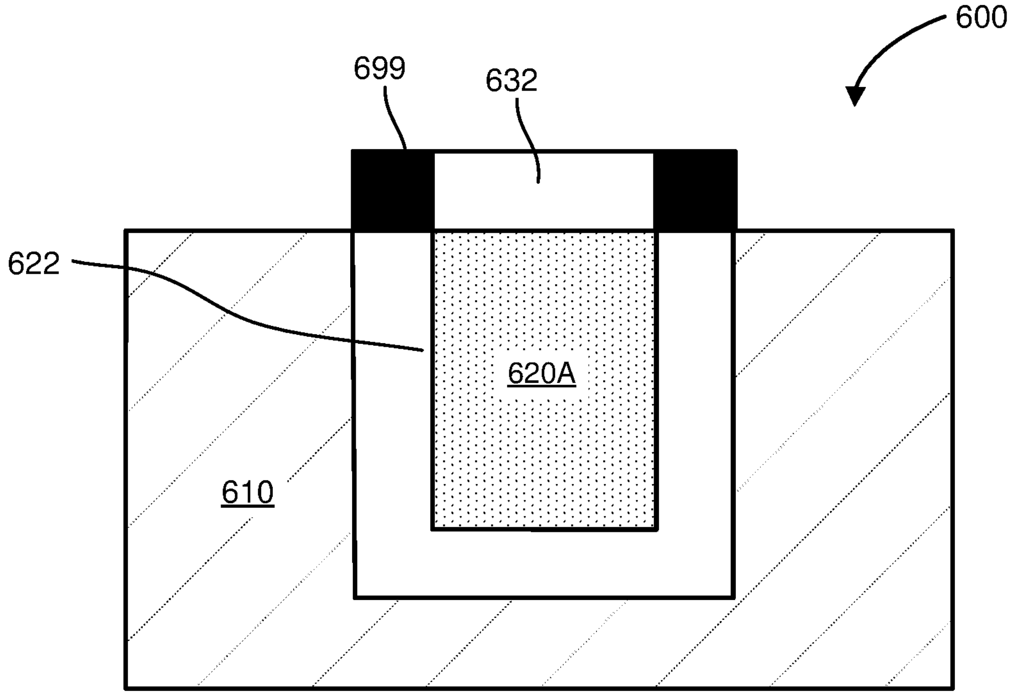

FIG. 6C shows the example substrate 600 with inhibitor layer 699 deposited selectively on the exposed barrier surfaces 622*s*. The inhibitor layer 699 may be deposited using the techniques described above with respect to operation 599 of FIG. 5.

Returning to FIG. 5, in an operation 530 of the process 500, dielectric material is selectively deposited on the dielectric layer without causing overhang. The dielectric material is selectively deposited on the dielectric layer relative to other materials, including a top surface of the graphene. The graphene inhibits deposition of the dielectric material on the graphene when the dielectric material is selectively deposited on the dielectric layer. As a result, the graphene blocks deposition of the dielectric material on the metal layer. Where the graphene is removed, this allows a fully aligned via to land on the exposed metal surface. The inhibitor layer inhibits deposition of the dielectric material on the exposed barrier surface when the dielectric material is selectively deposited on the dielectric layer. As a result, the inhibitor layer blocks deposition of the dielectric material on the barrier surface, preventing formation of an uneven and/or thick amount of dielectric layer on the exposed barrier surface that may cause overhang and "mushrooming" adjacent to the graphene material. The dielectric material may have a different composition than the dielectric layer.

In some implementations, the dielectric material may be selectively deposited using any suitable deposition technique such as PVD, ALD, CVD, PECVD, or remote plasma CVD. For example, the dielectric material may be selectively deposited using ALD. After selective deposition of the dielectric material on the dielectric layer, graphene is left intact so that the top surface of the graphene remains exposed and the inhibitor layer is left intact so that the top surface of the inhibitor layer remains exposed as well. The dielectric material may be deposited using a deposition technique that is non-damaging to the graphene and the inhibitor layer. As used herein, "non-damaging" refers to processes that does not etch the graphene and that substantially maintain the crystalline nature of the graphene. With respect to a Raman spectrum characterizing the graphene, this means that the ratio of the 2D peak to G peak is increased or at least does not decrease by more than about 10%, the intensity of the G peak does not increase by more than about 10%, and the intensity of the D peak does not increase by more than about 10%.

In some implementations, the dielectric material includes a metal oxide. The metal oxide may have an etch contrast with the dielectric layer, meaning that the metal oxide provides etch selectivity that is different than the dielectric layer. In some embodiments, the metal oxide may have etch contrast with the inhibitor layer. In some implementations, the metal oxide may serve as an etch stop layer, where the etch stop layer has an etch contrast with surrounding materials. The metal oxide acts as a spacer that remains intact since it does not etch easily. In some implementations, the metal oxide includes aluminum oxide, hafnium oxide, zirconium oxide, yttrium oxide, zinc oxide, titanium oxide, or combinations thereof. For example, the metal oxide may include aluminum oxide. In some implementations, the aluminum oxide is deposited on the dielectric layer using a thermal-based deposition technique such as ALD. A thermal-based deposition technique may avoid damaging exposing the graphene to damaging plasmas. In some implementations, a thickness of the metal oxide is about 5 Å to about 60 Å.

In some implementations, the dielectric material includes a low-k dielectric material. Example low-k dielectric materials include doped or undoped silicon oxide ($SiO_2$), doped or undoped silicon carbide (SiC), doped or undoped silicon nitride ($Si_3N_4$), or doped or undoped silicon carbonitride ($SiC_xN_y$). In some implementations, the low-k dielectric material includes silicon oxynitride, silicon oxycarbide, or silicon oxycarbonitride, where the low-k dielectric material may be deposited using a non-direct plasma deposition technique such as remote plasma CVD technique. Where the low-k dielectric material is deposited using the remote plasma CVD technique, the low-k dielectric material may be selectively deposited in the same reaction chamber or tool as the graphene as well as the inhibitor layer. That way, the semiconductor substrate is not exposed to a vacuum break in between deposition operations at operations 520 and 530.

In an example remote plasma CVD technique for depositing a low-k dielectric material, a silicon-containing precursor is flowed to the semiconductor substrate, radicals are generated in a remote plasma source from a source gas, and the radicals are introduced into a reaction chamber and flowed towards the semiconductor substrate to react with the silicon-containing precursor in the reaction chamber. In some implementations, the source gas includes a hydrogen source gas ($H_2$) and the radicals include radicals of hydrogen. The radicals are provided under processing conditions so that the radicals are in a substantially low energy state or ground state when reacting with the silicon-containing precursor in an environment adjacent to the semiconductor substrate. The radicals are generated in the remote plasma source upstream from the silicon-containing precursor. The silicon-containing precursor contains silicon-hydrogen bond(s) and/or silicon-silicon bond(s), and silicon-carbon bond(s), silicon-nitrogen bond(s), and/or silicon-oxygen bond(s). In some implementations, the silicon-containing precursor does not contain carbon-oxygen bonds or carbon-nitrogen bonds. By having the radicals generated upstream from the silicon-containing precursor and in a remote plasma source, the semiconductor substrate is not directly exposed to plasma. This avoids exposing the graphene to damaging plasmas. When the silicon-containing precursor reacts with the hydrogen radicals in the environment adjacent to the semiconductor substrate, silicon-containing material is deposited as the dielectric material on the dielectric layer.

The dielectric material may function as a spacer layer that increases a distance between a contact via and a neighboring metal layer/line. In other words, the spacer layer provides additional topography that increases spacing between the contact via and the neighboring metal layer/line, which mitigates TDDB degradation and improves device performance. Selective dielectric deposition on the dielectric layer eliminates or reduces problems associated with unlanded vias and assists with fully aligned via patterning schemes.

Figure 6D:
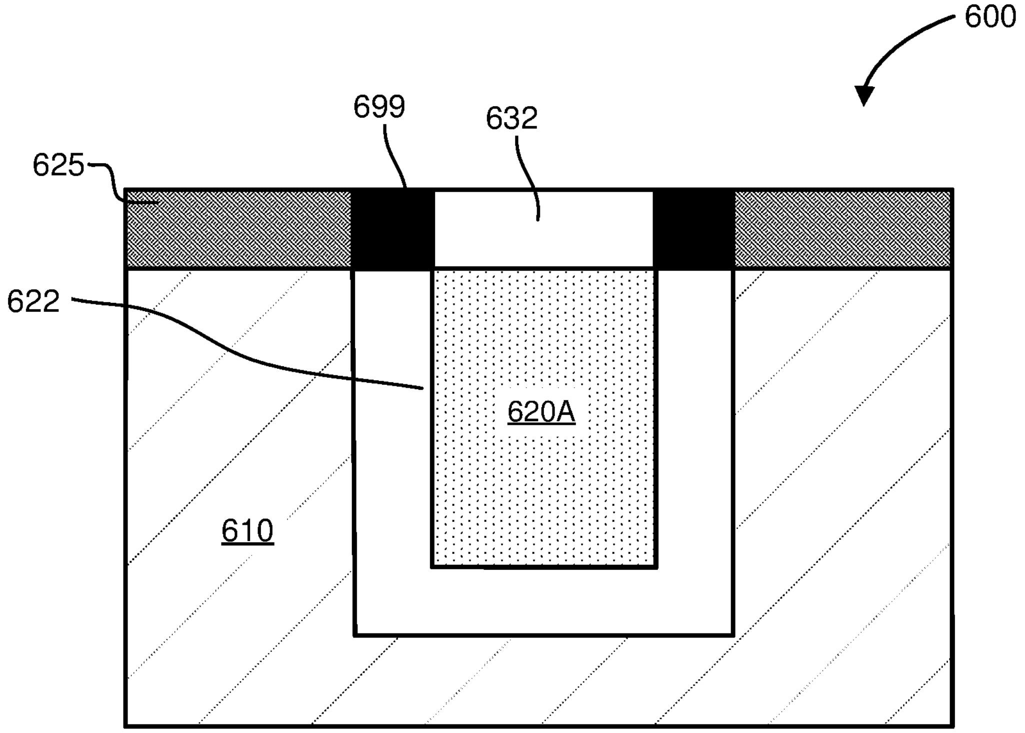

FIG. 6D shows substrate 600 whereby selective dielectric layer 625 is formed on the top surface of the dielectric layer 610. The selective dielectric layer 625 is selectively deposited on the dielectric layer 610 relative to the metal layer 620 and the barrier layer 622. The selective dielectric layer 625 may have a thickness of about 1 nm to about 10 nm. In some implementations, the selective dielectric layer 625 includes a low-k dielectric material such as silicon oxynitride, silicon oxycarbide, or silicon oxycarbonitride. In some implementations, the selective dielectric layer 625 is deposited on the dielectric layer 610 using a non-direct plasma deposition technique such as remote hydrogen plasma CVD. In various embodiments, the selective dielectric layer 625 is aluminum oxide ($Al_2O_3$).

Returning to FIG. 5, in an operation 540*a* of the process 500, the graphene may be treated with a non-direct plasma or with treatment conditions for a sufficient duration to modify a surface of the graphene. After selective deposition of the dielectric material where the graphene serves as an inhibitor, the surface of the graphene may be modified to promote subsequent deposition on the graphene. In other words, high-quality graphene may be converted to a lower-quality graphene that permits deposition of materials on the surface of the graphene. The treatment functionalizes the surface of the graphene so that nucleation may occur on the graphene.

In some implementations, the treatment includes exposing the graphene with the non-direct plasma. Exposing the graphene to direct or in-situ plasmas etches the graphene or destroys the graphene crystalline structure to form disorganized or amorphous carbon. Exposing the graphene to non-direct or remote plasmas may functionalize the surface of the graphene without etching the graphene. In some implementations, the non-direct plasma may be a remote hydrogen plasma including radicals of hydrogen (e.g., $H_2$ plasma). In some implementations, the non-direct plasma may be a remote plasma including radicals of hydrogen mixed with radicals of oxygen, ammonia, nitrogen, or combinations thereof (e.g., $H_2/O_2$ plasma). The semiconductor substrate may be maintained at a low treatment temperature during exposure to the non-direct plasma. In some implementations, the treatment temperature may be about 20° C. to about 400° C. or about 20° C. to about 200° C. After exposure to the non-direct plasma at the low treatment temperature, the surface of the graphene may have defective sites such as hydrogen-terminated sites or hydroxyl-terminated sites to promote nucleation and growth of subsequent material deposition on the graphene. In some implementations, the treatment at operation 540*a* and the selective dielectric deposition at operation 530 may be performed in the same reaction chamber or tool so that a vacuum break is not introduced between operations at operations 530 and 540*a*.

In some implementations, the treatment includes exposing the graphene under treatment conditions for a sufficient duration. The treatment conditions may include exposing the graphene to one or more gases for an extended duration. The one or more gases may include one or both of hydrogen and oxygen. For example, the graphene may be exposed to atmospheric conditions with an air break. Without being limited by any theory, the air break may allow oxygen and/or water molecules to functionalize the surface of the graphene. In some implementations, the treatment conditions may include exposure to atmospheric pressure (760 Torr) or less, exposure to air, and exposure to approximately room temperature (about 15° C. to about 25° C.). An extended duration of at least about 2 minutes, at least about 5 minutes, at least about 10 minutes, or at least about 15 minutes is a sufficient duration to adequately functionalize the surface of the graphene. In some implementations, the treatment conditions include one or more deposition operations. The surface of the graphene may at least be partially functionalized after selectively depositing the dielectric material on the dielectric layer. Furthermore, the surface of the graphene may be more functionalized after performing additional deposition operations on the semiconductor substrate. Over an extended time or after sufficient deposition operations, enough defective sites of hydrogen-terminated sites and/or hydroxyl-terminated sites may form on the surface of the graphene to promote nucleation and growth of subsequent material deposition on the graphene.

In some implementations, the treatment conditions may cause deposition of an ultra-thin layer on graphene, where the ultra-thin layer promotes subsequent material deposition on the graphene. For example, such an ultra-thin layer can include aluminum oxide itself deposited by CVD. Or, the ultra-thin layer can include silicon carbonitride, silicon oxycarbide, or silicon nitride.

After modification of the surface of the graphene, the graphene is a lower-quality graphene film that can be characterized by a higher D peak in a Raman spectrum. In some implementations, the D peak in the Raman spectrum can increase by more than 20%. The surface modification facilitates subsequent processing steps to be performed on the graphene for semiconductor integration. Such subsequent processing steps in a process flow may entail depositing one or both of an etch stop and hermetic barrier. This can be referred to as encapsulating the graphene, where the film properties of the graphene may be maintained over time. In some implementations, an additional dielectric layer (e.g., ultralow-k dielectric) may be deposited over the etch stop and/or hermetic barrier, and a conductive via may be formed in the additional dielectric layer to provide electrical contact with the graphene in a fully aligned via patterning scheme.

Alternatively, in an operation 540*b* of the process 500, the graphene may be removed. In some implementations, the graphene may be removed by exposure to direct or non-direct plasma. The graphene may be selectively deposited as an inhibitor to facilitate selective deposition of the dielectric material on the dielectric layer. After selective deposition of the dielectric material on the dielectric layer, the graphene may be removed. Graphene is no longer present to act as an inhibitor. Removal of the graphene may be desirable for a fully aligned via to contact the metal layer.

In some embodiments, the inhibitor layer may be optionally removed. Removal may be performed before graphene removal or after graphene removal, or before graphene treatment or after graphene treatment. In some embodiments, removal may be performed thermally, or by exposing to ultraviolet radiation, or by exposing the substrate to plasma radiation to provide energy to desorb the inhibitor layer.

In some embodiments, the inhibitor layer is not removed from the substrate. In some embodiments, as the inhibitor layer is exposed to other process gases, the inhibitor layer may be slightly etched and/or the thickness of it may be reduced without substantially affecting the function of the semiconductor device.

Deposition may occur anywhere on the semiconductor substrate after removal of the graphene. In some implementations, a metal oxide is deposited on the exposed metal surface and the dielectric material after removal of the graphene. In some implementations, a hermetic barrier is deposited on the exposed metal surface and the dielectric material after removal of the graphene. The metal oxide or hermetic barrier may be deposited using any suitable deposition technique including plasma-based deposition techniques.

Returning to FIG. 5, the process 500 may further include depositing a metal oxide on by a thermal-based deposition technique. A thickness of metal oxide may be about 5 Å to about 50 Å. Alternatively, the process 500 may further include depositing a hermetic barrier by anon-direct plasma deposition technique. A thickness of the hermetic barrier may be about 5 Å to about 100 Å. The metal oxide or the hermetic barrier may be deposited on the modified surface of the graphene and the dielectric layer where the graphene remains intact. Where the graphene is removed, the metal oxide or the hermetic barrier may be deposited on the exposed metal surface and the dielectric layer. In some embodiments, during such operations, the inhibitor layer may be reduced in thickness due to exposure to particular processing conditions during deposition of the metal oxide, but the reduction in thickness does not cause mushrooming or overhang.

In some implementations, the metal oxide is deposited by thermal ALD or thermal CVD. Deposition of the metal oxide may occur at a temperature below the semiconductor processing temperature limit. In some instances, deposition of the metal oxide may improve crystalline properties of the underlying graphene. The metal oxide may include aluminum oxide, hafnium oxide, zirconium oxide, yttrium oxide, zinc oxide, titanium oxide, or combinations thereof. For example, the metal oxide includes aluminum oxide. Deposition of aluminum oxide may occur by thermal ALD by introducing a dose of an aluminum-containing precursor such as trimethyl aluminum (TMA) and exposing the semiconductor substrate to an oxidant such as methanol. The metal oxide may serve as an etch stop. The metal oxide may additionally or alternatively serve as a protective layer for graphene against potentially damaging plasmas. In some implementations, where the dielectric material selectively deposited on the dielectric layer is a low-k dielectric material, the metal oxide is deposited on the low-k dielectric material and the graphene or on the low-k dielectric material and the metal layer. The metal oxide has a different etch selectivity than the low-k dielectric material, and a thickness of the low-k dielectric material is at least two times greater than a thickness of the metal oxide.

In some implementations, deposition of the metal oxide on the graphene may be followed by deposition of a hermetic barrier. The hermetic barrier may be deposited by any suitable deposition technique including non-direct and direct plasma deposition techniques. The metal oxide over the graphene may protect the graphene from exposure to damaging plasmas. Thus, the hermetic barrier may be deposited using PECVD or PEALD, where the plasma may be generated in-situ or remotely.

In some implementations, a hermetic barrier such as nitrogen-doped silicon carbide, oxygen-doped silicon carbide, or silicon nitride is deposited. Where the hermetic barrier is deposited over graphene, deposition may occur by a non-direct plasma deposition technique. The non-direct plasma deposition technique may be a remote plasma CVD technique. Where the hermetic barrier layer is deposited after removal of graphene, deposition may occur using any suitable deposition technique. The hermetic barrier may serve as an etch stop and as a hermetic barrier. In some implementations, the hermetic barrier may provide protection to the graphene by sealing the graphene from water, oxygen, and other chemistries in a surrounding environment that may adversely affect the film properties of graphene.

In a remote plasma CVD technique, a silicon-containing precursor is flowed to the semiconductor substrate in a reaction chamber, radicals are generated in a remote plasma source from a source gas, and the radicals are introduced into a reaction chamber and flowed to the semiconductor substrate to react with the silicon-containing precursor in the reaction chamber, thereby forming the hermetic barrier. In some implementations, the source gas includes hydrogen gas ($H_2$) and the radicals include hydrogen radicals. The radicals are provided under processing conditions so that the radicals are in a substantially low energy state or ground state when reacting with the silicon-containing precursor in an environment adjacent to the semiconductor substrate. The radicals are generated in the remote plasma source upstream from the silicon-containing precursor. The silicon-containing precursor contains silicon-hydrogen bond(s) and/or silicon-silicon bond(s), and silicon-carbon bond(s), silicon-nitrogen bond(s), and/or silicon-oxygen bond(s). In some implementations, the silicon-containing precursor does not contain carbon-oxygen bonds or carbon-nitrogen bonds. By having the radicals generated upstream from the silicon-containing precursor and in a remote plasma source, the semiconductor substrate is not directly exposed to plasma.

FIG. 7 illustrates a flow diagram of an example method of depositing graphene on a metal surface of a substrate according to some implementations. The operations of a process 700 may be performed in different orders and/or with different, fewer, or additional operations. In some embodiments, operations of process 700 are performed during operation 520 of FIG. 5. The operations of the process 700 may be performed using a plasma processing apparatus shown in FIG. 8. In some implementations, the operations of the process 700 may be implemented, at least in part, according to software stored in one or more non-transitory computer readable media.

In an operation 710 of the process 700, a metal surface of a substrate may be optionally treated prior to depositing graphene. Graphene deposition can depend on the smoothness and purity of the metal surface on which graphene is grown. Surface preparation techniques may be applied on the metal surface to polish the substrate and remove impurities. Polishing the substrate may be performed by a light etch in some implementations. Removal of impurities may be performed by a chemical treatment that removes, for example, metal oxides. Removal of impurities may additionally or alternatively involve removal of residues or contaminants from chemical mechanical planarization (CMP) processes. In some implementations, the treatment of the metal surface may occur before any diffusion barrier deposition, etch stop deposition, or hermetic barrier deposition.

In some implementations, treating the metal surface of the substrate can include exposing the metal surface to a plasma of a reducing gas species. Treatment of the metal surface can at least include removal of impurities and/or reduction of metal oxides by exposure to plasma. In some implementations, the plasma can include ions and radicals of a reducing gas species. Reducing gas species can include, for example, hydrogen gas ($H_2$), ammonia ($NH_3$), or combinations thereof. Thus, the metal surface may be treated by an $H_2$ plasma, $NH_3$ plasma, or $H_2/NH_3$ plasma. The plasma may be a direct (in-situ) plasma or remote plasma. In some implementations, exposing the metal surface to the plasma of the reducing gas species includes exposing the metal surface to a remote hydrogen plasma.

In some implementations, treating the metal surface further includes exposing the metal surface to a cyano-based radical species. In some other implementations, treating the metal surface includes exposing the metal surface to a cyano-based radical species as an alternative to exposing the metal surface to the reducing gas species. Cyano-based radical species may perform a light etch for smoothing the metal surface prior to graphene growth. Exposing the metal surface to the cyano-based radical species can occur before or after exposing the metal surface to the plasma of the reducing gas species. This can be referred to as a multi-step pretreatment process. The multi-step pretreatment process, or at least some steps of the multi-step pretreatment process, may be performed in the same or different apparatus than the plasma processing apparatus for depositing graphene. Exposing the metal surface to the cyano-based radical species can occur simultaneous with exposing the metal surface to the plasma of the reducing gas species. This can be referred to as a single-step pretreatment process. The single-step pretreatment process may be performed in the same or different apparatus than the plasma processing apparatus for depositing graphene.

In a multi-step pretreatment process, the cyano-based radical species may be generated by igniting a plasma, where the plasma may be a direct (in-situ) plasma or a remote plasma. The cyano-based radical species may be generated from a gas mixture containing at least a carbon-containing source gas and a nitrogen-containing source gas or from a gas mixture containing a precursor having a carbon-nitrogen (CN) bond. Thus, treating the metal surface can further include generating, from at least a carbon-containing source gas and a nitrogen-containing source gas or from a precursor having a carbon-nitrogen bond, plasma containing the cyano-based radical species. For example, a gas mixture of a hydrocarbon precursor, nitrogen gas, and hydrogen gas may be supplied to a plasma generator, and plasma of the gas mixture may be ignited to form the cyano-based radical species.

In a single step pretreatment process, the cyano-based radical species may be generated by activating a downstream carbon-containing precursor. Activation of the downstream carbon-containing precursor is simultaneous with surface pretreatment by the plasma of the reducing gas species. In such instances, a remote plasma source is positioned upstream of the downstream carbon-containing precursor, where the plasma of the reducing gas species is generated in the remote plasma source. In some implementations, the downstream carbon-containing precursor may be a hydrocarbon precursor. Thus, the downstream carbon-containing precursor may be chemically the same or different than the hydrocarbon precursor used in depositing graphene. In such cases, the plasma of the reducing gas species is a plasma of a reducing gas species and of a nitrogen-containing agent. For example, the reducing gas species can include hydrogen gas. The nitrogen-containing agent can include nitrogen gas. Hence, the plasma of the reducing gas species and of the nitrogen-containing agent can be a remote $H_2$ and $N_2$ plasma. The concentration of the reducing gas species may be greater than the concentration of the nitrogen-containing agent in the plasma. Without being limited by any theory, it is believed that ions/radicals of the nitrogen-containing agent interact with the downstream carbon-containing precursor to form the cyano-based radical species. The cyano-based radical species can perform a light etch for smoothing the metal surface and the plasma of the reducing gas species can reduce metal oxides to metal on the metal surface. In some other implementations, the downstream carbon-containing precursor may be precursor gas containing one or more CN bonds. Such a precursor may be activated by the plasma of the reducing gas species, where the plasma of the reducing gas species is a remote plasma generated upstream in the remote plasma source. In some instances, the plasma of the reducing gas species is a remote hydrogen plasma. Without being limited by any theory, it is believed that ions/radicals of hydrogen interact with the downstream carbon-containing precursor having one or more CN bonds to form the cyano-based radical species.

Though the treatment operation at an operation 710 may be described in terms of a multi-step pretreatment process and a single step pretreatment process, it will be understood that pretreatment of the metal surface is not limited to such techniques. The metal surface of the substrate may be pretreated prior to graphene deposition using any suitable surface preparation technique known in the art.

In an operation 720 of the process 700, the substrate is provided in a reaction chamber, where the substrate includes the metal surface. In some implementations, the substrate may already be provided in the reaction chamber during treatment at operation 710. The substrate may be a semiconductor substrate used in semiconductor applications. The metal surface can include any appropriate metal such as a transition metal. For example, the metal surface can include copper, ruthenium, nickel, molybdenum, cobalt, or combinations thereof. The metal surface can serve as a catalyst for promoting graphene nucleation and growth. Deposition of graphene may be selective to the particular metal of the metal surface. Put another way, deposition of graphene may not occur on dielectric surfaces or other non-metal surfaces.

The reaction chamber may include a substrate support or pedestal for supporting the substrate. A remote plasma source may be fluidly coupled to the reaction chamber via a showerhead. The metal surface of the substrate may be facing towards the remote plasma source. A precursor gas line may be separately fluidly coupled to the reaction chamber via one or more gas outlets. The one or more gas outlets may be located downstream from the remote plasma source. The one or more gas outlets may deliver hydrocarbon precursors into the reaction chamber and the remote plasma source may generate hydrogen radicals for delivery into the reaction chamber.

In an operation 730 of the process 700, one or more hydrocarbon precursors are flowed into the reaction chamber and towards the substrate. Each of the one or more hydrocarbon precursors includes an alkene or alkyne group. This means that the hydrocarbon precursors include one or more unsaturated carbon bonds, such as one or more carbon-to-carbon double bonds and/or carbon-to-carbon triple bonds. Examples of hydrocarbon precursors having alkene or alkyne groups include but are not limited to toluene, benzene, ethylene, propylene, butene, pentadiene (e.g., 1,4 pentadiene), hexene, acetylene, propyne, butyne, or pentyne. In some implementations, each of the one or more hydrocarbon precursors may include a carbon chain having at least 2 carbon atoms, at least 3 carbon atoms, at least 4 carbon atoms, at least 5 carbon atoms, at least 6 carbon atoms, or at least 7 carbon atoms.

The one or more hydrocarbon precursors may flow into the reaction chamber through the one or more gas outlets fluidly coupled to the reaction chamber. The one or more gas outlets are positioned downstream from the remote plasma source. Plasma of the one or more hydrocarbon precursors is not generated in the reaction chamber or in the remote plasma source. Rather, the one or more hydrocarbon precursors are flowed into the reaction chamber independently of plasma generated in the remote plasma source.

The one or more hydrocarbon precursors are flowed towards the substrate to adsorb onto the metal surface or at least positioned in an environment adjacent to the metal surface of the substrate. In some implementations, the one or more hydrocarbon precursors are flowed into the reaction chamber simultaneous with plasma generation and plasma exposure as described at operations 740 and 750. In some implementations, the one or more hydrocarbon precursors are flowed into the reaction chamber prior to plasma generation and plasma exposure as described at operations 740 and 750.

In some implementations, the one or more hydrocarbon precursors are delivered with other species, notably carrier gas, into the environment adjacent to the metal surface of the substrate. Upstream from the deposition reaction surface, the one or more hydrocarbon precursors can be mixed with an inert carrier gas. Example inert carrier gases include, but are not limited to, argon (Ar) and helium (He). In some implementations, the one or more hydrocarbon precursors are delivered as a mixture of multiple hydrocarbon precursors. The multiple hydrocarbon precursors may be present in equimolar or relatively similar proportions as appropriate to form the primary backbone or matrix in the resulting graphene. In other implementations, the relative amounts of the multiple hydrocarbon precursors are substantially skewed from equimolarity.

In an operation 740 of the process 700, radicals of hydrogen are generated, from a hydrogen source gas, in a remote plasma source that is positioned upstream of the one or more hydrocarbon precursors. Specifically, the radicals of hydrogen are generated in a remote plasma source that is upstream from the one or more gas outlets for introducing the one or more hydrocarbon precursors into the reaction chamber. The remote plasma source may be any suitable plasma source for plasma generation, such as an inductively-coupled plasma source or capacitively-coupled plasma source. In some implementations, the hydrogen source gas is hydrogen gas ($H_2$). In some implementations, the hydrogen gas is flowed into the remote plasma source together with one or more additional gases such as helium (He). In certain embodiments, hydrogen source gas is provided in a carrier gas such as helium. As an example, hydrogen gas may be provided in a helium carrier at a concentration of about 1% to about 25% hydrogen or about 1% to about 10% hydrogen. Therefore, in some instances, $H_2$/He plasma is generated in the remote plasma source.

In an operation 750 of the process 700, the radicals of hydrogen are introduced into the reaction chamber and towards the substrate, where the radicals of hydrogen react with the one or more hydrocarbon precursors to deposit graphene on the metal surface of the substrate. The radicals of hydrogen are delivered into the reaction chamber under process conditions so that excited radicals transition to relaxed radicals without recombining. Pressure, fraction of carrier gas such as helium, geometry of gas ports of the showerhead, distance between the showerhead and the one or more gas outlets, and other process conditions are configured so that the hydrogen atoms encounter the substrate as radicals in a low energy state (e.g., ground state) without recombining. In some implementations, all or substantially all of the radicals of hydrogen in an environment adjacent to the substrate are radicals of hydrogen in the ground state. That way, the substrate is exposed to remote hydrogen plasma that minimizes surface growth damage.

Once generated, the radicals of hydrogen may be in an excited energy state. For example, hydrogen in an excited energy state can have an energy of at least 10.2 eV (first excited state). Excited radicals of hydrogen may cause surface growth damage of during graphene growth. In some implementations, when an excited hydrogen radical loses its energy, or relaxes, the excited hydrogen radical may become a substantially low energy state hydrogen radical or a ground state hydrogen radical. In some implementations, process conditions may be provided so that excited hydrogen radicals lose energy or relax to form substantially low energy state or ground state hydrogen radicals. For example, the remote plasma source or associated components may be designed so that a residence time of hydrogen radicals diffusing from the remote plasma source to the substrate is greater than the energetic relaxation time of an excited hydrogen radical. The energetic relaxation time for an excited hydrogen atom radical can be about equal to or less than about $1\times10^{-3}$ seconds. Other process conditions that are controlled so that excited hydrogen radicals lose energy to relax to form ground state hydrogen radicals include but are not limited to pressure, gas flow rates, size and geometry of relaxation zone, size and geometry of gas ports in the showerhead, and relative concentrations of hydrogen source gas to inert carrier gas.

An environment adjacent to the metal surface of the substrate may include the one or more hydrocarbon precursors. In addition, the environment adjacent to the metal surface of the substrate may include the radicals of hydrogen in the low energy state (e.g., ground state). The environment adjacent to the metal surface of the substrate comprises the metal surface as well as a space immediately above the exposed surface of the substrate. In effect, activation of the hydrocarbon precursors by radicals of hydrogen in the low energy state may occur on the metal surface or at a distance above the metal surface of the substrate. In some implementations, the distance above the metal surface of the substrate may be up to about 100 millimeters above the metal surface of the substrate. Typically, reaction conditions in the environment adjacent to the metal surface of the substrate are generally uniform across the entire metal surface of the substrate, though some variation may be permitted.

Figure 8:
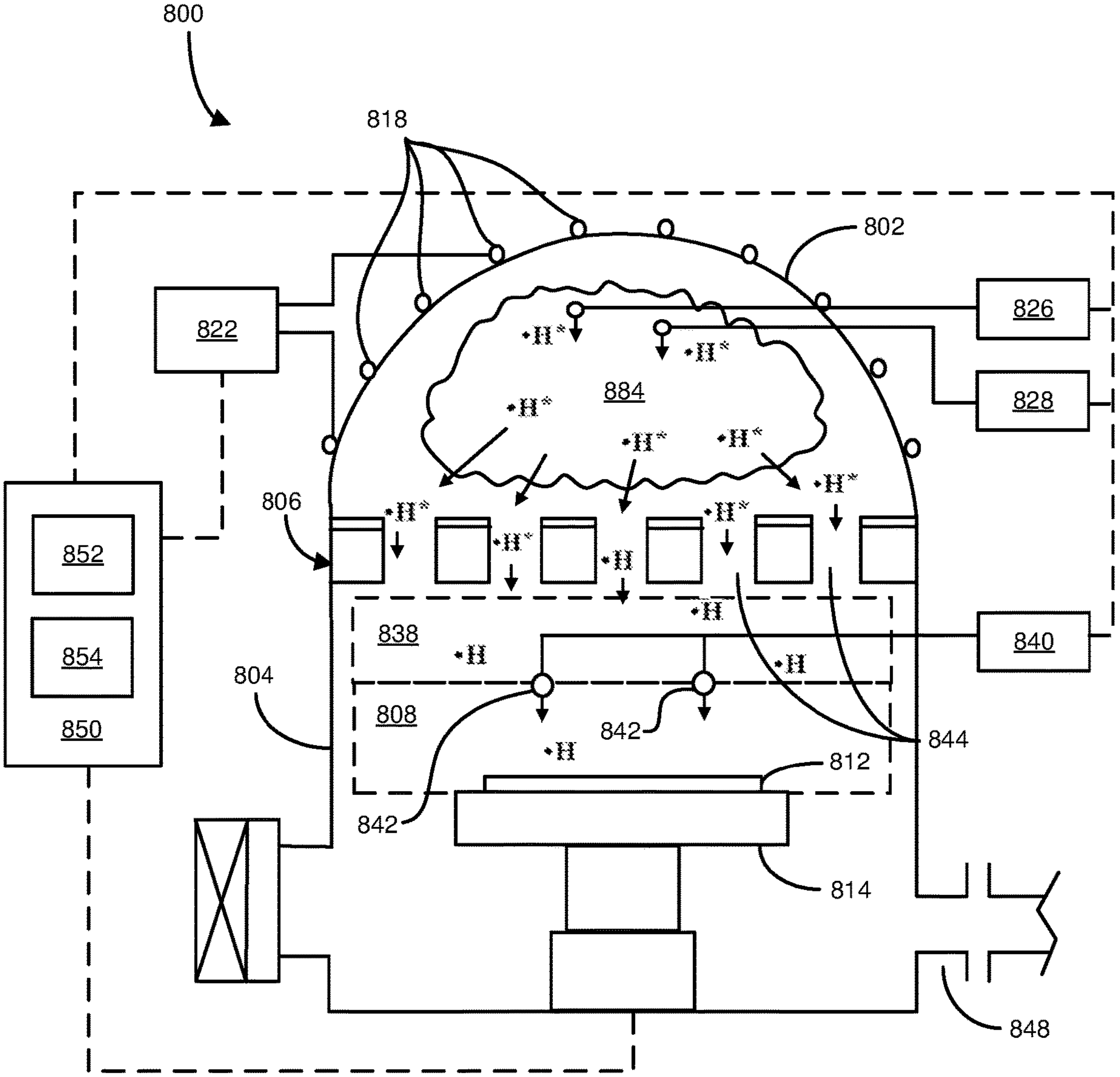
FIG. 8 illustrates a schematic diagram of an example plasma processing apparatus with a remote plasma source in accordance with certain disclosed embodiments.

In some implementations, all, or substantially all, or a substantial fraction of the hydrogen atom radicals can be in the ground state, e.g., at least about 90% or 95% of the hydrogen atom radicals adjacent to the metal surface of the substrate are in the ground state. As used herein, radicals of hydrogen may also be referred to as "hydrogen radicals" and "hydrogen atom radicals." A state in which a substantial fraction of hydrogen atom radicals are in the ground state can be achieved by various techniques. Some apparatuses, such as described in FIG. 8, are designed to achieve this state. The process conditions for achieving hydrogen atom radicals in the ground state may not have substantial amounts of ions, electrons, or radical species in high energy states such as states above the ground state. The presence of substantial amounts of ions or high energy radicals may cause surface growth damage on the substrate, resulting in low-quality graphene or disordered carbon growth. In some implementations, the concentration of ions in the environment adjacent to the metal surface of the substrate is no greater than about $10^7/cm^3$. Hydrogen atom radicals in the ground state may provide sufficient energy for activating the one or more hydrocarbon precursors while providing mild conditions in the environment adjacent to the metal surface to limit surface growth damage.

The one or more hydrocarbon precursors are flowed into the reaction chamber downstream from the radicals of hydrogen. The radicals of hydrogen are generated in the remote plasma source located upstream from the one or more gas outlets for introducing the one or more hydrocarbon precursors. By the time the radicals of hydrogen reach the one or more hydrocarbon precursors, the radicals of hydrogen are in a low energy state or ground state upon mixing or interacting with the one or more hydrocarbon precursors.

Without being limited by any theory, one of the more kinetically favorable reaction mechanisms in the deposition reaction includes hydrogen abstraction, which results in an activated hydrocarbon precursors. Without being limited by any theory, the hydrogen radicals in the low energy state or ground state may interact with the alkyne or alkene groups in the hydrocarbon molecule that results in the formation of activated alkanes (e.g., methane). In some instances, the hydrocarbon precursor breaks down into smaller-chain hydrocarbon molecules or radicals. Activated alkanes contain at least one carbon radical as an active site, and the active sites can react together to form carbon-to-carbon bonds in graphene. Bonding at the active sites and crosslinking can form a primary backbone or matrix in a resulting graphene film. The metal surface may act as a catalyst to promote reactions between activated hydrocarbon precursors.

The hydrocarbon precursors do not serve as passive spectators, but significantly contribute to the composition of the graphene. In some implementations, substantially all or a substantial fraction of the atoms in graphene are provided by the one or more hydrocarbon precursors, with small amounts of hydrogen or other element from the remote hydrogen plasma providing less than about 5 atomic percent or less than about 2 atomic percent of the film mass. In such cases, the low energy hydrogen atom radicals used to drive the deposition reaction do not substantially contribute to the mass of the deposited graphene.

The temperature in the environment adjacent to the metal surface of the substrate can be any suitable temperature facilitating the deposition reaction. In some implementations, the temperature in the environment adjacent to the metal surface of the substrate can be largely controlled by the temperature of a pedestal on which a substrate is supported during deposition of graphene. In some implementations, the operating temperature can be equal to or less than about 500° C., equal to or less than about 450° C., equal to or less than about 400° C., equal to or less than about 350° C., equal to or less than about 300° C., about 200° C. to about 400° C., about 250° C. to about 400° C., or about 200° C. to about 300° C. Such temperatures may be suitable for semiconductor applications. In some implementations, the temperature may depend on the metal of the metal surface on which the graphene is deposited. For example, copper may be able to sustain temperatures at 400° C. or below, whereas ruthenium may be able to sustain temperatures of 450° C. or below.

The pressure in the environment adjacent to the metal surface of the substrate can be any suitable pressure to promote graphene growth in the reaction chamber. In some embodiments, the pressure can be about 10 Torr or lower, or about 5 Torr or lower. For example, the pressure can be about 1 Torr to about 2 Torr.

Graphene may be selectively deposited on the metal surface from the reaction of radicals of hydrogen with the one or more hydrocarbon precursors provided downstream from the remote plasma source. Relatively mild reaction conditions provided by the radicals of hydrogen in a low energy state (e.g., ground state) activate the one or more hydrocarbon precursors to form carbon radicals. As such, the carbon radicals are formed outside of the remote plasma source in which plasma is generated. The amount of carbon radicals at the environment adjacent to the metal surface of the substrate may be controlled to limit having too many nucleation sites for graphene growth. Without being limited by any theory, an excess number of nucleation sites may correspond to an excess number of defects during graphene growth.

Graphene may be selectively deposited on a transition metal such as copper, ruthenium, nickel, molybdenum, cobalt, or combinations thereof. In some implementations, the metal surface includes copper. In some implementations, the graphene on the metal surface is relatively thin and may be on the order of a few monolayers thick. In some implementations, the thickness of the graphene is equal to or less than about 10 nm, equal to or less than about 5 nm, equal to or less than about 3 nm, or equal to or less than about 1 nm. The thickness of the graphene may depend on the metal surface on which it is deposited on. For example, the thickness of the graphene may be less than about 1 nm when deposited on copper. The graphene may be a single layer graphene, bilayer graphene, or few layer graphene. The Raman spectrum of the graphene may be characterized by a D peak that is negligible in intensity and having a 2D peak that is equal to or greater than a G peak. It will be understood that the intensity of the D peak will be significantly smaller than the 2D peak and the G peak.

In some implementations, the process 700 may further include annealing the graphene on the metal surface of the substrate. Annealing the graphene may occur at elevated temperatures to remove defects from the graphene crystal structure. More specifically, annealing the graphene may occur at elevated temperatures greater than the deposition temperature of graphene. This ensures formation of high-quality graphene. In some implementations, the elevated temperatures may be equal to or greater than about 200° C., equal to or greater than about 250° C., equal to or greater than about 300° C., or equal to or greater than about 400° C. For example, if graphene were deposited at a temperature less than about 250° C., then annealing may occur at an elevated temperature greater than about 250° C.

Annealing the graphene may occur at a temperature range that is between the deposition temperature of graphene and a semiconductor processing temperature limit. The semiconductor processing temperature limit may be a temperature sensitive limit in which materials (e.g., metals) in the substrate would melt or otherwise be physically damaged. For example, the temperature sensitive limit of copper is about 400° C. and the temperature sensitive limit of ruthenium is about 450° C. The elevated temperature for annealing may depend on the metal in the semiconductor substrate and the temperature limits compatible with back-end-of-line semiconductor processing. Accordingly, annealing may take place at a temperature greater than the deposition temperature of graphene but at a temperature that does not exceed the semiconductor processing temperature limit. In some implementations, the temperature range for annealing the graphene is about 200° C. to about 450° C., about 200° C. to about 400° C., about 250° C. to about 400° C., or about 300° C. to about 350° C.

Annealing the graphene may result in significant improvement in the quality of graphene with reduced defects, where the D peak is decreased, the ratio between the 2D peak and the G peak is increased, and/or the ratio between the G peak and the D peak is increased. As discussed earlier, decreasing the D peak is indicative of removal of defects in the crystal structure of graphene. Increasing the ratio between the 2D peak and the G peak is indicative of the presence of single layer graphene, bilayer graphene, or few layer graphene as opposed to disordered or amorphous carbon. The higher the ratio, the higher the crystallinity of the film. For example, annealing the graphene may increase the ratio between the 2D peak and the G peak from about 1:1 to about 2:1. Furthermore, increasing the ratio between the G peak and the D peak is indicative of increased grain size. Annealing can remove any adsorbates or defects that disrupt the planar structure of graphene while increasing grain size, thereby improving film quality. In some implementations, annealing the graphene occurs in air or inert gas atmosphere, where the inert gas atmosphere includes an inert gas such as argon (Ar), helium (He), nitrogen ($N_2$), or combinations thereof. In some implementations, annealing can take place for a duration that is equal to or less than about 30 minutes, equal to or less than about 20 minutes, equal to or less than about 10 minutes, or equal to or less than about 5 minutes.

Graphene films ordinarily do not undergo annealing operations. This is because graphene is typically deposited at high temperatures, e.g., greater than about 400° C. However, when graphene is deposited at low temperatures, e.g., about 200° C. to about 300° C., annealing may be an important step that improves graphene film quality without exceeding a temperature sensitive limit in semiconductor processing. In other words, annealing occurs within the back-end-of-line thermal budget constraints. Therefore, annealing may be an important step in integrating graphene in semiconductor processing applications. In some implementations, annealing may occur after graphene deposition but before and/or after deposition of an etch stop, diffusion barrier, or hermetic barrier.

Graphene may lower the effective resistivity of metal lines and limit electromigration. With low temperature deposition of graphene, graphene may be integrated in a process flow for manufacturing semiconductor devices, such as in back-end-of-line (BEOL) semiconductor processing. BEOL semiconductor processing may involve providing electrical interconnection between metallization layers with one or more conductive vias. During BEOL semiconductor processing, graphene may be deposited on the metallization layers or metal lines.

Apparatus

One aspect of the disclosure is an apparatus configured to accomplish the graphene deposition methods described herein. A suitable apparatus includes hardware for accomplishing the process operations and a system controller having instructions for controlling process operations in accordance with the present disclosure. In some implementations, the apparatus for performing the aforementioned process operations can include a remote plasma source. A remote plasma source provides mild reaction conditions compared to a direct plasma.

FIG. 8 illustrates a schematic diagram of an example plasma processing apparatus with a remote plasma source according to some implementations. The plasma processing apparatus 800 includes the remote plasma source 802 separated from a reaction chamber 804. The remote plasma source 802 is fluidly coupled with the reaction chamber 804 via a showerhead 806, which may also be referred to as a multiport gas distributor. Radical species are generated in the remote plasma source 802 and supplied to the reaction chamber 804. One or more hydrocarbon precursors are supplied to the reaction chamber 804 downstream from the remote plasma source 802 and downstream from the showerhead 806. The one or more hydrocarbon precursors react with the radical species in a chemical vapor deposition zone 808 of the reaction chamber 804 to deposit a graphene film on a front surface of a substrate 812. The chemical vapor deposition zone 808 includes an environment adjacent to the front surface of the substrate 812, where the front surface of the substrate 812 faces the remote plasma source 802.

The substrate 812 is supported on a substrate support or pedestal 814. The pedestal 814 may move within the reaction chamber 804 to position the substrate 812 within the chemical vapor deposition zone 808. In the embodiment shown in FIG. 8, pedestal 814 is shown having elevated the substrate 812 within the chemical vapor deposition zone 808. The pedestal 814 may also adjust the temperature of the substrate 812 in some embodiments, which can provide some selective control over thermally activated surface reactions on the substrate 812.

FIG. 8 shows a coil 818 arranged around the remote plasma source 802, where the remote plasma source 802 includes an outer wall (e.g., quartz dome). The coil 818 is electrically coupled to a plasma generator controller 822, which may be used to form and sustain plasma within a plasma region 884 via inductively coupled plasma generation. In some implementations, the plasma generator controller 822 may include a power supply for supplying power to the coil 818, where the power can be in a range about 1 to about 6 kilowatts (kW) during plasma generation. In some implementations, electrodes or antenna for parallel plate or capacitively coupled plasma generation may be used to generate a continuous supply of radicals via plasma excitation rather than inductively coupled plasma generation. Regardless of the mechanism used to ignite and sustain the plasma in the plasma region 884, radical species may continuously be generated using plasma excitation during film deposition. In some implementations, hydrogen radicals are generated under approximately steady-state conditions during steady-state film deposition, though transients may occur at the beginning and end of film deposition.

A supply of hydrogen radicals may be continuously generated within the plasma region 884 while hydrogen gas or other source gas is being supplied to the remote plasma source 802. Excited hydrogen radicals may be generated in the remote plasma source 802. If not re-excited or re-supplied with energy, or re-combined with other radicals, the excited hydrogen radicals lose their energy, or relax. Thus, excited hydrogen radicals may relax to form hydrogen radicals in a substantially low energy state or ground state. The hydrogen radicals in the substantially low energy state or ground state.

The hydrogen gas ($H_2$) or other source gas may be diluted with one or more additional gases. These one or more additional gases may be supplied to the remote plasma source 802. In some implementations, the hydrogen gas or other source gas is mixed with one or more additional gases to form a gas mixture, where the one or more additional gases can include a carrier gas. Non-limiting examples of additional gases can include helium (He), neon (Ne), argon (Ar), krypton (Kr), xenon (Xe), and nitrogen ($N_2$). The one or more additional gases may support or stabilize steady-state plasma conditions within the remote plasma source 802 or aid in transient plasma ignition or extinction processes. In some implementations, diluting hydrogen gas or other source gas with helium, for example, may permit higher total pressures without concomitant plasma breakdown. Put another way, a dilute gas mixture of hydrogen gas and helium may permit higher total gas pressure without increasing plasma power to the remote plasma source 802. In certain embodiments, hydrogen gas is provided in a carrier such helium. As an example, hydrogen gas may be provided in a helium carrier at a concentration of about 1% to about 25% hydrogen or about 1% to about 10% hydrogen.

As shown in FIG. 8, a source gas supply 826 is fluidly coupled with the remote plasma source 802 for supplying the hydrogen gas or source gas or for deposition of the inhibitor layer on a barrier layer, for supplying silicon-containing gases and/or oxygen-containing gases. In some embodiments, deposition of the inhibitor layer is performed in a separate reaction chamber from the deposition of the graphene layer. In some embodiments, deposition of the inhibitor layer is performed in a reaction chamber such as reaction chamber 804, but source gas supply 826 is used to supply inhibitor layer deposition gases, and remote plasma source 802 is optional. In addition, an additional gas supply 828 is fluidly coupled with the remote plasma source 802 for supplying the one or more additional gases. The one or more additional gases may also include a co-reactant gas. While the embodiment in FIG. 8 depicts the gas mixture of the source gas and the one or more additional gases being introduced through separate gas outlets, it will be understood that the gas mixture may be introduced directly into the remote plasma source 802. That is, a pre-mixed dilute gas mixture may be supplied to the remote plasma source 802 through a single gas outlet.

Gases, such as excited hydrogen and helium radicals and relaxed gases/radicals, flow out of the remote plasma source 802 and into the reaction chamber 804 via the showerhead 806. Gases within the showerhead 806 and within the reaction chamber 804 are generally not subject to continued plasma excitation therein. In some implementations, the showerhead 806 includes an ion filter and/or a photon filter. Filtering ions and/or photons may reduce substrate damage, undesirable re-excitation of molecules, and/or selective breakdown or decomposition of hydrocarbon precursors within the reaction chamber 804. Showerhead 806 may have a plurality of gas ports 844 to diffuse the flow of gases into the reaction chamber 804. In some implementations, the plurality of gas ports 844 may be mutually spaced apart. In some implementations, the plurality of gas ports 844 may be arranged as an array of regularly spaced apart channels or through-holes extending through a plate separating the remote plasma source 802 and the reaction chamber 804. The plurality of gas ports 844 may smoothly disperse and diffuse exiting radicals from the remote plasma source 802 into the reaction chamber 804.

Typical remote plasma sources are far removed from reaction vessels. Consequently, radical extinction and recombination, e.g., via wall collision events, may reduce active species substantially. In contrast, in some implementations, dimensions for the plurality of gas ports 844 may be configured in view of the mean free path or gas flow residence time under typical processing conditions to aid the free passage of radicals into the reaction chamber 804. In some implementations, openings for the plurality of gas ports 844 may occupy about 5% to about 20% of an exposed surface area of the showerhead 806. In some implementations, the plurality of gas ports 844 may each have an axial length to diameter ratio of about 3:1 to about 10:1 or about 6:1 to about 8:1. Such aspect ratios may reduce wall-collision frequency for radical species passing through the plurality of gas ports 844 while providing sufficient time for a majority of excited state radical species to relax to ground state radical species. In some implementations, dimensions of the plurality of gas ports 844 may be configured so that the residence time of gases passing through the showerhead 806 is greater than the typical energetic relaxation time of an excited state radical species. Excited state radical species for hydrogen source gas may be denoted by ·H* in FIG. 8 and ground state radical species for hydrogen source gas may be denoted by ·H in FIG. 8.

In some implementations, excited state radical species exiting the plurality of gas ports 844 may flow into a relaxation zone 838 contained within an interior of the reaction chamber 804. The relaxation zone 838 is positioned upstream of the chemical vapor deposition zone 808 but downstream of the showerhead 806. Substantially all or at least 90% of the excited state radical species exiting the showerhead 806 will transition into relaxed state radical species in the relaxation zone 838. Almost all of the excited state radical species (e.g., excited hydrogen radicals) entering the relaxation zone 838 become de-excited or transition into a relaxed state radical species (e.g., ground state hydrogen radicals) before exiting the relaxation zone 838. In some implementations, process conditions or a geometry of the relaxation zone 838 may be configured so that the residence time of radical species flowing through the relaxation zone 838, e.g., a time determined by mean free path and mean molecular velocity, results in relaxed state radical species flowing out of the relaxation zone 838.

With the delivery of radical species to the relaxation zone 838 from the showerhead 806, one or more hydrocarbon precursors may be introduced into the chemical vapor deposition zone 808. The one or more hydrocarbon precursors may be introduced via a gas distributor or gas outlet 842, where the gas outlet 842 may be fluidly coupled with a precursor supply source 840. The relaxation zone 838 may be contained within a space between the showerhead 806 and the gas outlet 842. The gas outlet 842 may include mutually spaced apart openings so that the flow of the one or more hydrocarbon precursors may be introduced in a direction parallel with gas mixture flowing from the relaxation zone 838. The gas outlet 842 may be located downstream from the showerhead 806 and the relaxation zone 838. The gas outlet 842 may be located upstream from the chemical vapor deposition zone 808 and the substrate 812. The chemical vapor deposition zone 808 is located within the interior of the reaction chamber 804 and between the gas outlet 842 and the substrate 812.

Substantially all of the flow of the one or more hydrocarbon precursors may be prevented from mixing with excited state radical species adjacent to the showerhead 806. Relaxed or ground state radical species mix in a region adjacent to the substrate 812 with the one or more hydrocarbon precursors. The chemical vapor deposition zone 808 includes the region adjacent to the substrate 812 where the relaxed or ground state radical species mix with the one or more hydrocarbon precursors. The relaxed or ground state radical species mix with the one or more hydrocarbon precursors in the gas phase during CVD formation of graphene.

In some implementations, a co-reactant may be introduced from the showerhead 806 and flowed along with the radical species generated in the remote plasma source 802 and into the reaction chamber 804. This may include radicals and/or ions of a co-reactant gas provided in the remote plasma source 802. The co-reactant may be supplied from the additional gas supply 828. In some implementations, the co-reactant may include a nitrogen-containing agent such as nitrogen gas ($N_2$). For example, radicals and/or ions of nitrogen may be generated and flowed with the radical species of hydrogen during pretreatment of a metal surface of the substrate 812.

The gas outlet 842 may be separated from the showerhead 806 by a sufficient distance to prevent back diffusion or back streaming of the one or more hydrocarbon precursors. This can afford sufficient time for radical species of hydrogen to transition from an excited state to a relaxed state (e.g., ground state). In some implementations, the gas outlet 842 may be separated from the plurality of gas ports 844 by a distance about 0.5 inches to about 5 inches, or about 1.5 inches to about 4.5 inches, or about 1.5 inches to about 3 inches.

Process gases may be removed from the reaction chamber 804 via an outlet 848 that is fluidly coupled to a pump (not shown). Thus, excess hydrocarbon precursors, co-reactants, radical species, and diluent and displacement or purge gases may be removed from the reaction chamber 804. In some implementations, a system controller 850 is in operative communication with the plasma processing apparatus 800. In some implementations, the system controller 850 includes a processor system 852 (e.g., microprocessor) configured to execute instructions held in a data system 854 (e.g., memory). In some implementations, the system controller 850 may be in communication with the plasma generator controller 822 to control plasma parameters and/or conditions. In some implementations, the system controller 850 may be in communication with the pedestal 814 to control pedestal elevation and temperature. In some implementations, the system controller 850 may control other processing conditions, such as RF power settings, frequency settings, duty cycles, pulse times, pressure within the reaction chamber 804, pressure within the remote plasma source 802, gas flow rates from the source gas supply 826 and the additional gas supply 828, gas flow rates from the precursor supply source 840 and other sources, temperature of the pedestal 814, and temperature of the reaction chamber 804, among others.

The controller 850 may contain instructions for controlling process conditions for the operation of the plasma processing apparatus 800. The controller 850 will typically include one or more memory devices and one or more processors. The processor may include a CPU or computer, analog and/or digital input/output connections, stepper motor controller boards, etc. Instructions for implementing appropriate control operations are executed on the processor. These instructions may be stored on the memory devices associated with the controller 850 or they may be provided over a network.

In certain embodiments, the controller 850 controls all or most activities of the plasma processing apparatus 800 described herein. For example, the controller 850 may control all or most activities of the plasma processing apparatus 800 associated with depositing graphene and, optionally, other operations in a fabrication flow that includes the graphene. The controller 850 may execute system control software including sets of instructions for controlling the timing, gas composition, gas flow rates, chamber pressure, chamber temperature, RF power levels, substrate position, and/or other parameters. Other computer programs, scripts, or routines stored on memory devices associated with the controller 850 may be employed in some embodiments. To provide relatively mild reactive conditions at the environment adjacent to the substrate 812, parameters such as the RF power levels, gas flow rates to the plasma region 884, gas flow rates to the chemical vapor deposition zone 808, and timing of the plasma ignition can be adjusted and maintained by controller 850. Additionally, adjusting the substrate position may further reduce the presence of high-energy radical species at the environment adjacent to the substrate 812. In a multi-station reactor, the controller 850 may comprise different or identical instructions for different apparatus stations, thus allowing the apparatus stations to operate either independently or synchronously.

In some embodiments, the controller 850 may include instructions for performing operations such as flowing one or more hydrocarbon precursors through the gas outlet 842 into the reaction chamber 804, providing a source gas into the remote plasma source 802, generating one or more radical species of the source gas in the remote plasma source 802 upstream of the one or more hydrocarbon precursors, introducing the one or more radical species from the remote plasma source 802 into the reaction chamber 804 to react with the one or more hydrocarbon precursors to deposit a graphene on a metal surface of the substrate 812. The one or more radical species in the reaction chamber 804 in an environment adjacent to the substrate 812 may be hydrogen radicals in a ground state. In some implementations, the controller 850 may include instructions for treating the metal surface of the substrate 812 prior to depositing graphene. In some implementations, the controller 850 may include instructions for maintaining a temperature of the substrate 812 equal to or less than about 400° C., or about 200° C. to about 400° C. In some implementations, each of the one or more hydrocarbon precursors includes an alkene or alkyne group.

In some embodiments, the plasma processing apparatus 800 may include a user interface associated with controller 850. The user interface may include a display screen, graphical software displays of the plasma processing apparatus 800 and/or process conditions, and user input devices such as pointing devices, keyboards, touch screens, microphones, etc.

The computer program code for controlling the above operations can be written in any conventional computer readable programming language: for example, assembly language, C, C++, Pascal, Fortran, or others. Compiled object code or script is executed by the processor to perform the tasks identified in the program.

Signals for monitoring the process may be provided by analog and/or digital input connections of the system controller. The signals for controlling the process are output on the analog and digital output connections of the processing system.

In general, the methods described herein can be performed on systems including semiconductor processing equipment such as a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. In general, the electronics are referred to as the controller, which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials (e.g., silicon carbide), surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

In addition to graphene deposition described herein, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 9:
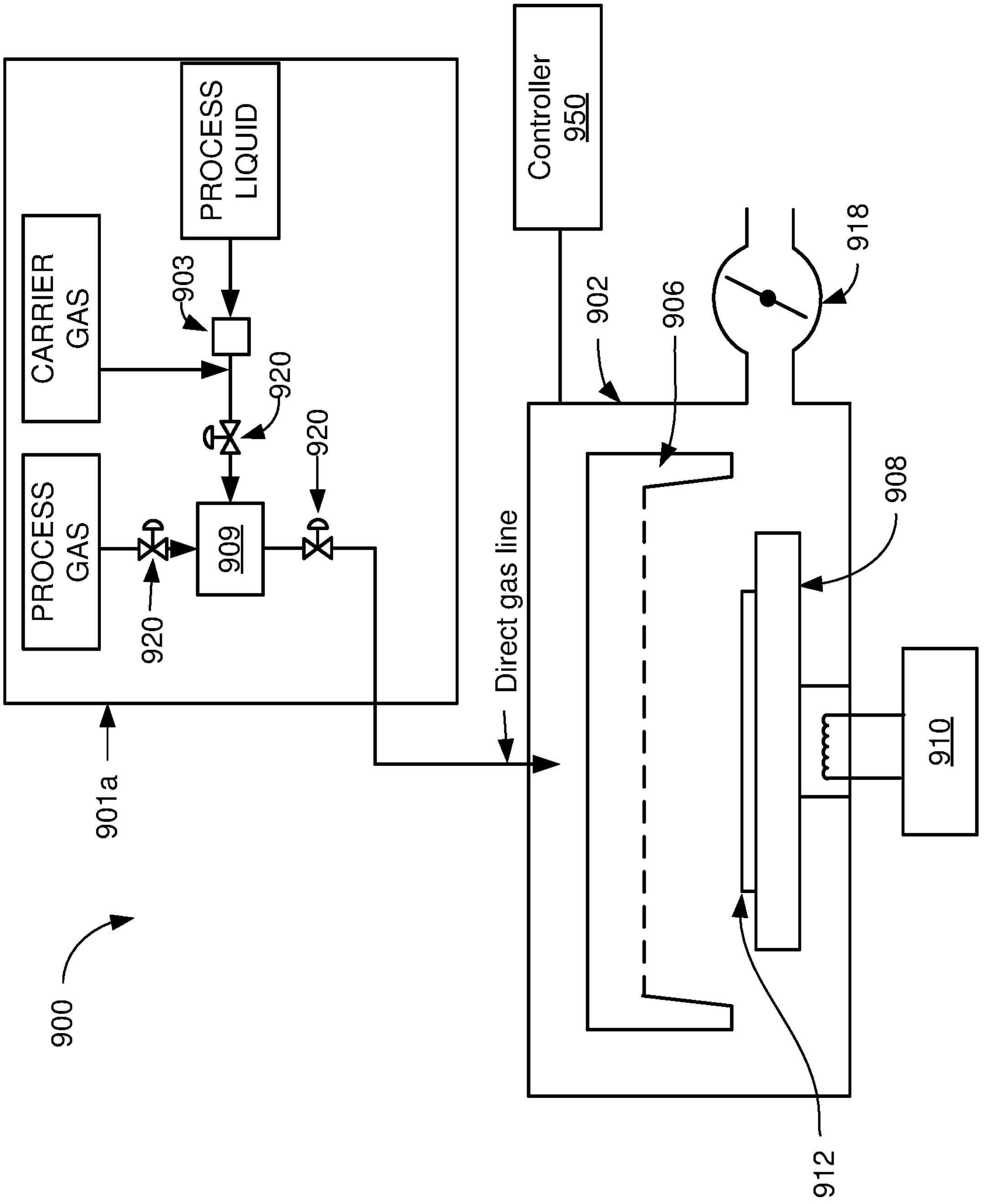
FIG. 9 illustrates a schematic diagram of an example process chamber for performing disclosed embodiments.

FIG. 9 depicts a schematic illustration of an embodiment of an atomic layer deposition (ALD) process station 900 having a process chamber body 902. A plurality of ALD process stations 900 may be included in a common low pressure process tool environment. In some embodiments, one or more hardware parameters of ALD process station 900 including those discussed in detail below may be adjusted programmatically by one or more computer controllers 950.

ALD process station 900 fluidly communicates with reactant delivery system 901*a* for delivering process gases to a distribution showerhead 906. Reactant delivery system 901*a* includes a mixing vessel 909 for blending and/or conditioning process gases, such as a blocking reagent gas, metal precursor gas, or oxygen-containing gas for delivery to showerhead 906. One or more mixing vessel inlet valves 920 may control introduction of process gases to mixing vessel 909.

As an example, the embodiment of FIG. 9 includes a vaporization point 903 for vaporizing liquid reactant to be supplied to the mixing vessel 909. In some embodiments, vaporization point 903 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 903 may be heat traced. In some examples, mixing vessel 909 may also be heat traced. In one non-limiting example, piping downstream of vaporization point 903 has an increasing temperature profile extending from approximately 100° C. to approximately 150° C. at mixing vessel 909.

In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 903. In one scenario, a liquid injector may be mounted directly to mixing vessel 909. In another scenario, a liquid injector may be mounted directly to showerhead 906.

In some embodiments, a liquid flow controller (LFC) upstream of vaporization point 903 may be provided for controlling a mass flow of liquid for vaporization and delivery to process station 900. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 906 distributes process gases toward substrate 912. In the embodiment shown in FIG. 9, the substrate 912 is located beneath showerhead 906 and is shown resting on a pedestal 908. Showerhead 906 may have any suitable shape, and may have any suitable number and arrangement of ports for distributing process gases to substrate 912.

In some embodiments, pedestal 908 may be raised or lowered to expose substrate 912 to a volume between the substrate 912 and the showerhead 906. It will be appreciated that, in some embodiments, pedestal height may be adjusted programmatically by a suitable computer controller 950. At the conclusion of the process phase, pedestal 908 may be lowered during another substrate transfer phase to allow removal of substrate 912 from pedestal 908.

In some embodiments, pedestal 908 may be temperature controlled via heater 910. In some embodiments, the pedestal 908 may be heated to a temperature of at least about 25° C., or about 25° C. to about 400° C. In various embodiments, process station 900 is used without igniting a plasma.

Further, in some embodiments, pressure control for process station 900 may be provided by butterfly valve 918. As shown in the embodiment of FIG. 9, butterfly valve 918 throttles a vacuum provided by a downstream vacuum pump (not shown). However, in some embodiments, pressure control of process station 900 may also be adjusted by varying a flow rate of one or more gases introduced to the process station 900.

In some embodiments, a position of showerhead 906 may be adjusted relative to pedestal 908 to vary a volume between the substrate 912 and the showerhead 906. Further, it will be appreciated that a vertical position of pedestal 908 and/or showerhead 906 may be varied by any suitable mechanism within the scope of the present disclosure. In some embodiments, pedestal 908 may include a rotational axis for rotating an orientation of substrate 912. It will be appreciated that, in some embodiments, one or more of these example adjustments may be performed programmatically by one or more suitable computer controllers 950.

In plasma-based processes, adjusting a height of pedestal 908 may allow a plasma density to be varied during plasma activation cycles in the process in embodiments where a plasma is ignited. In some embodiments where plasma may be used, showerhead 906 and pedestal 908 electrically communicate with a radio frequency (RF) power supply 914 and matching network 916 for powering a plasma. In some embodiments, the plasma energy may be controlled by controlling one or more of a process station pressure, a gas concentration, an RF source power, an RF source frequency, and a plasma power pulse timing. For example, RF power supply 914 and matching network 916 may be operated at any suitable power to form a plasma having a desired composition of radical species. Examples of suitable powers are about 150 W to about 6000 W. Plasma may be used to deposit and/or to remove an inhibitor layer. RF power supply 914 may provide RF power of any suitable frequency. In some embodiments, RF power supply 914 may be configured to control high- and low-frequency RF power sources independently of one another. Example low-frequency RF frequencies may include, but are not limited to, frequencies about 0 kHz to about 500 kHz. Example high-frequency RF frequencies may include, but are not limited to, frequencies about 1.8 MHz to about 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 950 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inhibitor layer deposition precursor, instructions for setting a flow rate of a carrier gas (such as argon), and time delay instructions for the first recipe phase. A second recipe phase may include instructions for modulating or stopping a flow rate of an inert and/or a reactant gas, and instructions for modulating a flow rate of a carrier or purge gas and time delay instructions for the second recipe phase. A third, subsequent recipe phase may include instructions for modulating a flow rate of an inhibitor layer reactant gas such as an alcohol, instructions for modulating the flow rate of a carrier or purge gas, and time delay instructions for the third recipe phase. A fourth, subsequent recipe phase may include instructions for modulating or stopping a flow rate of an inert and/or a reactant gas, and instructions for modulating a flow rate of a carrier or purge gas and time delay instructions for the fourth recipe phase. It will be appreciated that these recipe phases may be further subdivided and/or iterated in any suitable way within the scope of the disclosed embodiments. In some embodiments, the controller 950 may include any of the features described above with respect to system controller 850 of FIG. 8.

Definitions

The term “acyl,” or “alkanoyl,” as used interchangeably herein, represents groups of 1, 2, 3, 4, 5, 6, 7, 8 or more carbon atoms of a straight, branched, cyclic configuration, saturated, unsaturated and aromatic, and combinations thereof, or hydrogen, attached to the parent molecular group through a carbonyl group, as defined herein. This group is exemplified by formyl (—C(O)H), acetyl (Ac or —C(O)Me), propionyl, isobutyryl, butanoyl, and the like. In some embodiments, the acyl or alkanoyl group is —C(O)—R, in which R is hydrogen, an aliphatic group, or an aromatic group, as defined herein.

By “alkanoyloxy” is meant an alkanoyl group, as defined herein, attached to the parent molecular group through an oxy group, as defined herein. This group is exemplified by acetoxy (—OAc or —OC(O)Me). In some embodiments, the alkanoyloxy group is —OC(O)—R, in which R is hydrogen, an aliphatic group, or an aromatic group, as defined herein.

By “aliphatic” is meant a hydrocarbon group having at least one carbon atom to 50 carbon atoms ($C_{1-50}$), such as one to 25 carbon atoms ($C_{1-25}$), or one to ten carbon atoms ($C_{1-10}$), and which includes alkanes (or alkyl), alkenes (or alkenyl), alkynes (or alkynyl), including cyclic versions thereof, and further including straight- and branched-chain arrangements, and all stereo and position isomers as well. An aliphatic group is unsubstituted or substituted, e.g., by a functional group described herein. For example, the aliphatic group can be substituted with one or more substitution groups, as described herein for alkyl.

By "aliphatic-carbonyl" is meant an aliphatic group that is or can be coupled to a compound disclosed herein, wherein the aliphatic group is or becomes coupled through a carbonyl group (—C(O)—). In some embodiments, the aliphatic-carbonyl group is —C(O)—R, in which R is an optionally substituted aliphatic group, as defined herein.

By "aliphatic-carbonyloxy" is meant an aliphatic group that is or can be coupled to a compound disclosed herein, wherein the aliphatic group is or becomes coupled through a carbonyloxy group (—OC(O)—). In some embodiments, the aliphatic-carbonyloxy group is —OC(O)—R, in which R is an optionally substituted aliphatic group, as defined herein.

By "aliphatic-oxy" is meant an aliphatic group that is or can be coupled to a compound disclosed herein, wherein the aliphatic group is or becomes coupled through an oxy group ((O)—). In some embodiments, the aliphatic-oxy group is —O—R, in which R is an optionally substituted aliphatic group, as defined herein.

By "aliphatic-oxycarbonyl" is meant an aliphatic group that is or can be coupled to a compound disclosed herein, wherein the aliphatic group is or becomes coupled through an oxycarbonyl group (—C(O)O—). In some embodiments, the aliphatic-oxycarbonyl group is —C(O)O—R, in which R is an optionally substituted aliphatic group, as defined herein.

By "alkyl-aryl," "alkenyl-aryl," and "alkynyl-aryl" is meant an alkyl, alkenyl, or alkynyl group, respectively and as defined herein, that is or can be coupled (or attached) to the parent molecular group through an aryl group, as defined herein. The alkyl-aryl, alkenyl-aryl, and/or alkynyl-aryl group can be substituted or unsubstituted. For example, the alkyl-aryl, alkenyl-aryl, and/or alkynyl-aryl group can be substituted with one or more substitution groups, as described herein for alkyl and/or aryl. Exemplary unsubstituted alkyl-aryl groups are of from 7 to 16 carbons ($C_{7-16}$ alkyl-aryl), as well as those having an alkyl group with 1 to 6 carbons and an aryl group with 4 to 18 carbons (i.e., $C_{1-6}$ alkyl-$C_{4-18}$ aryl). Exemplary unsubstituted alkenyl-aryl groups are of from 7 to 16 carbons ($C_{7-16}$ alkenyl-aryl), as well as those having an alkenyl group with 2 to 6 carbons and an aryl group with 4 to 18 carbons (i.e., $C_{2-6}$ alkenyl-$C_{4-18}$ aryl). Exemplary unsubstituted alkynyl-aryl groups are of from 7 to 16 carbons ($C_{7-16}$ alkynyl-aryl), as well as those having an alkynyl group with 2 to 6 carbons and an aryl group with 4 to 18 carbons (i.e., $C_{2-6}$ alkynyl-$C_{4-18}$ aryl). In some embodiments, the alkyl-aryl group is -L-R, in which L is an aryl group or an arylene group, as defined herein, and R is an alkyl group, as defined herein. In some embodiments, the alkenyl-aryl group is -L-R, in which L is an aryl group or an arylene group, as defined herein, and R is an alkenyl group, as defined herein. In some embodiments, the alkynyl-aryl group is -L-R, in which L is an aryl group or an arylene group, as defined herein, and R is an alkynyl group, as defined herein.

By "alkenyl" is meant an unsaturated monovalent hydrocarbon having at least two carbon atom to 50 carbon atoms ($C_{2-50}$), such as two to 25 carbon atoms ($C_{2-25}$), or two to ten carbon atoms ($C_{2-10}$), and at least one carbon-carbon double bond, wherein the unsaturated monovalent hydrocarbon can be derived from removing one hydrogen atom from one carbon atom of a parent alkene. An alkenyl group can be branched, straight-chain, cyclic (e.g., cycloalkenyl), cis, or trans (e.g., E or Z). An exemplary alkenyl includes an optionally substituted $C_{2-24}$ alkyl group having one or more double bonds. The alkenyl group can be monovalent or multivalent (e.g., bivalent) by removing one or more hydrogens to form appropriate attachment to the parent molecular group or appropriate attachment between the parent molecular group and another substitution. The alkenyl group can also be substituted or unsubstituted. For example, the alkenyl group can be substituted with one or more substitution groups, as described herein for alkyl. Non-limiting alkenyl groups include allyl (All), vinyl (Vi), 1-butenyl, 2-butenyl, and the like.

By "alkoxy" is meant —OR, where R is an optionally substituted aliphatic group, as described herein. Exemplary alkoxy groups include, but are not limited to, methoxy, ethoxy, n-propoxy, isopropoxy, n-butoxy, t-butoxy, sec-butoxy, n-pentoxy, trihaloalkoxy, such as trifluoromethoxy, etc. The alkoxy group can be substituted or unsubstituted. For example, the alkoxy group can be substituted with one or more substitution groups, as described herein for alkyl. Exemplary unsubstituted alkoxy groups include $C_{1-3}$, $C_{1-6}$, $C_{1-12}$, $C_{1-16}$, $C_{1-18}$, $C_{1-20}$, or $C_{1-24}$ alkoxy groups.

By "alkoxyalkyl" is meant an alkyl group, as defined herein, which is substituted with an alkoxy group, as defined herein. Exemplary unsubstituted alkoxyalkyl groups include between 2 to 12 carbons ($C_{2-12}$ alkoxyalkyl), as well as those having an alkyl group with 1 to 6 carbons and an alkoxy group with 1 to 6 carbons (i.e., $C_{1-6}$ alkoxy-$C_{1-6}$ alkyl). In some embodiments, the alkoxyalkyl group is -L-O—R, in which each of L and R is, independently, an alkyl group, as defined herein.

By "alkoxycarbonyl" is meant —C(O)—OR, where R is an optionally substituted aliphatic group, as described herein. In particular embodiments, the alkoxycarbonyl group is —C(O)—OAk, in which Ak is an alkyl group, as defined herein. The alkoxycarbonyl group can be substituted or unsubstituted. For example, the alkoxycarbonyl group can be substituted with one or more substitution groups, as described herein for alkyl. Exemplary unsubstituted alkoxycarbonyl groups include $C_{2-3}$, $C_{2-6}$, $C_{2-7}$, $C_{2-12}$, $C_{2-16}$, $C_{2-18}$, $C_{2-20}$, or $C_{2-24}$ alkoxycarbonyl groups.

By "alkyl" is meant a saturated monovalent hydrocarbon having at least one carbon atom to 50 carbon atoms ($C_{1-50}$), such as one to 25 carbon atoms ($C_{1-25}$), or one to ten carbon atoms ($C_{1-10}$), wherein the saturated monovalent hydrocarbon can be derived from removing one hydrogen atom from one carbon atom of a parent compound (e.g., alkane). An alkyl group can be branched, straight-chain, or cyclic (e.g., cycloalkyl). An exemplary alkyl includes a branched or unbranched saturated hydrocarbon group of 1 to 24 carbon atoms, such as methyl (Me), ethyl (Et), n-propyl (nPr), iso-propyl (iPr), n-butyl (nBu), iso-butyl (iBu), sec-butyl (sBu), tert-butyl (tBu), pentyl (Pe), n-pentyl (nPe), isopentyl (iPe), s-pentyl (sPe), neopentyl (neoPe), tert-pentyl (tPe), hexyl (Hx), heptyl (Hp), octyl (Oc), nonyl (Nn), decyl (De), dodecyl, tetradecyl, hexadecyl, eicosyl, tetracosyl, and the like. The alkyl group can also be substituted or unsubstituted. The alkyl group can be monovalent or multivalent (e.g., bivalent) by removing one or more hydrogens to form appropriate attachment to the parent molecular group or appropriate attachment between the parent molecular group and another substitution. For example, the alkyl group can be substituted with one, two, three or, in the case of alkyl groups of two carbons or more, four substituents independently selected from the group consisting of: (1) $C_{1-6}$ alkoxy (e.g., —O—R, in which R is $C_{1-6}$ alkyl); (2) $C_{1-6}$ alkylsulfinyl (e.g., —S(O)—R, in which R is $C_{1-6}$ alkyl); (3) $C_{1-6}$ alkylsulfonyl (e.g., —$SO_2$—R, in which R is $C_{1-6}$ alkyl); (4) amino (e.g., —$NR^1R^2$, where each of $R^1$ and $R^2$ is, independently, selected from hydrogen, aliphatic, heteroaliphatic, haloaliphatic, haloheteroaliphatic, aromatic, as defined herein, or any combination thereof, or $R^1$ and $R^2$, taken together with the nitrogen atom to which each are attached, can form a heterocyclyl group, as defined herein); (5) aryl; (6) arylalkoxy (e.g., —O-L-R, in which L is alkyl and R is aryl); (7) aryloyl (e.g., —C(O)—R, in which R is aryl); (8) azido (e.g., —$N_3$); (9) cyano (e.g., —CN); (10) aldehyde (e.g., —C(O)H); (11) $C_{3-8}$ cycloalkyl; (12) halo; (13) heterocyclyl (e.g., as defined herein, such as a 5-, 6- or 7-membered ring containing one, two, three, or four non-carbon heteroatoms); (14) heterocyclyloxy (e.g., —O—R, in which R is heterocyclyl, as defined herein); (15) heterocyclyloyl (e.g., —C(O)—R, in which R is heterocyclyl, as defined herein); (16) hydroxyl (e.g., —OH); (17) N-protected amino; (18) nitro (e.g., —$NO_2$); (19) oxo (e.g., =O); (20) $C_{1-6}$ thioalkyl (e.g., —S—R, in which R is alkyl); (21) thiol (e.g., —SH); (22) —$CO_2R^1$, where $R^1$ is selected from the group consisting of (a) hydrogen, (b) $C_{1-6}$ alkyl, (c) $C_{4-18}$ aryl, and (d) $C_{4-18}$ aryl-$C_{1-6}$ alkyl (e.g., -L-R, in which L is $C_{1-6}$ alkyl and R is $C_{4-18}$ aryl); (23) —C(O)$NR^1R^2$, where each of $R^1$ and $R^2$ is, independently, selected from the group consisting of (a) hydrogen, (b) $C_{1-6}$ alkyl, (c) $C_{4-18}$ aryl, and (d) $C_{4-18}$ aryl-$C_{1-6}$ alkyl (e.g., -L-R, in which L is $C_{1-6}$ alkyl and R is $C_{4-18}$ aryl); (24) —$SO_2R^1$, where $R^1$ is selected from the group consisting of (a) $C_{1-6}$ alkyl, (b) $C_{4-18}$ aryl, and (c) $C_{4-18}$ aryl-$C_{1-6}$ alkyl (e.g., -L-R, in which L is $C_{1-6}$ alkyl and R is $C_{4-18}$ aryl); (25) —$SO_2NR^1R^2$, where each of $R^1$ and $R^2$ is, independently, selected from the group consisting of (a) hydrogen, (b) $C_{1-6}$ alkyl, (c) $C_{4-18}$ aryl, and (d) $C_{4-18}$ aryl-$C_{1-6}$ alkyl (e.g., -L-R, in which L is $C_{1-6}$ alkyl and R is $C_{4-18}$ aryl); and (26) —$NR^1R^2$, where each of $R^1$ and $R^2$ is, independently, selected from the group consisting of (a) hydrogen, (b) an N-protecting group, (c) $C_{1-6}$ alkyl, (d) $C_{2-6}$ alkenyl, (e) $C_{2-6}$ alkynyl, (f) $C_{4-18}$ aryl, (g) $C_{4-18}$ aryl-$C_{1-6}$ alkyl (e.g., -L-R, in which L is $C_{1-6}$ alkyl and R is $C_{4-18}$ aryl), (h) $C_{3-8}$ cycloalkyl, and (i) $C_{3-8}$ cycloalkyl-$C_{1-6}$ alkyl (e.g., -L-R, in which L is $C_{1-6}$ alkyl and R is $C_{3-8}$ cycloalkyl), wherein in one embodiment no two groups are bound to the nitrogen atom through a carbonyl group or a sulfonyl group. The alkyl group can be a primary, secondary, or tertiary alkyl group substituted with one or more substituents (e.g., one or more halo or alkoxy). In some embodiments, the unsubstituted alkyl group is a $C_{1-3}$, $C_{1-6}$, $C_{1-12}$, $C_{1-16}$, $C_{1-18}$, $C_{1-20}$, or $C_{1-24}$ alkyl group.

By "alkylene," "alkenylene," or "alkynylene" is meant a multivalent (e.g., bivalent) form of an alkyl, alkenyl, or alkynyl group, respectively, as described herein. Exemplary alkylene groups include methylene, ethylene, propylene, butylene, etc. In some embodiments, the alkylene group is a $C_{1-3}$, $C_{1-6}$, $C_{1-12}$, $C_{1-16}$, $C_{1-18}$, $C_{1-20}$, $C_{1-24}$, $C_{2-3}$, $C_{2-6}$, $C_{2-12}$, $C_{2-16}$, $C_{2-18}$, $C_{2-20}$, or $C_{2-24}$ alkylene group. In other embodiments, the alkenylene or alkynylene group is a $C_{2-3}$, $C_{2-6}$, $C_{2-12}$, $C_{2-16}$, $C_{2-18}$, $C_{2-20}$, or $C_{2-24}$ alkenylene or alkynylene group. The alkylene, alkenylene, or alkynylene group can be branched or unbranched. The alkylene, alkenylene, or alkynylene group can also be substituted or unsubstituted. For example, the alkylene, alkenylene, or alkynylene group can be substituted with one or more substitution groups, as described herein for alkyl.

By "alkylsulfinyl" is meant an alkyl group, as defined herein, attached to the parent molecular group through an —S(O)— group. In some embodiments, the unsubstituted alkylsulfinyl group is a $C_{1-6}$ or $C_{1-12}$ alkylsulfinyl group. In other embodiments, the alkylsulfinyl group is —S(O)—R, in which R is an alkyl group, as defined herein.

By "alkylsulfinylalkyl" is meant an alkyl group, as defined herein, substituted by an alkylsulfinyl group. In some embodiments, the unsubstituted alkylsulfinylalkyl group is a $C_{2-12}$ or $C_{2-24}$ alkylsulfinylalkyl group (e.g., $C_{1-6}$ alkylsulfinyl-$C_{1-6}$ alkyl or $C_{1-12}$ alkylsulfinyl-$C_{1-12}$ alkyl). In other embodiments, the alkylsulfinylalkyl group is -L-S(O)—R, in which each of L and R is, independently, an alkyl group, as defined herein.

By "alkylsulfonyl" is meant an alkyl group, as defined herein, attached to the parent molecular group through an —$SO_2$— group. In some embodiments, the unsubstituted alkylsulfonyl group is a $C_{1-6}$ or $C_{1-12}$ alkylsulfonyl group. In other embodiments, the alkylsulfonyl group is —$SO_2$—R, where R is an optionally substituted alkyl (e.g., as described herein, including optionally substituted $C_{1-12}$ alkyl, haloalkyl, or perfluoroalkyl).

By "alkylsulfonylalkyl" is meant an alkyl group, as defined herein, substituted by an alkylsulfonyl group. In some embodiments, the unsubstituted alkylsulfonylalkyl group is a $C_{2-12}$ or $C_{2-24}$ alkylsulfonylalkyl group (e.g., $C_{1-6}$ alkylsulfonyl-$C_{1-6}$ alkyl or $C_{1-12}$ alkylsulfonyl-$C_{1-12}$ alkyl). In other embodiments, the alkylsulfonylalkyl group is -L-$SO_2$—R, in which each of L and R is, independently, an alkyl group, as defined herein.

By "alkynyl" is meant an unsaturated monovalent hydrocarbon having at least two carbon atom to 50 carbon atoms ($C_{2-50}$), such as two to 25 carbon atoms ($C_{2-25}$), or two to ten carbon atoms ($C_{2-10}$), and at least one carbon-carbon triple bond, wherein the unsaturated monovalent hydrocarbon can be derived from removing one hydrogen atom from one carbon atom of a parent alkyne. An alkynyl group can be branched, straight-chain, or cyclic (e.g., cycloalkynyl). An exemplary alkynyl includes an optionally substituted $C_{2-24}$ alkyl group having one or more triple bonds. The alkynyl group can be cyclic or acyclic and is exemplified by ethynyl, 1-propynyl, and the like. The alkynyl group can be monovalent or multivalent (e.g., bivalent) by removing one or more hydrogens to form appropriate attachment to the parent molecular group or appropriate attachment between the parent molecular group and another substitution. The alkynyl group can also be substituted or unsubstituted. For example, the alkynyl group can be substituted with one or more substitution groups, as described herein for alkyl.

By "ambient temperature" is meant a temperature ranging from 16° C. to 26° C., such as from 19° C. to 25° C. or from 20° C. to 25° C.

By "amide" is mean —C(O)$NR^1R^2$ or —$NHCOR^1$, where each of $R^1$ and $R^2$ is, independently, selected from hydrogen, aliphatic, heteroaliphatic, aromatic, as defined herein, or any combination thereof, or where $R^1$ and $R^2$, taken together with the nitrogen atom to which each are attached, can form a heterocyclyl group, as defined herein.

By "amino" is meant —$NR^1R^2$, where each of $R^1$ and $R^2$ is, independently, selected from hydrogen, optionally substituted aliphatic, optionally substituted heteroaliphatic, optionally substituted aromatic, optionally substituted heteroaromatic, optionally substituted silyl, or optionally substituted silyloxy, as defined herein, or any combination thereof; or where $R^1$ and $R^2$, taken together with the nitrogen atom to which each are attached, can form a heterocyclyl group, as defined herein. In particular embodiments, each of $R^1$ and $R^2$ is, independently, H, optionally substituted alkyl, optionally substituted alkoxy, optionally substituted aryl, optionally substituted aryloxy, optionally substituted alkylaryl, optionally substituted aryl-alkyl, optionally substituted silyl, or optionally substituted silyloxy. In particular embodiments, $R^1$ and $R^2$ can be taken together, with the nitrogen atom to which each is attached, to form an optionally substituted heterocyclyl.

By "aminoalkyl" is meant an alkyl group, as defined herein, substituted by an amino group, as defined herein. In some embodiments, the aminoalkyl group is -L-$NR^1R^2$, in which L is an alkyl group, as defined herein, and each of $R^1$ and $R^2$ is, independently, selected from hydrogen, aliphatic, heteroaliphatic, or aromatic, as defined herein, or any combination thereof; or $R^1$ and $R^2$, taken together with the nitrogen atom to which each are attached, can form a heterocyclyl group, as defined herein. In other embodiments, the aminoalkyl group is -L-C($NR^1$($R^2$)($R^3$)—$R^4$, in which L is a covalent bond or an alkyl group, as defined herein; each of $R^1$ and $R^2$ is, independently, selected from hydrogen, aliphatic, heteroaliphatic, or aromatic, as defined herein, or any combination thereof; or $R^1$ and $R^2$, taken together with the nitrogen atom to which each are attached, can form a heterocyclyl group, as defined herein; and each of $R^3$ and $R^4$ is, independently, H or alkyl, as defined herein.

By "aminooxy" is meant an oxy group, as defined herein, substituted by an amino group, as defined herein. In some embodiments, the aminooxy group is —O—$NR^1R^2$, in which each of $R^1$ and $R^2$ is, independently, selected from hydrogen, optionally substituted aliphatic, optionally substituted heteroaliphatic, optionally substituted aromatic, optionally substituted heteroaromatic, optionally substituted silyl, or optionally substituted silyloxy, as defined herein, or any combination thereof; or $R^1$ and $R^2$, taken together with the nitrogen atom to which each are attached, can form a heterocyclyl group, as defined herein. In particular embodiments, each of $R^1$ and $R^2$ is, independently, H, optionally substituted alkyl, optionally substituted alkoxy, optionally substituted aryl, optionally substituted aryloxy, optionally substituted alkyl-aryl, optionally substituted aryl-alkyl, optionally substituted silyl, or optionally substituted silyloxy.

By "aromatic" is meant a cyclic, conjugated group or moiety of, unless specified otherwise, from 5 to 15 ring atoms having a single ring (e.g., phenyl) or multiple condensed rings in which at least one ring is aromatic (e.g., naphthyl, indolyl, or pyrazolopyridinyl); that is, at least one ring, and optionally multiple condensed rings, have a continuous, delocalized π-electron system. Typically, the number of out of plane π-electrons corresponds to the Huckel rule (4n+2). The point of attachment to the parent structure typically is through an aromatic portion of the condensed ring system. An aromatic group is unsubstituted or substituted, e.g., by a functional group described herein. For example, the aromatic group can be substituted with one or more substitution groups, as described herein for alkyl and/or aryl.

By "aromatic-carbonyl" is meant an aromatic group that is or can be coupled to a compound disclosed herein, wherein the aromatic group is or becomes coupled through a carbonyl group (—C(O)—). In some embodiments, the aromatic-carbonyl group is —C(O)—R, in which R is an optionally substituted aromatic group, as defined herein.

By "aromatic-carbonyloxy" is meant an aromatic group that is or can be coupled to a compound disclosed herein, wherein the aromatic group is or becomes coupled through a carbonyloxy group (—OC(O)—). In some embodiments, the aromatic-carbonyloxy group is —OC(O)—R, in which R is an optionally substituted aromatic group, as defined herein.

By "aromatic-oxy" is meant an aromatic group that is or can be coupled to a compound disclosed herein, wherein the aromatic group is or becomes coupled through an oxy group (—O—). In some embodiments, the aromatic-oxy group is —O—R, in which R is an optionally substituted aromatic group, as defined herein.

By "aromatic-oxycarbonyl" is meant an aromatic group that is or can be coupled to a compound disclosed herein, wherein the aromatic group is or becomes coupled through an oxycarbonyl group (—C(O)O—). In some embodiments, the aromatic-carbonyl group is —C(O)O—R, in which R is an optionally substituted aromatic group, as defined herein.

By "aryl" is meant an aromatic carbocyclic group comprising at least five carbon atoms to 15 carbon atoms ($C_{5-15}$), such as five to ten carbon atoms ($C_{5-10}$), having a single ring or multiple condensed rings, which condensed rings can or may not be aromatic provided that the point of attachment to a remaining position of the compounds disclosed herein is through an atom of the aromatic carbocyclic group. Aryl groups may be substituted with one or more groups other than hydrogen, such as aliphatic, heteroaliphatic, aromatic, other functional groups, or any combination thereof. Exemplary aryl groups include, but are not limited to, benzyl, naphthalene, phenyl, biphenyl, phenoxybenzene, and the like. The term aryl also includes heteroaryl, which is defined as a group that contains an aromatic group that has at least one heteroatom incorporated within the ring of the aromatic group. Examples of heteroatoms include, but are not limited to, nitrogen, oxygen, sulfur, and phosphorus. Likewise, the term non-heteroaryl, which is also included in the term aryl, defines a group that contains an aromatic group that does not contain a heteroatom. The aryl group can be substituted or unsubstituted. The aryl group can be substituted with one, two, three, four, or five substituents independently selected from the group consisting of: (1) $C_{1-6}$ alkanoyl (e.g., —C(O)—R, in which R is $C_{1-6}$ alkyl); (2) $C_{1-6}$ alkyl; (3) $C_{1-6}$ alkoxy (e.g., —O—R, in which R is $C_{1-6}$ alkyl); (4) $C_{1-6}$ alkoxy-$C_{1-6}$ alkyl (e.g., -L-O—R, in which each of L and R is, independently, $C_{1-6}$ alkyl); (5) $C_{1-6}$ alkylsulfinyl (e.g., —S(O)—R, in which R is $C_{1-6}$ alkyl); (6) $C_{1-6}$ alkylsulfinyl-$C_{1-6}$ alkyl (e.g., -L-S(O)—R, in which each of L and R is, independently, $C_{1-6}$ alkyl); (7) $C_{1-6}$ alkylsulfonyl (e.g., —$SO_2$—R, in which R is $C_{1-6}$ alkyl); (8) $C_{1-6}$ alkylsulfonyl-$C_{1-6}$ alkyl (e.g., -L-$SO_2$—R, in which each of L and R is, independently, $C_{1-6}$ alkyl); (9) aryl; (10) amino (e.g., —$NR^1R^2$, where each of $R^1$ and $R^2$ is, independently, selected from hydrogen, aliphatic, heteroaliphatic, haloaliphatic, haloheteroaliphatic, aromatic, as defined herein, or any combination thereof; or $R^1$ and $R^2$, taken together with the nitrogen atom to which each are attached, can form a heterocyclyl group, as defined herein); (11) $C_{1-6}$ aminoalkyl (e.g., -$L^1$-$NR^1R^2$ or -$L^2$-C($NR^1R^2$)($R^3$)—$R^4$, in which $L^1$ is $C_{1-6}$ alkyl; $L^2$ is a covalent bond or $C_{1-6}$ alkyl; each of $R^1$ and $R^2$ is, independently, selected from hydrogen, aliphatic, heteroaliphatic, haloaliphatic, haloheteroaliphatic, aromatic, as defined herein, or any combination thereof; or $R^1$ and $R^2$, taken together with the nitrogen atom to which each are attached, can form a heterocyclyl group, as defined herein; and each of $R^3$ and $R^4$ is, independently, H or $C_{1-6}$ alkyl); (12) heteroaryl; (13) $C_{4-18}$ aryl-$C_{1-6}$ alkyl (e.g., -L-R, in which L is $C_{1-6}$ alkyl and R is $C_{4-8}$ aryl); (14) aryloyl (e.g., —C(O)—R, in which R is aryl); (15) azido (e.g., —$N_3$); (16) cyano (e.g., —CN); (17) $C_{1-6}$ azidoalkyl (e.g., -L-$N_3$, in which L is $C_{1-6}$ alkyl); (18) aldehyde (e.g., —C(O)H); (19) aldehyde-$C_{1-6}$ alkyl (e.g., -L-C(O)H, in which L is $C_{1-6}$ alkyl); (20) $C_{3-8}$ cycloalkyl; (21) $C_{3-8}$ cycloalkyl-$C_{1-6}$ alkyl (e.g., -L-R, in which L is $C_{1-6}$ alkyl and R is $C_{3-8}$ cycloalkyl); (22) halo; (23) $C_{1-6}$ haloalkyl (e.g., -$L^1$-X or -$L^2$-C(X)($R^1$)—$R^2$, in which $L^1$ is $C_{1-6}$ alkyl; $L^2$ is a covalent bond or $C_{1-6}$ alkyl; X is fluoro, bromo, chloro, or iodo; and each of $R^1$ and $R^2$ is, independently, H or $C_{1-6}$ alkyl); (24) heterocyclyl (e.g., as defined herein, such as a 5-, 6- or 7-membered ring containing one, two, three, or four non-carbon heteroatoms); (25) heterocyclyloxy (e.g., —O—R, in which R is heterocyclyl, as defined herein); (26) heterocyclyloyl (e.g., —C(O)—R, in which R is heterocyclyl, as defined herein); (27) hydroxyl (—OH); (28) $C_{1-6}$ hydroxyalkyl (e.g., -$L^1$-OH or -$L^2$-C(OH)($R^1$)—$R^2$, in which $L^1$ is $C_{1-6}$ alkyl; $L^2$ is a covalent bond or alkyl; and each of $R^1$ and $R^2$ is, independently, H or $C_{1-6}$ alkyl, as defined herein); (29) nitro; (30) $C_{1-6}$ nitroalkyl (e.g., -$L^1$-NO or -$L^2$-C(NO)($R^1$)—$R^2$, in which $L^1$ is $C_{1-6}$ alkyl; $L^2$ is a covalent bond or alkyl; and each of $R^1$ and $R^2$ is, independently, H or $C_{1-6}$ alkyl, as defined herein); (31) N-protected amino; (32) N-protected amino-$C_{1-6}$ alkyl; (33) oxo (e.g., =O); (34) $C_{1-6}$ thioalkyl (e.g., —S—R, in which R is $C_{1-6}$ alkyl); (35) thio-$C_{1-6}$ alkoxy-$C_{1-6}$ alkyl (e.g., -L-S—R, in which each of L and R is, independently, $C_{1-6}$ alkyl); (36) —$(CH_2)_rCO_2R^1$, where r is an integer of from zero to four, and $R^1$ is selected from the group consisting of (a) hydrogen, (b) $C_{1-6}$ alkyl, (c) $C_{4-18}$ aryl, and (d) $C_{4-18}$ aryl-$C_{1-6}$ alkyl (e.g., -L-R, in which L is $C_{1-6}$ alkyl and R is $C_{4-18}$ aryl); (37) —$(CH_2)_rCONR^1R^2$, where r is an integer of from zero to four and where each $R^1$ and $R^2$ is independently selected from the group consisting of (a) hydrogen, (b) $C_{1-6}$ alkyl, (c) $C_{4-18}$ aryl, and (d) $C_{4-18}$ aryl-$C_{1-6}$ alkyl (e.g., -L-R, in which L is $C_{1-6}$ alkyl and R is $C_{4-18}$ aryl); (38) —$(CH_2)_rSO_2R^1$, where r is an integer of from zero to four and where $R^1$ is selected from the group consisting of (a) $C_{1-6}$ alkyl, (b) $C_{4-18}$ aryl, and (c) $C_{4-18}$ aryl-$C_{1-6}$ alkyl (e.g., -L-R, in which L is $C_{1-6}$ alkyl and R is $C_{4-18}$ aryl); (39) —$(CH_2)_rSO_2NR^1R^2$, where r is an integer of from zero to four and where each of $R^1$ and $R^2$ is, independently, selected from the group consisting of (a) hydrogen, (b) $C_{1-6}$ alkyl, (c) $C_{4-18}$ aryl, and (d) $C_{4-18}$ aryl-$C_{1-6}$ alkyl (e.g., -L-R, in which L is $C_{1-6}$ alkyl and R is $C_{4-18}$ aryl); (40) —$(CH_2)_rNR^1R^2$, where r is an integer of from zero to four and where each of $R^1$ and $R^2$ is, independently, selected from the group consisting of (a) hydrogen, (b) an N-protecting group, (c) $C_{1-6}$ alkyl, (d) $C_{2-6}$ alkenyl, (e) $C_{2-6}$ alkynyl, (f) $C_{4-18}$ aryl, (g) $C_{4-18}$ aryl-$C_{1-6}$ alkyl (e.g., -L-R, in which L is $C_{1-6}$ alkyl and R is $C_{4-18}$ aryl), (h) $C_{3-8}$ cycloalkyl, and (i) $C_{3-8}$ cycloalkyl-$C_{1-6}$ alkyl (e.g., -L-R, in which L is $C_{1-6}$ alkyl and R is $C_{3-8}$ cycloalkyl), wherein in one embodiment no two groups are bound to the nitrogen atom through a carbonyl group or a sulfonyl group; (41) thiol (e.g., —SH); (42) perfluoroalkyl (e.g., —$(CF_2)_nCF_3$, in which n is an integer from 0 to 10); (43) perfluoroalkoxy (e.g., —O—$(CF_2)_nCF_3$, in which n is an integer from 0 to 10); (44) aryloxy (e.g., —O—R, in which R is aryl); (45) cycloalkoxy (e.g., —O—R, in which R is cycloalkyl); (46) cycloalkylalkoxy (e.g., —O-L-R, in which L is alkyl and R is cycloalkyl); and (47) arylalkoxy (e.g., —O-L-R, in which L is alkyl and R is aryl). In particular embodiments, an unsubstituted aryl group is a $C_{4-18}$, $C_{4-14}$, $C_{4-12}$, $C_{4-10}$, $C_{6-18}$, $C_{6-14}$, $C_{6-12}$, or $C_{6-10}$ aryl group.

By "aryl-alkyl," "aryl-alkenyl," and "aryl-alkynyl" is meant an aryl group, as defined herein, that is or can be coupled (or attached) to the parent molecular group through an alkyl, alkenyl, or alkynyl group, respectively, as defined herein. The aryl-alkyl, aryl-alkenyl, and/or aryl-alkynyl group can be substituted or unsubstituted. For example, the aryl-alkyl, aryl-alkenyl, and/or aryl-alkynyl group can be substituted with one or more substitution groups, as described herein for aryl and/or alkyl. Exemplary unsubstituted aryl-alkyl groups are of from 7 to 16 carbons ($C_{7-16}$ aryl-alkyl), as well as those having an aryl group with 4 to 18 carbons and an alkyl group with 1 to 6 carbons (i.e., $C_{4-18}$ aryl-$C_{1-6}$ alkyl). Exemplary unsubstituted aryl-alkenyl groups are of from 7 to 16 carbons ($C_{7-16}$ aryl-alkenyl), as well as those having an aryl group with 4 to 18 carbons and an alkenyl group with 2 to 6 carbons (i.e., $C_{4-18}$ aryl-$C_{2-6}$ alkenyl). Exemplary unsubstituted aryl-alkynyl groups are of from 7 to 16 carbons ($C_{7-16}$ aryl-alkynyl), as well as those having an aryl group with 4 to 18 carbons and an alkynyl group with 2 to 6 carbons (i.e., $C_{4-18}$ aryl-$C_{2-6}$ alkynyl). In some embodiments, the aryl-alkyl group is -L-R, in which L is an alkyl group or an alkylene group, as defined herein, and R is an aryl group, as defined herein. In some embodiments, the aryl-alkenyl group is -L-R, in which L is an alkenyl group or an alkenylene group, as defined herein, and R is an aryl group, as defined herein. In some embodiments, the aryl-alkynyl group is -L-R, in which L is an alkynyl group or an alkynylene group, as defined herein, and R is an aryl group, as defined herein.

By "arylene" is meant a multivalent (e.g., bivalent) form of an aryl group, as described herein. Exemplary arylene groups include phenylene, naphthylene, biphenylene, triphenylene, diphenyl ether, acenaphthenylene, anthrylene, or phenanthrylene. In some embodiments, the arylene group is a $C_{4-18}$, $C_{4-14}$, $C_{4-12}$, $C_{4-10}$, $C_{6-18}$, $C_{6-14}$, $C_{6-12}$, or $C_{6-10}$ arylene group. The arylene group can be branched or unbranched. The arylene group can also be substituted or unsubstituted. For example, the arylene group can be substituted with one or more substitution groups, as described herein for aryl.

By "arylalkoxy" is meant an aryl-alkyl group, as defined herein, attached to the parent molecular group through an oxygen atom. In some embodiments, the arylalkoxy group is —O-L-R, in which L is an alkyl group, as defined herein, and R is an aryl group, as defined herein.

By "aryloxy" is meant —OR, where R is an optionally substituted aryl group, as described herein. In some embodiments, an unsubstituted aryloxy group is a $C_{4-18}$ or $C_{6-18}$ aryloxy group. In other embodiments, R is an aryl group that is optionally substituted with alkyl, alkanoyl, amino, hydroxyl, and the like.

By "aryloxycarbonyl" is meant an aryloxy group, as defined herein, that is attached to the parent molecular group through a carbonyl group. In some embodiments, an unsubstituted aryloxycarbonyl group is a $C_{5-19}$ aryloxycarbonyl group. In other embodiments, the aryloxycarbonyl group is —C(O)O—R, in which R is an aryl group, as defined herein.

By "aryloyl" is meant an aryl group that is attached to the parent molecular group through a carbonyl group. In some embodiments, an unsubstituted aryloyl group is a $C_{7-11}$ aryloyl or $C_{5-19}$ aryloyl group. In other embodiments, the aryloyl group is —C(O)—R, in which R is an aryl group, as defined herein.

By "aryloyloxy" is meant an aryloyl group, as defined herein, that is attached to the parent molecular group through an oxy group. In some embodiments, an unsubstituted aryloyloxy group is a $C_{5-19}$ aryloyloxy group. In other embodiments, the aryloyloxy group is —OC(O)—R, in which R is an aryl group, as defined herein.

By "azido" is meant an —$N_3$ group.

By "azidoalkyl" is meant an azido group attached to the parent molecular group through an alkyl group, as defined herein. In some embodiments, the azidoalkyl group is -L-$N_3$, in which L is an alkyl group, as defined herein.

By "azo" is meant an —N=N— group.

By "carbamoyl" is meant an amino group attached to the parent molecular group through a carbonyl group, as defined herein. In some embodiments, the carbamoyl is —C(O)$NR^1R^2$ group, where each of $R^1$ and $R^2$ is, independently, selected from hydrogen, optionally substituted aliphatic, optionally substituted heteroaliphatic, optionally substituted aromatic, optionally substituted heteroaromatic, optionally substituted silyl, or optionally substituted silyloxy, as defined herein, or any combination thereof; or where $R^1$ and $R^2$, taken together with the nitrogen atom to which each are attached, can form a heterocyclyl group, as defined herein.

By "carbamoyloxy" is meant a carbamoyl group, as defined herein, attached to the parent molecular group through n oxy group, as defined herein. In some embodiments, the carbamoyl is —OC(O)$NR^1R^2$ group, where each of $R^1$ and $R^2$ is, independently, selected from hydrogen, optionally substituted aliphatic, optionally substituted heteroaliphatic, optionally substituted aromatic, optionally substituted heteroaromatic, optionally substituted silyl, or optionally substituted silyloxy, as defined herein, or any combination thereof; or where $R^1$ and $R^2$, taken together with the nitrogen atom to which each are attached, can form a heterocyclyl group, as defined herein.

By "carbonimidoyl" is meant a —C(NR)— group. In some embodiments, R is selected from hydrogen, optionally substituted aliphatic, optionally substituted heteroaliphatic, optionally substituted aromatic, optionally substituted heteroaromatic, optionally substituted silyl, optionally substituted alkyl, optionally substituted aryl, optionally substituted alkyl-aryl, or optionally substituted aryl-alkyl, optionally substituted silyloxy, as defined herein, or any combination thereof.

By "carbonyl" is meant a —C(O)— group, which can also be represented as >C═O.

By "carboxyl" is meant a —$CO_2H$ group or an anion thereof.

By "catalyst" is meant a compound, usually present in small amounts relative to reactants, capable of catalyzing a synthetic reaction, as would be readily understood by a person of ordinary skill in the art. In some embodiments, catalysts may include transition metal coordination complex.

By "cyanato" is meant a —OCN group.

By "cyano" is meant a —CN group.

By "cycloaliphatic" is meant an aliphatic group, as defined herein, that is cyclic.

By "cycloalkoxy" is meant a cycloalkyl group, as defined herein, attached to the parent molecular group through an oxygen atom. In some embodiments, the cycloalkoxy group is —O—R, in which R is a cycloalkyl group, as defined herein.

By "cycloalkylalkoxy" is meant a —O-L-R group, in which L is an alkyl group or an alkylene group, as defined herein, and R is a cycloalkyl group, as defined herein.

By "cycloalkyl" is meant a monovalent saturated or unsaturated non-aromatic cyclic hydrocarbon group of from three to eight carbons, unless otherwise specified, and is exemplified by cyclopropyl, cyclobutyl, cyclopentyl, cyclohexyl, cycloheptyl, bicyclo[2.2.1.heptyl], and the like. The cycloalkyl group can also be substituted or unsubstituted. For example, the cycloalkyl group can be substituted with one or more groups including those described herein for alkyl. Further, cycloalkyl may include one or more double bonds and/or triple bonds.

By "cycloheteroaliphatic" is meant a heteroaliphatic group, as defined herein, that is cyclic.

By "disilanyl" is meant a group containing an Si—Si bond. In some embodiments, the disilanyl group is a —$SiR^{S1}R^{S2}$—$SiR^{S3}R^{S4}R^{S5}$ or —$SiR^{S1}R^{S2}$—$SiR^{S3}R^{S4}$— group, in which each of $R^{S1}$, $R^{S2}$, $R^{S3}$, $R^{S4}$, and $R^{S5}$ is, independently, H, optionally substituted aliphatic, optionally substituted heteroaliphatic, optionally substituted aromatic, optionally substituted heteroaromatic, or optionally substituted amino.

By "disulfide" is meant —SSR, where R is selected from hydrogen, aliphatic, heteroaliphatic, haloaliphatic, haloheteroaliphatic, aromatic, as defined herein, or any combination thereof.

By "electron-donating group" is meant a functional group capable of donating at least a portion of its electron density into the ring to which it is directly attached, such as by resonance.

By "electron-withdrawing group" is meant a functional group capable of accepting electron density from the ring to which it is directly attached, such as by inductive electron withdrawal.

By "halo" is meant F, Cl, Br, or I.

By "haloaliphatic" is meant an aliphatic group, as defined herein, in which one or more hydrogen atoms, such as one to 10 hydrogen atoms, independently is replaced with a halogen atom, such as fluoro, bromo, chloro, or iodo.

By "haloalkyl" is meant an alkyl group, as defined herein, where one or more hydrogen atoms, such as one to 10 hydrogen atoms, independently is replaced with a halogen atom, such as fluoro, bromo, chloro, or iodo. In an independent embodiment, haloalkyl can be a —$CX_3$ group, wherein each X independently can be selected from fluoro, bromo, chloro, or iodo. In some embodiments, the haloalkyl group is -L-X, in which L is an alkyl group, as defined herein, and X is fluoro, bromo, chloro, or iodo. In other embodiments, the haloalkyl group is -L-C(X)($R^1$)—$R^2$, in which L is a covalent bond or an alkyl group, as defined herein; X is fluoro, bromo, chloro, or iodo; and each of $R^1$ and $R^2$ is, independently, H or alkyl, as defined herein.

By "haloheteroaliphatic" is meant a heteroaliphatic, as defined herein, in which one or more hydrogen atoms, such as one to 10 hydrogen atoms, independently is replaced with a halogen atom, such as fluoro, bromo, chloro, or iodo.

By "heteroaliphatic" is meant an aliphatic group, as defined herein, including at least one heteroatom to 20 heteroatoms, such as one to 15 heteroatoms, or one to 5 heteroatoms, which can be selected from, but not limited to oxygen, nitrogen, sulfur, silicon, boron, selenium, phosphorous, and oxidized forms thereof within the group. A heteroaliphatic group is unsubstituted or substituted, e.g., by a functional group described herein. For example, the heteroaliphatic group can be substituted with one or more substitution groups, as described herein for alkyl.

By "heteroaliphatic-carbonyl" is meant a heteroaliphatic group that is or can be coupled to a compound disclosed herein, wherein the heteroaliphatic group is or becomes coupled through a carbonyl group (—C(O)—). In some embodiments, the heteroaliphatic-carbonyl group is —C(O)—R, in which R is an optionally substituted heteroaliphatic group, as defined herein.

By "heteroaliphatic-carbonyloxy" is meant a heteroaliphatic group that is or can be coupled to a compound disclosed herein, wherein the heteroaliphatic group is or becomes coupled through a carbonyloxy group (—OC(O)—). In some embodiments, the heteroaliphatic-carbonyloxy group is —OC(O)—R, in which R is an optionally substituted heteroaliphatic group, as defined herein.

By "heteroaliphatic-oxy" is meant a heteroaliphatic group that is or can be coupled to a compound disclosed herein, wherein the heteroaliphatic group is or becomes coupled through an oxy group ((O)—). In some embodiments, the heteroaliphatic-oxy group is —O—R, in which R is an optionally substituted heteroaliphatic group, as defined herein.

By "heteroaliphatic-oxycarbonyl" is meant a heteroaliphatic group that is or can be coupled to a compound disclosed herein, wherein the heteroaliphatic group is or becomes coupled through an oxycarbonyl group (—C(O)O—). In some embodiments, the heteroaliphatic-oxycarbonyl group is —C(O)O—R, in which R is an optionally substituted heteroaliphatic group, as defined herein.

By "heteroalkyl," "heteroalkenyl," and "heteroalkynyl" is meant an alkyl, alkenyl, or alkynyl group (which can be branched, straight-chain, or cyclic), respectively, as defined herein, including at least one heteroatom to 20 heteroatoms, such as one to 15 heteroatoms, or one to 5 heteroatoms, which can be selected from, but not limited to, oxygen, nitrogen, sulfur, silicon, boron, selenium, phosphorous, and oxidized forms thereof within the group.

By "heteroalkylene," "heteroalkenylene," and "heteroalkynylene" is meant a multivalent (e.g., bivalent) form of a heteroalkyl, heteroalkenyl, or heteroalkynyl group, respectively, as described herein.

By "heteroaromatic" is meant an aromatic group, as defined herein, including at least one heteroatom to 20 heteroatoms, such as one to 15 heteroatoms, or one to 5 heteroatoms, which can be selected from, but not limited to oxygen, nitrogen, sulfur, silicon, boron, selenium, phosphorous, and oxidized forms thereof within the group. A heteroaromatic group is unsubstituted or substituted, e.g., by a functional group described herein. For example, the heteroaromatic group can be substituted with one or more substitution groups, as described herein for alkyl and/or aryl.

By "heteroaromatic-carbonyl" is meant a heteroaromatic group that is or can be coupled to a compound disclosed herein, wherein the heteroaromatic group is or becomes coupled through a carbonyl group (—C(O)—). In some embodiments, the heteroaromatic-carbonyl group is —C(O)—R, in which R is an optionally substituted heteroaromatic group, as defined herein.

By "heteroaromatic-carbonyloxy" is meant a heteroaromatic group that is or can be coupled to a compound disclosed herein, wherein the heteroaromatic group is or becomes coupled through a carbonyloxy group (—OC(O)—). In some embodiments, the heteroaromatic-carbonyloxy group is —OC(O)—R, in which R is an optionally substituted heteroaromatic group, as defined herein.

By "heteroaromatic-oxy" is meant a heteroaromatic group that is or can be coupled to a compound disclosed herein, wherein the heteroaromatic group is or becomes coupled through an oxy group (—O—). In some embodiments, the heteroaromatic-oxy group is —O—R, in which R is an optionally substituted heteroaromatic group, as defined herein.

By "heteroaromatic-oxycarbonyl" is meant a heteroaromatic group that is or can be coupled to a compound disclosed herein, wherein the heteroaromatic group is or becomes coupled through an oxycarbonyl group (—C(O)O—). In some embodiments, the heteroaromatic-carbonyl group is —C(O)O—R, in which R is an optionally substituted heteroaromatic group, as defined herein.

By "heteroaryl" is meant an aryl group including at least one heteroatom to six heteroatoms, such as one to four heteroatoms, which can be selected from, but not limited to, oxygen, nitrogen, sulfur, silicon, boron, selenium, phosphorous, and oxidized forms thereof within the ring. Such heteroaryl groups can have a single ring or multiple condensed rings, where the condensed rings may or may not be aromatic and/or contain a heteroatom, provided that the point of attachment is through an atom of the aromatic heteroaryl group. Heteroaryl groups may be substituted with one or more groups other than hydrogen, such as aliphatic, heteroaliphatic, aromatic, other functional groups, or any combination thereof. An exemplary heteroaryl includes a subset of heterocyclyl groups, as defined herein, which are aromatic, i.e., they contain 4n+2 pi electrons within the mono- or multicyclic ring system.

By "heteroarylene" is meant a multivalent (e.g., bivalent) form of a heteroaryl group, as described herein.

By "heteroatom" is meant an atom other than carbon, such as oxygen, nitrogen, sulfur, silicon, boron, selenium, or phosphorous. In particular disclosed embodiments, such as when valency constraints do not permit, a heteroatom does not include a halogen atom.

By "heterocyclyl" is meant a 5-, 6- or 7-membered ring, unless otherwise specified, containing one, two, three, or four non-carbon heteroatoms (e.g., independently selected from the group consisting of nitrogen, oxygen, phosphorous, sulfur, or halo). The 5-membered ring has zero to two double bonds and the 6- and 7-membered rings have zero to three double bonds. The term "heterocyclyl" also includes bicyclic, tricyclic and tetracyclic groups in which any of the above heterocyclic rings is fused to one, two, or three rings independently selected from the group consisting of an aryl ring, a cyclohexane ring, a cyclohexene ring, a cyclopentane ring, a cyclopentene ring, and another monocyclic heterocyclic ring, such as indolyl, quinolyl, isoquinolyl, tetrahydroquinolyl, benzofuryl, benzothienyl and the like. Heterocyclics include thiiranyl, thietanyl, tetrahydrothienyl, thianyl, thiepanyl, aziridinyl, azetidinyl, pyrrolidinyl, piperidinyl, azepanyl, pyrrolyl, pyrrolinyl, pyrazolyl, pyrazolinyl, pyrazolidinyl, imidazolyl, imidazolinyl, imidazolidinyl, pyridyl, homopiperidinyl, pyrazinyl, piperazinyl, pyrimidinyl, pyridazinyl, oxazolyl, oxazolidinyl, oxazolidonyl, isoxazolyl, isoxazolidinyl, morpholinyl, thiomorpholinyl, thiazolyl, thiazolidinyl, isothiazolyl, isothiazolidinyl, indolyl, quinolinyl, isoquinolinyl, benzimidazolyl, benzothiazolyl, benzoxazolyl, furyl, thienyl, thiazolidinyl, isothiazolyl, isoindazolyl, triazolyl, tetrazolyl, oxadiazolyl, uricyl, thiadiazolyl, pyrimidyl, tetrahydrofuranyl, dihydrofuranyl, dihydrothienyl, dihydroindolyl, tetrahydroquinolyl, tetrahydroisoquinolyl, pyranyl, dihydropyranyl, tetrahydropyranyl, dithiazolyl, dioxanyl, dioxinyl, dithianyl, trithianyl, oxazinyl, thiazinyl, oxothiolanyl, triazinyl, benzofuranyl, benzothienyl, and the like.

By "heterocyclyloxy" is meant a heterocyclyl group, as defined herein, attached to the parent molecular group through an oxygen atom. In some embodiments, the heterocyclyloxy group is —O—R, in which R is a heterocyclyl group, as defined herein.

By "heterocyclyloyl" is meant a heterocyclyl group, as defined herein, attached to the parent molecular group through a carbonyl group. In some embodiments, the heterocyclyloyl group is —C(O)—R, in which R is a heterocyclyl group, as defined herein.

By "hydrazino" is meant —$NR^1$—$NR^2R^3$, where each of $R^1$, $R^2$, and $R^3$ is, independently, selected from hydrogen, optionally substituted aliphatic, optionally substituted heteroaliphatic, optionally substituted aromatic, optionally substituted heteroaromatic, optionally substituted silyl, or optionally substituted silyloxy, as defined herein, or any combination thereof; or where a combination of $R^1$ and $R^2$ or a combination of $R^2$ and $R^3$, taken together with the nitrogen atom to which each are attached, can form a heterocyclyl group, as defined herein. In some embodiments, each of $R^1$, $R^2$, or $R^3$ is, independently, H, optionally substituted alkyl, optionally substituted aryl, optionally substituted alkyl-aryl, or optionally substituted aryl-alkyl. In particular embodiments, $R^2$ and $R^3$ can be taken together, with the nitrogen atom to which each is attached, to form an optionally substituted heterocyclyl.

By "hydroxyl" is meant —OH.

By "hydroxyalkyl" is meant an alkyl group, as defined herein, substituted by one to three hydroxyl groups, with the proviso that no more than one hydroxyl group may be attached to a single carbon atom of the alkyl group and is exemplified by hydroxymethyl, dihydroxypropyl, and the like. In some embodiments, the hydroxyalkyl group is -L-OH, in which L is an alkyl group, as defined herein. In other embodiments, the hydroxyalkyl group is -L-C(OH)($R^1$)—$R^2$, in which L is a covalent bond or an alkyl group, as defined herein, and each of $R^1$ and $R^2$ is, independently, H or alkyl, as defined herein.

By "imidoyl" is meant a moiety including a carbonimidoyl group. In some embodiments, the imidoyl group is C($NR^1$)$R^2$, in which each of $R^1$ and $R^2$ is, independently, selected from hydrogen, optionally substituted aliphatic, optionally substituted heteroaliphatic, optionally substituted aromatic, optionally substituted heteroaromatic, optionally substituted silyl, optionally substituted alkyl, optionally substituted aryl, optionally substituted alkyl-aryl, or optionally substituted aryl-alkyl, optionally substituted silyloxy, as defined herein, or any combination thereof. In other embodiments, the imidoyl group is —C($NR^1$)H, —C($NR^1$)$R^{Ak}$, or —C($NR^{N1}$)$R^{Ar}$, in which $R^1$ is hydrogen, optionally substituted aliphatic, optionally substituted heteroaliphatic, optionally substituted aromatic, optionally substituted heteroaromatic, optionally substituted silyl, optionally substituted alkyl, optionally substituted aryl, optionally substituted alkyl-aryl, or optionally substituted aryl-alkyl, or optionally substituted silyloxy; $R^{Ak}$ is an optionally substituted alkyl or an optionally substituted aliphatic; and $R^{Ar}$ is an optionally substituted aryl or an optionally substituted aromatic.

By "imino" is meant a —NR— group. In some embodiments, R is selected from hydrogen, optionally substituted aliphatic, optionally substituted heteroaliphatic, optionally substituted aromatic, or optionally substituted heteroaromatic. In particular embodiments, R is H, optionally substituted alkyl, optionally substituted alkoxy, optionally substituted aryl, optionally substituted aryloxy, optionally substituted alkyl-aryl, or optionally substituted aryl-alkyl.

By "isocyanato" is meant a —NCO group.

By "isocyano" is meant a —NC group.

By "ketone" is meant —C(O)R or a compound including such a group, where R is selected from aliphatic, heteroaliphatic, aromatic, as defined herein, or any combination thereof. An example of a ketone can include $R^1$C(O)R, in which each of R and $R^1$ is, independently, selected from aliphatic, haloaliphatic, haloheteroaliphatic, heteroaliphatic, aromatic, aliphatic-aromatic, heteroaliphatic-aromatic, as defined herein, or any combination thereof.

By "nitro" is meant an —$NO_2$ group.

By "nitroalkyl" is meant an alkyl group, as defined herein, substituted by one to three nitro groups. In some embodiments, the nitroalkyl group is -L-NO, in which L is an alkyl group, as defined herein. In other embodiments, the nitroalkyl group is -L-C(NO)($R^1$)—$R^2$, in which L is a covalent bond or an alkyl group, as defined herein, and each of $R^1$ and $R^2$ is, independently, H or alkyl, as defined herein.

By "oxo" is meant an ═O group.

By "oxy" is meant —O—.

By "perfluoroalkyl" is meant an alkyl group, as defined herein, having each hydrogen atom substituted with a fluorine atom. Exemplary perfluoroalkyl groups include trifluoromethyl, pentafluoroethyl, etc. In some embodiments, the perfluoroalkyl group is —$(CF_2)_nCF_3$, in which n is an integer from 0 to 10.

By "perfluoroalkoxy" is meant an alkoxy group, as defined herein, having each hydrogen atom substituted with a fluorine atom. In some embodiments, the perfluoroalkoxy group is —O—R, in which R is a perfluoroalkyl group, as defined herein.

By "salt" is meant an ionic form of a compound or structure (e.g., any formulas, compounds, or compositions described herein), which includes a cation or anion compound to form an electrically neutral compound or structure. Salts are well known in the art. For example, non-toxic salts are described in Berge S. M. et al., "Pharmaceutical salts," *J. Pharm. Sci.* 1977 January; 66(1):1-19; and in "Handbook of Pharmaceutical Salts: Properties, Selection, and Use," Wiley-VCH, April 2011 (2nd rev. ed., eds. P. H. Stahl and C. G. Wermuth. The salts can be prepared in situ during the final isolation and purification of the compounds of the invention or separately by reacting the free base group with a suitable organic acid (thereby producing an anionic salt) or by reacting the acid group with a suitable metal or organic salt (thereby producing a cationic salt). Representative anionic salts include acetate, adipate, alginate, ascorbate, aspartate, benzenesulfonate, benzoate, bicarbonate, bisulfate, bitartrate, borate, bromide, butyrate, camphorate, camphorsulfonate, chloride, citrate, cyclopentanepropionate, digluconate, dihydrochloride, diphosphate, dodecylsulfate, edetate, ethanesulfonate, fumarate, glucoheptonate, gluconate, glutamate, glycerophosphate, hemisulfate, heptonate, hexanoate, hydrobromide, hydrochloride, hydroiodide, hydroxyethanesulfonate, hydroxynaphthoate, iodide, lactate, lactobionate, laurate, lauryl sulfate, malate, maleate, malonate, mandelate, mesylate, methanesulfonate, methylbromide, methylnitrate, methylsulfate, mucate, 2-naphthalenesulfonate, nicotinate, nitrate, oleate, oxalate, palmitate, pamoate, pectinate, persulfate, 3-phenylpropionate, phosphate, picrate, pivalate, polygalacturonate, propionate, salicylate, stearate, subacetate, succinate, sulfate, tannate, tartrate, theophyllinate, thiocyanate, triethiodide, toluenesulfonate, undecanoate, valerate salts, and the like. Representative cationic salts include metal salts, such as alkali or alkaline earth salts, e.g., barium, calcium (e.g., calcium edetate), lithium, magnesium, potassium, sodium, and the like; other metal salts, such as aluminum, bismuth, iron, and zinc; as well as nontoxic ammonium, quaternary ammonium, and amino cations, including, but not limited to ammonium, tetramethylammonium, tetraethylammonium, methylamine, dimethylamine, trimethylamine, triethylamine, ethylamine, pyridinium, and the like. Other cationic salts include organic salts, such as chloroprocaine, choline, dibenzylethylenediamine, diethanolamine, ethylenediamine, methylglucamine, and procaine. Yet other salts include ammonium, sulfonium, sulfoxonium, phosphonium, iminium, imidazolium, benzimidazolium, amidinium, guanidinium, phosphazinium, phosphazenium, pyridinium, etc., as well as other cationic groups described herein (e.g., optionally substituted isoxazolium, optionally substituted oxazolium, optionally substituted thiazolium, optionally substituted pyrrolium, optionally substituted furanium, optionally substituted thiophenium, optionally substituted imidazolium, optionally substituted pyrazolium, optionally substituted isothiazolium, optionally substituted triazolium, optionally substituted tetrazolium, optionally substituted furazanium, optionally substituted pyridinium, optionally substituted pyrimidinium, optionally substituted pyrazinium, optionally substituted triazinium, optionally substituted tetrazinium, optionally substituted pyridazinium, optionally substituted oxazinium, optionally substituted pyrrolidinium, optionally substituted pyrazolidinium, optionally substituted imidazolinium, optionally substituted isoxazolidinium, optionally substituted oxazolidinium, optionally substituted piperazinium, optionally substituted piperidinium, optionally substituted morpholinium, optionally substituted azepanium, optionally substituted azepinium, optionally substituted indolium, optionally substituted isoindolium, optionally substituted indolizinium, optionally substituted indazolium, optionally substituted benzimidazolium, optionally substituted isoquinolinum, optionally substituted quinolizinium, optionally substituted dehydroquinolizinium, optionally substituted quinolinium, optionally substituted isoindolinium, optionally substituted benzimidazolinium, and optionally substituted purinium).

By "silyl" is meant a —$SiR^1R^2R^3$ or —$SiR^1R^2$— group. In some embodiments, each of $R^1$, $R^2$, and $R^3$ is, independently, H, optionally substituted aliphatic, optionally substituted heteroaliphatic, optionally substituted aromatic, optionally substituted heteroaromatic, or optionally substituted amino. In particular embodiments, each of $R^1$, $R^2$, and $R^3$ is, independently, H, optionally substituted alkyl, optionally substituted alkoxy, optionally substituted aryl, optionally substituted aryloxy, optionally substituted alkyl-aryl, optionally substituted aryl-alkyl, or optionally substituted amino. In other embodiments, the silyl group is —$Si(R)_a(OR)_b(NR_2)_c$, in which each R is, independently, H, optionally substituted aliphatic, optionally substituted heteroaliphatic, optionally substituted aromatic, or optionally substituted heteroaromatic; each of a, b, and c≥0; and a+b+c=3. In particular embodiments, each R is, independently, H, optionally substituted alkyl, optionally substituted aryl, optionally substituted alkyl-aryl, or optionally substituted aryl-alkyl.

By "silyloxy" is meant —OR, where R is an optionally substituted silyl group, as described herein. In some embodiments, the silyloxy group is —O—$SiR^1R^2R^3$, in which each of $R^1$, $R^2$, and $R^3$ is, independently, H, optionally substituted aliphatic, optionally substituted heteroaliphatic, optionally substituted aromatic, optionally substituted heteroaromatic, or optionally substituted amino. In particular embodiments, each of $R^1$, $R^2$, and $R^3$ is, independently, H, optionally substituted alkyl, optionally substituted alkoxy, optionally substituted aryl, optionally substituted aryloxy, optionally substituted alkyl-aryl, optionally substituted aryl-alkyl, or optionally substituted amino. In other embodiments, the silyloxy group is —O—$Si(R)_a(OR)_b(NR_2)_c$, in which each R is, independently, H, optionally substituted aliphatic, optionally substituted heteroaliphatic, optionally substituted aromatic, or optionally substituted heteroaromatic; each of a, b, and c≥0; and a+b+c=3. In particular embodiments, each R is, independently, H, optionally substituted alkyl, optionally substituted aryl, optionally substituted alkyl-aryl, or optionally substituted aryl-alkyl By "sulfinyl" is meant an —S(O)— group.

By "sulfo" is meant an —$S(O)_2OH$ group.

By "sulfonyl" or "sulfonate" is meant an —$S(O)_2$— group or a —$SO_2R$, where R is selected from hydrogen, aliphatic, heteroaliphatic, haloaliphatic, haloheteroaliphatic, aromatic, as defined herein, or any combination thereof.

By "thioalkyl" is meant an alkyl group, as defined herein, attached to the parent molecular group through a sulfur atom. Exemplary unsubstituted thioalkyl groups include $C_{1-6}$ thioalkyl. In some embodiments, the thioalkyl group is —S—R, in which R is an alkyl group, as defined herein.

By "thiol" is meant an —SH group.

A person of ordinary skill in the art would recognize that the definitions provided above are not intended to include impermissible substitution patterns (e.g., methyl substituted with 5 different groups, and the like). Such impermissible substitution patterns are easily recognized by a person of ordinary skill in the art. Any functional group disclosed herein and/or defined above can be substituted or unsubstituted, unless otherwise indicated therein.

As used herein, the term "about" means+/−10% of any recited value. As used herein, this term modifies any recited value, range of values, or endpoints of one or more ranges.

As used herein, the terms "top," "bottom," "upper," "lower," "above," and "below" are used to provide a relative relationship between structures. The use of these terms does not indicate or require that a particular structure must be located at a particular location in the apparatus.

Other features and advantages of the invention will be apparent from the following description and the claims.

Precursors

Silanes

The film can be deposited using any useful silicon-containing precursor (Si-containing precursor). In some embodiments, the precursor includes a structure of formula (I):

$$Si(R')_4 \quad (I),$$

wherein at least one R' includes a carbon atom. In other embodiments, at least one R' includes a heteroatom (e.g., nitrogen, oxygen, and/or silicon). In yet other embodiments, at least one R' includes a carbon atom and a heteroatom (e.g., nitrogen, oxygen, and/or silicon). In particular embodiments, R' does not include a halogen atom.

In other embodiments, the precursor includes a structure of formula (II):

$$(R')_3Si\text{-}[L\text{-}Si(R')_2]\text{—}R' \quad (II),$$

wherein at least one R' includes a carbon atom and L is a linker. In some embodiments, at least one R' includes a heteroatom (e.g., nitrogen, oxygen, and/or silicon). In yet other embodiments, at least one R' includes a carbon atom and a heteroatom (e.g., nitrogen, oxygen, and/or silicon). In particular embodiments, R' does not include a halogen atom.

For formula (II), non-limiting linkers for L include a covalent bond, oxy (—O—), carbonyl (—C(O)—), optionally substituted carbonimidoyl (e.g., —C(NR)—), optionally substituted imino (e.g., —NR—), an optionally substituted alkylene, optionally substituted heteroalkylene, optionally substituted arylene, and the like.

For any formula herein (e.g., for formula (I) or (II)), R' can be H, aliphatic, heteroaliphatic, aromatic, heteroaromatic, amino, hydrazino, azido, hydroxyl, silyl (e.g., aminosilyl, alkoxysilyl, and the like), silyloxy (e.g., aminosilyloxy, alkoxysilyloxy, and the like), cyanato (—OCN), isocyanato (—NCO), cyano (—CN), or isocyano (—NC), in which any of these may be optionally substituted.

In particular embodiments, at least one, two, three, four, or more R' in any formula herein (e.g., for formula (I) or (II)) includes an optionally substituted aliphatic. Non-limiting aliphatic groups include alkyl, alkenyl, or alkynyl, including linear, branched, cyclic, saturated, or unsaturated forms thereof. Such groups can be unsubstituted or substituted, such as with one or more substituents described herein for alkyl. Further examples of aliphatic groups include methyl (Me), ethyl (Et), propyl (Pr), iso-propyl (iPr), cyclopropyl (cPr), butyl (Bu), sec-butyl (sBu), iso-butyl (iBu), tert-butyl (tBu), pentyl (Pe), tert-pentyl (tPe), allyl (All), vinyl (Vi), ethynyl, and the like.

In some embodiments, at least one, two, three, four, or more R' in any formula herein (e.g., for formula (I) or (II)) includes an optionally substituted heteroaliphatic. A heteroaliphatic group can include any including one or more carbon atoms and one or more heteroatoms (e.g., oxygen, nitrogen, and the like).

Non-limiting heteroaliphatic groups includes aliphatic-carbonyl (e.g., alkanoyl or —C(O)R), aliphatic-carbonyloxy (e.g., alkanoyloxy or —OC(O)$R^{Ak}$), aliphatic-oxy (e.g., alkoxy or —$OR^{Ak}$), aliphatic-oxycarbonyl (e.g., alkoxycarbonyl or —C(O)OR), amino (e.g., —$NR^{N1}R^{N2}$) aromatic-carbonyl (e.g., aryloyl or —C(O)$R^{Ar}$), aromatic-carbonyloxy (e.g., aryloyloxy or —OC(O)$R^{Ar}$), aromatic-oxy (e.g., aryloxy or —$OR^{Ar}$), aromatic-oxycarbonyl (e.g., aryloxycarbonyl or —C(O)$OR^{Ar}$), imidoyl (e.g., —C($NR^{N1}$)H, —C($NR^{N1}$)$R^{Ak}$, or —C($NR^{N1}$)$R^{Ar}$), carbamoyl (e.g., —C(O)$NR^{N1}R^{N2}$), carbamoyloxy (e.g., —OC(O)$NR^{N1}R^{N2}$), carboxyl (—$CO_2H$), formyl (—C(O)H), heteroaromatic, heterocyclyl (e.g., optionally substituted furanyl, tetrahydrofuranyl, pyrrolidinyl, pyrrolyl, imidazolyl, pyrazolyl, triazolyl, piperidinyl, pyridinyl, pyrimidinyl, pyridazinyl, pyrazinyl, oxazolyl, morpholinyl, and the like), hydrazino (e.g., —$NR^{N1}$—$NR^{N2}R^{N3}$), silyl (e.g., —$SiR^{S1}R^{S2}R^{S3}$), and silyloxy (e.g., —O—$SiR^{S1}R^{S2}R^{S3}$). Each of these groups can be optionally substituted with any substituent described herein (e.g., as described herein for alkyl). Heteroaliphatic groups can include linear, branched, cyclic (e.g., heterocyclyl), saturated, or unsaturated forms thereof.

Heteroaliphatic groups can include $R^{Ak}$ and/or $R^{Ar}$ moieties. In some embodiments, $R^{Ak}$ is optionally substituted aliphatic, optionally substituted heteroaliphatic, optionally substituted alkyl, optionally substituted alkenyl, optionally substituted alkynyl, optionally substituted cycloalkyl, optionally substituted heteroalkyl, optionally substituted heteroalkenyl, optionally substituted heteroalkynyl, or optionally substituted heterocyclyl. In other embodiments, $R^{Ar}$ is optionally substituted aromatic, optionally substituted heteroaromatic, optionally substituted aryl, or optionally substituted heteroaryl.

Nitrogen-containing groups (e.g., amino, imidoyl, etc.) can include $R^{N1}$, $R^{N2}$, and/or $R^{N3}$ moieties attached to a nitrogen atom. In some embodiments, each of $R^{N1}$, $R^{N2}$, and $R^{N3}$ is, independently, H, optionally substituted aliphatic, optionally substituted heteroaliphatic, optionally substituted aromatic, optionally substituted heteroaromatic, optionally substituted silyl, or optionally substituted silyloxy. In particular embodiments, $R^{N1}$ and $R^{N2}$ or $R^{N2}$ and $R^{N3}$ can be taken together, with the nitrogen atom to which each is attached, to form an optionally substituted heterocyclyl. Such nitrogen-containing groups can be included within other moieties, such as within silyl or silyloxy groups.

Silicon-containing groups (e.g., silyl, etc.) can include $R^{S1}$, $R^{S2}$, and/or $R^{S3}$ attached to a silicon atom. In some embodiments, each of $R^{S1}$, $R^{S2}$, and $R^{S3}$ is, independently, H, optionally substituted aliphatic, optionally substituted heteroaliphatic, optionally substituted aromatic, optionally substituted heteroaromatic, or optionally substituted amino. Such silicon-containing groups can be included within other moieties, such as within amino groups.

In some embodiments, the silyl group is an alkylsilyl group having one or more aliphatic groups attached to the silicon atom. In one instance, the alkylsilyl group is —Si$(R)_a(R^{Ak})_b$, in which R is, independently, H, aromatic, heteroaromatic, amino, hydrazino, azido, hydroxyl, silyl (e.g., aminosilyl, alkoxysilyl, and the like), silyloxy (e.g., aminosilyloxy, alkoxysilyloxy, and the like), cyanato, isocyanato, cyano, or isocyano, in which any of these may be optionally substituted; $R^{Ak}$ is optionally substituted aliphatic, optionally substituted heteroaliphatic, optionally substituted alkyl, optionally substituted alkenyl, optionally substituted alkynyl, optionally substituted cycloalkyl, optionally substituted heteroalkyl, optionally substituted heteroalkenyl, optionally substituted heteroalkynyl, or optionally substituted heterocyclyl; a≥0; b≥1; and a+b=3. Yet other non-limiting alkylsilyl groups include —$SiH_2R^{Ak}$, —SiH$[R^{Ak}]_2$, or —Si$[R^{Ak}]_3$, in which $R^{Ak}$ is any provided herein.

In some embodiments, the silyl group is an alkoxysilyl group having one or more aliphatic groups attached to the silicon atom by way of an oxy (—O—) group. In one instance, the alkoxysilyl group is —Si$(R)_a(OR^{Ak})_b$, in which R is, independently, H, aromatic, heteroaromatic, amino, hydrazino, azido, hydroxyl, silyl (e.g., aminosilyl, alkoxysilyl, and the like), silyloxy (e.g., aminosilyloxy, alkoxysilyloxy, and the like), cyanato, isocyanato, cyano, or isocyano, in which any of these may be optionally substituted; $R^{Ak}$ is optionally substituted aliphatic, optionally substituted heteroaliphatic, optionally substituted alkyl, optionally substituted alkenyl, optionally substituted alkynyl, optionally substituted cycloalkyl, optionally substituted heteroalkyl, optionally substituted heteroalkenyl, optionally substituted heteroalkynyl, or optionally substituted heterocyclyl; a≥0; b≥1; and a+b=3. Yet other non-limiting alkoxysilyl groups include —$SiH_2[OR^{Ak}]$, —SiH$[OR^{Ak}]_2$, or —Si$[OR^{Ak}]_3$, in which $R^{Ak}$ is any described herein.

In other embodiments, the silyl group is an arylsilyl group having one or more aromatic groups attached to the silicon atom. In one instance, the arylsilyl group is —Si$(R)_a(R^{Ar})_b$, in which R is, independently, H, aliphatic, heteroaliphatic, amino, hydrazino, azido, hydroxyl, silyl (e.g., aminosilyl, alkoxysilyl, and the like), silyloxy (e.g., aminosilyloxy, alkoxysilyloxy, and the like), cyanato, isocyanato, cyano, or isocyano, in which any of these may be optionally substituted; $R^{Ar}$ is optionally substituted aromatic, optionally substituted heteroaromatic, optionally substituted aryl, or optionally substituted heteroaryl; a≥0; b≥1; and a+b=3. Yet other non-limiting arylsilyl groups include —$SiH_2R^{Ar}$, —SiH$[R^{Ar}]_2$, or —Si$[R^{Ar}]_3$, in which $R^{Ar}$ is any described herein.

In yet other embodiments, the silyl group is an aryloxysilyl group having one or more aromatic groups attached to the silicon atom by way of an oxy (—O—) group. In one instance, the arylsilyl group is —Si$(R)_a(OR^{Ar})_b$, in which R is, independently, H, aliphatic, heteroaliphatic, amino, hydrazino, azido, hydroxyl, silyl (e.g., aminosilyl, alkoxysilyl, and the like), silyloxy (e.g., aminosilyloxy, alkoxysilyloxy, and the like), cyanato, isocyanato, cyano, or isocyano, in which any of these may be optionally substituted; $R^{Ar}$ is optionally substituted aromatic, optionally substituted heteroaromatic, optionally substituted aryl, or optionally substituted heteroaryl; a≥0; b≥1; and a+b=3. Yet other non-limiting aryloxysilyl groups include —$SiH_2[OR^{Ar}]$, —SiH$[OR^{Ar}]_2$, or —Si$[OR^{Ar}]_3$, in which $R^{Ar}$ is any described herein.

A silyl group can also include an aminosilyl having one or more optionally substituted amino groups attached to the silicon atom. In one instance, the aminosilyl group is —Si$(R)_a(NR^{N1}R^{N2})_b$, in which R is, independently, H, aliphatic, heteroaliphatic, aromatic, heteroaromatic, hydrazino, azido, hydroxyl, silyl (e.g., aminosilyl, alkoxysilyl, and the like), silyloxy (e.g., aminosilyloxy, alkoxysilyloxy, and the like), cyanato, isocyanato, cyano, or isocyano, in which any of these may be optionally substituted; each of $R^{N1}$ and $R^{N2}$ is, independently, H, optionally substituted aliphatic, optionally substituted heteroaliphatic, optionally substituted aromatic, optionally substituted heteroaromatic, optionally substituted silyl, or optionally substituted silyloxy, in which $R^{N1}$ and $R^{N2}$ can be taken together, with the nitrogen atom to which each is attached, to form an optionally substituted heterocyclyl; a≥0; b≥1; and a+b=3. Yet other non-limiting embodiments of aminosilyl groups include —$SiH_2[NR^{N1}R^{N2}]$—$SiH[R^{Ak}][NR^{N1}R^{N2}]$, —$Si[R^{Ak}]_2[NR^{N1}R^{N2}]$, —$SiH[NR^{N1}R^{N2}]_2$, —$Si[R^{Ak}][NR^{N1}R^{N2}]_2$, or —$Si[NR^{N1}R^{N2}]_3$), such as —$SiH_2[NH_2]$, —$SiHR^{Ak}[NH_2]$, —$Si[R^{Ak}]_2[NH_2]$, —$SiH_2[NH(R^{Ak})]$, —$SiHR^{Ak}[NH(R^{Ak})]$, —$Si[R^{Ak}]_2[NH(R^{Ak})]$, —$SiH_2[N(R^{Ak})_2]$, —$SiHR^{Ak}[N(R^{Ak})_2]$, —$Si[R^{Ak}]_2[N(R^{Ak})_2]$, —$SiH[NH_2]_2$, —$SiR^{Ak}[NH_2]_2$, —$SiH[NH(R^{Ak})]_2$, —$SiR^{Ak}[NH(R^{Ak})]_2$, —$SiH[NH(R^{Ak})][NH_2]$, —$SiR^{Ak}[NH(R^{Ak})][NH_2]$, —$SiH[N(R^{Ak})_2]_2$, —$SiR^{Ak}[N(R^{Ak})_2]_2$, —$SiH[N(R^{Ak})_2][NH_2]$, —$SiR^{Ak}[N(R^{Ak})_2][NH_2]$, —$Si[NH_2]_3$, —$Si[N(R^{Ak})_2][NH_2]_2$, —$Si[N(R^{Ak})_2]_2[NH_2]$, —$Si[N(R^{Ak})_2]_3$, —$Si[NH(R^{Ak})][NH_2]_2$, —$Si[NH(R^{Ak})_2]_2[NH_2]$, —$Si[NH(R^{Ak})]_3$, —$Si[NH(R^{Ak})][N(R^{Ak})_2]_2$, —$Si[NH(R^{Ak})]_2[N(R^{Ak})_2]$, and the like, in which $R^{Ak}$ is optionally substituted aliphatic, heteroaliphatic, alkyl, alkenyl, alkynyl, or alkoxy; and each of $R^{N1}$ and $R^{N2}$ is any described herein.

In some embodiments, the silyl group is —$Si(R')_a(OR)_b(NR_2)_c$, in which each R' is, independently, H, aliphatic, heteroaliphatic, aromatic, heteroaromatic, amino, hydrazino, azido, hydroxyl, silyl, silyloxy, cyanato, isocyanato, cyano, or isocyano, in which any of these may be optionally substituted; each R is, independently, H, optionally substituted aliphatic, optionally substituted heteroaliphatic, optionally substituted aromatic, or optionally substituted heteroaromatic; each of a, b, and c≥0; and a+b+c=3. In particular embodiments, each R is, independently, H, optionally substituted alkyl, optionally substituted aryl, optionally substituted alkyl-aryl, or optionally substituted aryl-alkyl.

In other embodiments, any of the silyl groups herein can be attached to the parent compound through an oxy bond. In some embodiments, the silyloxy group is —O—$Si(R')_a(OR)_b(NR_2)_c$, in which each R' is, independently, H, aliphatic, heteroaliphatic, aromatic, heteroaromatic, amino, hydrazino, azido, hydroxyl, silyl, silyloxy, cyanato, isocyanato, cyano, or isocyano, in which any of these may be optionally substituted; each R is, independently, H, optionally substituted aliphatic, optionally substituted heteroaliphatic, optionally substituted aromatic, or optionally substituted heteroaromatic; each of a, b, and c≥0; and a+b+c=3. In particular embodiments, each R is, independently, H, optionally substituted alkyl, optionally substituted aryl, optionally substituted alkyl-aryl, or optionally substituted aryl-alkyl. Yet other non-limiting silyloxy groups include —O—$Si(R)_a(R^{Ak})_b$, —O—$Si(R)_a(OR^{Ak})_b$, —O—$Si(R)_a(R^{Ar})_b$, —O—$Si(R)_a(OR^{Ar})_b$, —O—$Si(R)_a(NR^{N1}R^{N2})_b$, in which R is, independently, H, aromatic, heteroaromatic, amino, hydrazino, azido, hydroxyl, silyl (e.g., aminosilyl, alkoxysilyl, and the like), silyloxy (e.g., aminosilyloxy, alkoxysilyloxy, and the like), cyanato, isocyanato, cyano, or isocyano, in which any of these may be optionally substituted; $R^{Ak}$ is optionally substituted aliphatic, optionally substituted heteroaliphatic, optionally substituted alkyl, optionally substituted alkenyl, optionally substituted alkynyl, optionally substituted cycloalkyl, optionally substituted heteroalkyl, optionally substituted heteroalkenyl, optionally substituted heteroalkynyl, or optionally substituted heterocyclyl; $R^{Ar}$ is optionally substituted aromatic, optionally substituted heteroaromatic, optionally substituted aryl, or optionally substituted heteroaryl; each of $R^{N1}$ and $R^{N2}$ is, independently, H, optionally substituted aliphatic, optionally substituted heteroaliphatic, optionally substituted aromatic, optionally substituted heteroaromatic, optionally substituted silyl, or optionally substituted silyloxy, in which $R^{N1}$ and $R^{N2}$ can be taken together, with the nitrogen atom to which each is attached, to form an optionally substituted heterocyclyl; a≥0; b≥1; and a+b=3. Yet other non-limiting silyloxy groups include alkylsilyloxy (e.g., —O—$SiH_2R^{Ak}$, —O—$SiH[R^{Ak}]_2$, or —O—$Si[R^{Ak}]_3$); alkoxysilyloxy (e.g., —O—$SiH_2[OR^{Ak}]$, —O—$SiH[OR^{Ak}]_2$, or —O—$Si[OR^{Ak}]_3$); arylsilyloxy (e.g., —O—$SiH_2R^{Ar}$, —O—$SiH[R^{Ar}]_2$, or —O—$Si[R^{Ar}]_3$); or aryloxysilyloxy (e.g., —O—$SiH_2[OR^{Ar}]$, —O—$SiH[OR^{Ar}]_2$, or —O—$Si[OR^{Ar}]_3$). In some embodiments, the silyl group is aminosilyloxy (e.g., —O—$SiH_2[NR^{N1}R^{N2}]$, —O—$SiH[R^{Ak}][NR^{N1}R^{N2}]$, —O—$Si[R^{Ak}]_2[NR^{N1}R^{N2}]$—O—$SiH[NR^{N1}R^{N2}]_2$, —O—$Si[R^{Ak}][NR^{N1}R^{N2}]_2$, or —O—$Si[NR^{N1}R^{N2}]_3$).

Silyl and silyloxy group can have a mixed combination of aliphatic and aromatic groups. In one instance, the silyl group is —$Si(R)_a(R^{Ak})_b(R^{Ar})_c$ or —$Si(R)_a(OR^{Ak})_b(OR^{Ar})_c$, in which R is, independently, H, aromatic, heteroaromatic, amino, hydrazino, azido, hydroxyl, silyl (e.g., aminosilyl, alkoxysilyl, and the like), silyloxy (e.g., aminosilyloxy, alkoxysilyloxy, and the like), cyanato, isocyanato, cyano, or isocyano, in which any of these may be optionally substituted; $R^{Ak}$ is optionally substituted aliphatic (e.g., optionally substituted alkyl) or optionally substituted heteroaliphatic (e.g., optionally substituted alkoxy or optionally substituted amino); $R^{Ar}$ is optionally substituted aromatic or optionally substituted heteroaromatic; each of a, b, and c≥0; and a+b+c=3.

In another instance, the silyl group is —$Si(R)_a(NR^{Ak}{}_2)_b$, —$Si(R)_a(NR^{Ak}R^{Ar})_b$, or —$Si(R)_a(NR^{Ar}{}_2)_b$, in which R is, independently, H, aromatic, heteroaromatic, amino, hydrazino, azido, hydroxyl, silyl (e.g., aminosilyl, alkoxysilyl, and the like), silyloxy (e.g., aminosilyloxy, alkoxysilyloxy, and the like), cyanato, isocyanato, cyano, or isocyano, in which any of these may be optionally substituted; each of $R^{N1}$ and $R^{N2}$ is, independently, H, optionally substituted aliphatic, optionally substituted heteroaliphatic, optionally substituted aromatic, optionally substituted heteroaromatic, optionally substituted silyl, or optionally substituted silyloxy, in which $R^{N1}$ and $R^{N2}$ can be taken together, with the nitrogen atom to which each is attached, to form an optionally substituted heterocyclyl; each of a and b≥0; and a+b=3.

In yet another instance, the silyloxy group is —O—$Si(R)_a(R^{Ak})_b(R^{Ar})_c$, —O—$Si(R)_a(OR^{Ak})_b(OR^{Ar})_c$, —O—$Si(R)_a(NR^{Ak}{}_2)_b$, —O—$Si(R)_a(NR^{Ak}R^{Ar})_b$, or —O—$Si(R)_a(NR^{Ar}{}_2)_b$, in which R, $R^{Ak}$, and $R^{Ar}$ are any described herein; and a, b, and c are any described herein.

In some embodiments, at least one, two, three, four, or more R' in any formula herein (e.g., for formula (I) or (II)) includes an optionally substituted aliphatic-oxy, heteroaliphatic-oxy, aromatic-oxy, or heteroaromatic-oxy. For instance, R' can be —O—R, in which R is optionally substituted aliphatic (e.g., alkyl, alkenyl, alkynyl, cycloalkyl, cycloalkenyl, or cycloalkynyl), optionally substituted heteroaliphatic (e.g., heteroalkyl, heteroalkenyl, heteroalkynyl, or heterocyclyl), optionally substituted aromatic (e.g., aryl), optionally substituted heteroaromatic (e.g., heteroaryl), optionally substituted aliphatic-carbonyl (e.g., alkanoyl or —$C(O)R^{Ak}$, in which $R^{Ak}$ is optionally substituted aliphatic or any described herein), optionally substituted silyl (e.g., $-SiR^{S1}R^{S2}R^{S3}$ or $-Si(R')_a(OR)_b(NR_2)_c$, including any described herein), or optionally substituted amino (e.g., $-NR^{N1}R^{N2}$, including any described herein).

In particular embodiments, at least one, two, three, four, or more R' in any formula herein (e.g., for formula (I) or (II)) includes an optionally substituted aromatic or optionally substituted heteroaromatic. Non-limiting aromatic and heteroaromatic groups include phenyl, benzyl, naphthyl, furanyl, pyrrolyl, imidazolyl, pyrazolyl, triazolyl, pyridinyl, pyrimidinyl, pyridazinyl, pyrazinyl, oxazolyl, and the like.

In particular embodiments, at least one, two, three, four, or more R' in any formula herein (e.g., for formula (I) or (II)) includes an optionally substituted amino (e.g., $-NH_2$, $-NR^{N1}H$, or $-NR^{N1}R^{N2}$). In particular embodiments, each of $R^{N1}$ and $R^{N2}$ is, independently, H, optionally substituted aliphatic, optionally substituted heteroaliphatic, optionally substituted aromatic, optionally substituted heteroaromatic, optionally substituted amino, hydroxyl, optionally substituted alkyl, optionally substituted alkoxy, optionally substituted aryl, optionally substituted aryloxy, optionally substituted alkyl-aryl, optionally substituted aryl-alkyl, optionally substituted silyl, or optionally substituted silyloxy. In particular embodiments, $R^{N1}$ and $R^{N2}$ can be taken together, with the nitrogen atom to which each is attached, to form an optionally substituted heterocyclyl.

Non-limiting instances of $R^{N1}$ and $R^{N2}$ can include H, aliphatic, alkyl (e.g., $-R^{Ak}$), alkenyl, alkynyl, aliphatic carbonyl (e.g., alkanoyl or $-C(O)R$), aliphatic-carbonyloxy (e.g., alkanoyloxy or $-OC(O)R^{Ak}$), aliphatic-oxy (e.g., alkoxy or $-OR^{Ak}$), aliphatic-oxycarbonyl (e.g., alkoxycarbonyl or $-C(O)OR^{Ak}$), amino (e.g., $-NR_2$, in which each R is, e.g., H, optionally substituted aliphatic, optionally substituted heteroaliphatic, optionally substituted aromatic, or optionally substituted heteroaromatic), aromatic (e.g., aryl or $-R^{Ar}$), aromatic-carbonyl (e.g., aryloyl or $-C(O)R^{Ar}$), aromatic-carbonyloxy (e.g., aryloyloxy or $-OC(O)R^{Ar}$), aromatic-oxy (e.g., aryloxy or $-OR^{Ar}$), aromatic-oxycarbonyl (e.g., aryloxycarbonyl or $-C(O)OR^{Ar}$), imidoyl (e.g., $-C(NR)H$, $-C(NR)R^{Ak}$, or $-C(NR)R^{Ar}$, in which each R is, e.g., H, optionally substituted aliphatic, optionally substituted heteroaliphatic, optionally substituted aromatic, or optionally substituted heteroaromatic), carbamoyl (e.g., $-C(O)NR_2$, in which each R is, e.g., H, optionally substituted aliphatic, optionally substituted heteroaliphatic, optionally substituted aromatic, or optionally substituted heteroaromatic), carbamoyloxy (e.g., $-OC(O)NR_2$, in which each R is, e.g., H, optionally substituted aliphatic, optionally substituted heteroaliphatic, optionally substituted aromatic, or optionally substituted heteroaromatic), carboxyl ($-CO_2H$), formyl ($-C(O)H$), heteroaromatic, heterocyclyl (e.g., optionally substituted furanyl, tetrahydrofuranyl, pyrrolidinyl, pyrrolyl, imidazolyl, pyrazolyl, triazolyl, piperidinyl, pyridinyl, pyrimidinyl, pyridazinyl, pyrazinyl, oxazolyl, morpholinyl, and the like), hydroxyl ($-OH$), silyl (e.g., $-SiR^{S1}R^{S2}R^{S3}$ or $-Si(R')_a(OR)_b(NR_2)_c$), and silyloxy (e.g., $-O-SiR^{S1}R^{S2}R^{S3}$ or $-O-Si(R)_a(OR)_b(NR_2)_c$). For any of these groups, where indicated, $R^{Ak}$, $R^{Ar}$, R', R, $R^{S1}$, $R^{S2}$, $R^{S3}$, a, b, and c can be any described herein.

Yet other non-limiting amino groups include $-NH_2$, $-NHMe$, $-NMe_2$, $-NHEt$, $-NMeEt$, $-NEt$, $-NHnPr$, $-NMenPr$, $-NnPr_2$, $-NHiPr$, $-NMeiPr$, $-NiPr_2$, $-NHsBu$, $-NMesBu$, $-NsBu_2$, $-NHtBu$, $-NMetBu$, $-NtBu_2$, $-N[SiH_3]_2$, $-N[Si(Me)_3]_2$, $-N[Si(Et)_3]_2$, $-NH[SiH_3]$, $-NH[Si(Me)_3]$, $-NH[Si(Et)_3]$, $-NMe[SiH_3]$, $-NMe[Si(Me)_3]$, $-NMe[Si(Et)_3]$, $-N[SiH_2Me]_2$, $-N[SiHMe_2]_2$, $-N[SiH_2Et]_2$, $-N[SiHEt_2]_2$, $-N[SiHMeEt]_2$, $-NH[SiH_2Me]$, $-NH[SiHMe_2]$, $-NH[SiH_2Et]$, $-NH[SiHEt_2]_2$, $-NH[SiHMeEt]$, $-NMe[SiH_2Me]$, $-NMe[SiHMe_2]$, $-NMe[SiH_2Et]$, $-NMe[SiHEt_2]_2$, $-NMe[SiHMeEt]$, and the like.

In particular embodiments, at least one, two, three, four, or more R' in any formula herein (e.g., for formula (I) or (II)) includes an optionally substituted hydrazino (e.g., $-NH-NH_2$ or $-NR^{N1}-NR^{N2}R^{N3}$). In particular embodiments, each of $R^{N1}$, $R^{N2}$, and $R^{N3}$ is, independently, H, optionally substituted aliphatic, optionally substituted heteroaliphatic, optionally substituted aromatic, optionally substituted heteroaromatic, optionally substituted amino, hydroxyl, optionally substituted alkyl, optionally substituted alkoxy, optionally substituted aryl, optionally substituted aryloxy, optionally substituted alkyl-aryl, optionally substituted aryl-alkyl, optionally substituted silyl, or optionally substituted silyloxy. In particular embodiments, $R^{N1}$ and $R^{N2}$ or $R^{N2}$ and $R^{N3}$ can be taken together, with the nitrogen atom to which each is attached, to form an optionally substituted heterocyclyl. Yet other non-limiting hydrazino groups include $-NH-NH_2$, $-NMe-NH_2$, $-NH-NHMe$, $-NH-NMe_2$, $-NMe-NMe_2$, $-NEt-NH_2$, $-NH-NHEt$, $-NH-NEt_2$, $-NMe-NEt_2$, and the like.

In some embodiments, at least one, two, three, four, or more R' in any formula herein (e.g., for formula (I) or (II)) includes an optionally substituted silyl. In one embodiment, silyl is $-SiR^{S1}R^{S2}R^{S3}$, in which each of $R^{S1}$, $R^{S2}$, and $R^{S3}$ is, independently, H, optionally substituted aliphatic, optionally substituted heteroaliphatic, optionally substituted aromatic, optionally substituted heteroaromatic, optionally substituted amino, optionally substituted hydrazino, azido, hydroxyl, optionally substituted silyl, optionally substituted silyloxy, optionally substituted alkyl, optionally substituted alkenyl, optionally substituted alkynyl, optionally substituted alkoxy, optionally substituted heteroalkyl, optionally substituted heteroalkenyl, optionally substituted heteroalkynyl, optionally substituted heterocyclyl, optionally substituted aryl, optionally substituted aryloxy, cyanato, isocyanato, cyano, isocyano, and the like. Non-limiting silyl groups include any described herein, such as $-Si(R)_a(R^{Ak})_b$, $-Si(R)_a(OR^{Ak})_b$, $-Si(R)_a(R^{Ar})_b$, $-Si(R)_a(OR^{Ar})_b$, $-Si(R)_a(NR^{N1}R^{N2})_b$, $-Si(R')_a(OR)_b(NR_2)_c$, and the like. Yet other non-limiting silyl groups include $-SiH_3$, $-SiH_2Me$, $-SiHMe_2$, $-SiMe_3$, $-Si(OH)_3$, $-SiH_2(OMe)$, $-SiH(OMe)_2$, $-Si(OMe)_3$, $-SiH_2(NH_2)$, $-SiHMe(NH_2)$, $-SiMe_2(NH_2)$, $-SiH(NH_2)_2$, $-SiMe(NH_2)_2$, $-Si(NH_2)_3$, $-SiH_2(NMe_2)$, $-SiH_2(NMe_2)$, $-SiHMe(NMe_2)$, $-Si(Me)_2(NMe_2)_2$, $-SiMe(NMe_2)_2$, $-Si(NMe_2)_3$, $-SiH_2(NHMe)$, $-SiHMe(NHMe)$, $-SiH(NHMe)_2$, $-SiMe(NHMe)_2$, $-Si(NHMe)_3$, and the like.

In other embodiments, at least one, two, three, four, or more R' in any formula herein (e.g., for formula (I) or (II)) includes an optionally substituted silyloxy. Non-limiting silyloxy groups include any described herein, such as $-O-Si(R)_a(R^{Ak})_b$, $-O-Si(R)_a(OR^{Ak})_b$, $-O-Si(R)_a(R^{Ar})_b$, $-O-Si(R)_a(OR^{Ar})_b$, $-O-Si(R)_a(NR^{N1}R^{N2})_b$, $-O-Si(R')_a(OR)_b(NR_2)_c$, and the like. Yet other non-limiting silyloxy groups include $-O-SiH_3$, $-O-SiH_2Me$, $-O-SiHMe_2$, $-O-SiMe_3$, $-O-Si(OH)_3$, $-O-SiH_2(OMe)$, $-O-SiH(OMe)_2$, $-O-Si(OMe)_3$, $-O-SiH_2(NH_2)$, $-O-SiHMe(NH_2)$, $-O-SiMe_2(NH_2)$, $-O-SiH(NH_2)_2$, $-O-SiMe(NH_2)_2$, $-O-Si(NH_2)_3$, $-O-SiH_2(NMe_2)$, $-O-SiH_2(NMe_2)$, $-O-SiHMe(NMe_2)$, $-O-Si(Me)_2(NMe_2)_2$, $-O-SiMe(NMe_2)_2$, $-O-Si(NMe_2)_3$, $-O-SiH_2(NHMe)$, $-O-SiHMe(NHMe)$, $-O-SiH(NHMe)_2$, $-O-SiMe(NHMe)_2$, $-O-Si(NHMe)_3$, and the like.

In yet other embodiments, at least one, two, three, four, or more R' in any formula herein (e.g., for formula (I) or (II)) includes azido (—$N_3$), hydroxyl (—OH), cyanato (—OCN), isocyanato (—NCO), cyano (—CN), and/or isocyano (—NC).

The organic silicon-containing precursor may be selected from the group consisting of silane, disilane, trisilane, tetrasilane, amine-substituted versions of any of the foregoing silanes, and trisilylamine.

Examples of organic silicon-containing precursors include, but are not limited to, silanes, polysilanes, halosilanes, and aminosilanes. A silane contains hydrogen and/or carbon groups, but does not contain a halogen. A polysilane may have the formula ($H_3Si$—$(SiH_2)_n$—$SiH_3$), where n≥1. Examples of silanes include silane ($SiH_4$), disilane ($Si_2H_6$), trisilane, tetrasilane and organo silanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, tetra-ethyl-ortho-silicate (also known as tetra-ethoxysilane or TEOS) and the like.

An aminosilane includes at least one nitrogen atom bonded to a silicon atom, but may also contain hydrogens, oxygens, halogens and carbons. Examples of aminosilanes are mono-, di-, tri- and tetra-aminosilane ($H_3Si(NH_2)_4$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tertiarybutylamino)silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$, di(sec-butylamino)silane (DSBAS), di(isopropylamido)silane (DIPAS), bis(diethylamino)silane (BDEAS), and the like. A further example of an aminosilane is trisilylamine ($N(SiH_3)_3$).

Examples of silicon-containing precursors for depositing silicon carbide include siloxanes, alkyl silane or hydrocarbon-substituted silane, or a nitrogen-containing carbon-containing reactant. Examples of siloxanes include 2,4,6,8-tetramethylcyclotetrasiloxane (TMCTS), heptamethylcyclotetrasiloxane (HMCTS), silsesquioxane, disiloxanes, such as pentamethyldisiloxane (PMDSO) or tetramethyldisiloxane (TMDSO), and trisiloxanes such as hexamethyltrisiloxane or heptamethyltrisiloxane. Alkyl silanes include a central silicon atom with one or more alkyl groups bonded to it as well as one or more hydrogen atoms bonded to it. In some embodiments, any one or more of the alkyl groups contain 1-5 carbon atoms. The hydrocarbon groups may be saturated or unsaturated (e.g., alkene (e.g., vinyl), alkyne, and aromatic groups). Examples include but are not limited to trimethylsilane (3MS), triethylsilane, pentamethyl disilamethane ($(CH_3)_2Si$—$CH_2$—$Si(CH_3)_3$), and dimethylsilane (2MS). Additionally, disilanes, trisilanes, or other higher silanes may be used in place of monosilanes. In some embodiments, one of the silicon atoms can have a carbon-containing or hydrocarbon group attached to it, and one of the silicon atoms can have a hydrogen atom attached to it. Example carbon-containing reactants including a nitrogen include methyl-substituted disilazanes and trisilazanes, such as tetramethyldisilazane and hexamethyl trisilazane.

Yet other examples of organic silicon-containing precursors can include siloxanes such as cyclotetrasiloxanes such as heptamethylcyclotetrasiloxane (HMCTS) and tetramethyl cyclotetrasiloxane. Other cyclic siloxanes can also include but are not limited to cyclotrisiloxanes and cyclopentasiloxanes. Other examples of suitable precursors include linear siloxanes such as, but not limited to, disiloxanes, such as pentamethyldisiloxane (PMDSO), tetramethyldisiloxane (TMDSO), hexamethyl trisiloxane, and heptamethyl trisiloxane. For undoped silicon carbide, examples of suitable precursors include monosilanes substituted with one or more alkyl, alkene, and/or alkyne groups containing, e.g., 1-5 carbon atoms. Examples include but are not limited to trimethylsilane (3MS), dimethylsilane (2MS), triethylsilane (TES), and pentamethyldisilamethane. Additionally, disilanes, trisilanes, or other higher silanes may be used in place of monosilanes. An example of one such disilane from the alkyl silane class is hexamethyldisilane (HMDS). Another example of a disilane from the alkyl silane class can include pentamethyldisilane (PMDS). Other types of alkyl silanes can include alkylcarbosilanes, which can have a branched polymeric structure with a carbon bonded to a silicon atom as well as alkyl groups bonded to a silicon atom. Examples include dimethyl trimethylsilyl methane (DTMSM) and bis-dimethylsilyl ethane (BDMSE). Examples of other suitable precursors include, e.g., alkyldisilazanes and possibly compounds including amino (—$NH_2$) and alkyl groups separately bonded to one or more silicon atoms. Alkyldisilazanes include silizanes and alkyl groups bonded to two silicon atoms. An example includes 1,1,3,3-tetramethyldisilazane (TMDSN).

In the Si-containing precursors described herein, different kinds of R' can be attached to the silicon atom. Further Si-containing precursors are described herein.

Amino Silanes

A silicon-containing precursor can include one or more optionally substituted amino groups, thereby providing a non-limiting amino silane. In one embodiment, the precursor has a formula of $(R')_{4-x}Si(NR''_2)_x$, wherein:

x is 1, 2, 3, or 4;

each R' is, independently, H, aliphatic, aliphatic-carbonyl, aliphatic-carbonyloxy, aliphatic-oxy, aliphatic-oxycarbonyl, heteroaliphatic, heteroaliphatic-carbonyl, heteroaliphatic-carbonyloxy, heteroaliphatic-oxy, heteroaliphatic-oxycarbonyl, aromatic, aromatic-carbonyl, aromatic-carbonyloxy, aromatic-oxy, aromatic-oxycarbonyl, heteroaromatic, heteroaromatic-oxy, amino, hydrazino, azido, hydroxyl, silyl, silyloxy, cyanato, isocyanato, cyano, or isocyano, in which any of these may be optionally substituted; and each R'' is, independently, H, aliphatic, heteroaliphatic, aromatic, heteroaromatic, or amino, in which any of these may be optionally substituted; or optionally in which two R'' can be taken together, with the nitrogen atom to which each is attached, to form an optionally substituted heterocyclyl.

In another embodiment, the precursor has a formula of $(R''_2N)_x(R')_{3-x}Si\text{-}L\text{-}Si(R')_{3-x}(NR''_2)_x$, wherein:

each x is, independently, 0, 1, 2, or 3;

L is a linker, such as a covalent bond, optionally substituted aliphatic, optionally substituted heteroaliphatic, optionally substituted aromatic, optionally substituted heteroaromatic, oxy (—O—), imino, or silyl;

each R' is, independently, H, aliphatic, aliphatic-carbonyl, aliphatic-carbonyloxy, aliphatic-oxy, aliphatic-oxycarbonyl, heteroaliphatic, heteroaliphatic-carbonyl, heteroaliphatic-carbonyloxy, heteroaliphatic-oxy, heteroaliphatic-oxycarbonyl, aromatic, aromatic-carbonyl, aromatic-carbonyloxy, aromatic-oxy, aromatic-oxycarbonyl, heteroaromatic, heteroaromatic-oxy, amino, hydrazino, azido, hydroxyl, silyl, silyloxy, cyanato, isocyanato, cyano, or isocyano, in which any of these may be optionally substituted; and each R" is, independently, H, aliphatic, heteroaliphatic, aromatic, heteroaromatic, or amino, in which any of these may be optionally substituted; or optionally in which two R" can be taken together, with the nitrogen atom to which each is attached, to form an optionally substituted heterocyclyl.

In particular embodiments, L is optionally substituted imino, such as —NR—, in which R is H, optionally substituted aliphatic, optionally substituted alkyl, optionally substituted alkenyl, optionally substituted alkynyl, or optionally substituted aromatic. In other embodiments, L is optionally substituted silyl, such as —$SiR_2$—, in which each R is, independently, H, optionally substituted aliphatic, optionally substituted alkyl, optionally substituted alkenyl, optionally substituted alkynyl, or optionally substituted aromatic.

In one instance, at least one x is not 0. In another embodiment, x can be 0 (e.g., if L includes a carbon atom or a heteroatom). In yet another embodiment, x is 0; and/or L includes optionally substituted aliphatic, optionally substituted alkylene, optionally substituted alkenylene, optionally substituted alkynylene, optionally substituted heteroaliphatic, optionally substituted heteroalkylene, optionally substituted heteroalkenylene, optionally substituted heteroalkynylene, optionally substituted aromatic, optionally substituted arylene, optionally substituted heteroaromatic, optionally substituted heteroarylene, oxy (—O—), imino, or silyl.

In particular embodiments, at least one R' or R" is not H. The precursor can have any useful combination of R' groups and amino groups ($NR''_2$) attached to one or more silicon atoms.

In some embodiments, R' is H, optionally substituted amino (e.g., —$NR_2$), aliphatic-oxy (e.g., alkoxy or —OR), aliphatic-carbonyl (e.g., alkanoyl or —C(O)R), aliphatic-carbonyloxy (e.g., alkanoyloxy or —OC(O)R), aliphatic-oxycarbonyl (e.g., alkoxycarbonyl or —C(O)OR), silyl (e.g., —$SiR_3$), aliphatic-oxy-silyl (e.g., alkoxysilyl or —$Si(R)_a(OR)_b$), aminosilyl (e.g., —$Si(R)_a(NR_2)_b$), silyloxy (e.g., —O—$SiR_3$), aliphatic-oxy-silyloxy (e.g., alkoxysilyloxy or —O—$Si(R)_a(OR)_b$), aminosilyloxy (e.g., —O—$Si(R)_a(NR_2)_b$), aromatic (e.g., aryl), aromatic-oxy (e.g., aryloxy or —OR), hydroxyl (—OH), formyl (—C(O)H), and the like. In particular embodiments, each R is, independently, H, optionally substituted aliphatic, optionally substituted alkyl, optionally substituted alkenyl, optionally substituted alkynyl, optionally substituted heteroaliphatic, optionally substituted aromatic, optionally substituted aryl, and optionally substituted heteroaromatic; $a \geq 0$; $b \geq 1$; and $a+b=3$. In some embodiments, two R groups can be taken together, with the nitrogen atom to which each is attached, to form an optionally substituted heterocyclyl. In other embodiments, each R is, independently, H, optionally substituted alkyl, optionally substituted alkenyl, optionally substituted alkynyl, or optionally substituted aryl.

In other embodiments, R" is H, optionally substituted aliphatic, optionally substituted heteroaliphatic, optionally substituted alkyl, optionally substituted silyl, or optionally substituted silyloxy. In some embodiments, R" is optionally substituted alkyl (e.g., Me, Et, nPr, iPr, sBu, or tBu). In other embodiments, R" is —$SiR'_3$, —$SiR_3$, —$Si(R')_a(OR)_b$, —$Si(R)_a(OR)_b$, —$Si(R')_a(NR_2)_b$, —$Si(R)_a(NR_2)_b$, —$Si(R')_a(OR)_b(NR_2)_c$, —$Si(R)_a(OR)_b(NR_2)_c$, —O—$SiR'_3$, —O—$SiR_3$, —O—$Si(R')_a(OR)_b$, —O—$Si(R)_a(OR)_b$, —O—$Si(R')_a(NR_2)_b$, —O—$Si(R)_a(NR_2)_b$, —O—$Si(R')_a(OR)_b(NR_2)_c$, or —O—$Si(R)_a(OR)_b(NR_2)_c$ in which each R' is, independently, H, aliphatic, heteroaliphatic, aromatic, heteroaromatic, amino, hydrazino, azido, hydroxyl, silyl, silyloxy, cyanato, isocyanato, cyano, or isocyano, in which any of these may be optionally substituted; each R is, independently, H, optionally substituted aliphatic, optionally substituted heteroaliphatic, optionally substituted aromatic, or optionally substituted heteroaromatic; each of a, b, and $c \geq 0$; and $a+b+c=3$ or $a+b=3$ (if c is not present). In particular embodiments, R is H, optionally substituted alkyl, optionally substituted alkenyl, or optionally substituted alkynyl.

The precursor can include at least one R' group attached to the silicon atom. In one embodiment, the precursor has a formula of $(R')(H)_{3-x}Si(NR''_2)_x$, wherein R' and R" can be any described herein, and wherein x is 1, 2, or 3. In another embodiment, the precursor has a formula of $(R')(H)_2Si(NR''_2)$, wherein R' and R" can be any described herein. In one embodiment, the precursor has a formula of $(R')(H)Si(NR''_2)_2$, wherein R' and R" can be any described herein. In another embodiment, the precursor has a formula of $(R')_2(H)Si(NR''_2)$, wherein R' and R" can be any described herein. In yet another embodiment, the precursor has a formula of $(R')_2Si(NR''_2)_2$, wherein R' and R" can be any described herein. In one embodiment, the precursor has a formula of $(R')_3Si(NR''_2)$, wherein R' and R" can be any described herein.

The precursor can lack an R' group attached to the silicon atom. In one embodiment, the precursor has a formula of $(H)_{4-x}Si(NR''_2)_x$, wherein each R" can independently be any described herein, and wherein x is 1, 2, 3, or 4. In another embodiment, the precursor has a formula of $Si(NR''_2)_x$, wherein each R" can independently be any described herein. In particular embodiments, each R" is, independently, aliphatic, heteroaliphatic, aromatic, or heteroaromatic.

The precursor can include one or more hydrogen atoms attached to the silicon atom. In one embodiment, the precursor has a formula of $(H)_3Si(NR''_2)$ or $(H)_2Si(NR''_2)_2$ or $(H)Si(NR''_2)_3$, wherein each R" can independently be any described herein. In particular embodiments, each R" is, independently, aliphatic, heteroaliphatic, aromatic, heteroaromatic, or amino, in which any of these may be optionally substituted.

The precursor can include a heterocyclyl group having a nitrogen atom. In one embodiment, the formula has a formula of $H_3Si$-Het, in which Het is an optionally substituted heterocyclyl including at least one nitrogen atom. In particular embodiments, the precursor has a formula of

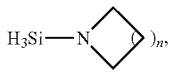

in which the heterocyclyl group can be optionally substituted (e.g., with any substituent described herein as a substitution for alkyl), and wherein n is 1,2, 3, 4, or 5. In one embodiment, the formula has a formula of $R'_3Si$-Het, in which Het is an optionally substituted heterocyclyl including at least one nitrogen atom, and each R' can independently be any described herein. In particular embodiments, the precursor has a formula of

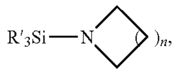

in which the heterocyclyl group can be optionally substituted (e.g., with any substituent described herein as a substitution for alkyl), and wherein n is 1,2, 3, 4, or 5 stitution for alkyl); each R' can independently be any described herein; and wherein n is 1,2, 3, 4, or 5.

In some instances, the precursor can have two or more silicon atoms, in which the precursor can include a Si—Si bond. In a particular embodiment, the precursor has a formula of $(R''_2N)_x(R')_{3-x}Si—Si(R')_{3-x}(NR''_2)_x$, wherein R' and R" can be any described herein. In one embodiment, the precursor has a formula of $(R''_2N)(R')_2Si—Si(R')_2(NR''_2)$, wherein R' and R" can be any described herein. In another embodiment, the precursor has a formula of $(R''_2N)_2(R')Si—Si(R')(NR''_2)_2$, wherein R' and R" can be any described herein. In yet another embodiment, the precursor has a formula of $(R''_2N)_3Si—Si(NR''_2)_3$, wherein each R" can independently be any described herein.

The precursor can include differing groups attached to the silicon atoms. In one instance, the precursor has a formula of $(R''_2N)_x(R')_{3-x}Si—SiH_3$, wherein R' and R" can be any described herein.

A linker can be present between two silicon atoms. In one instance, the precursor has a formula of $(R''_2N)_x(R')_{3-x}Si—NR—Si(R')_{3-x}(NR''_2)_x$, wherein R' and R" can be any described herein, and in which R is H, optionally substituted aliphatic, optionally substituted alkyl, optionally substituted alkenyl, optionally substituted alkynyl, or optionally substituted aromatic. In another instance, the precursor has a formula of $(R''_2N)_x(H)_{3-x}Si—NR—Si(H)_{3-x}(NR''_2)_x$, wherein R, R', and R" can be any described herein.

The precursor can include a combination of R' groups with a linker having a heteroatom. In one instance, the precursor has a formula of $(R')_3Si—NR—Si(R')_3$, wherein R and R' can be any described herein. In another instance, the precursor has a formula of $(R')_3Si-L-Si(R')_3$, wherein L and R' can be any described herein. In particular embodiments, L is oxy (—O—), optionally substituted imino (e.g., —NR—), or optionally substituted silyl (e.g., $—SiR_2—$).

The precursor can include any useful combination of R' and $NR''_2$ groups in combination with two silicon atoms. In one instance, the precursor has a formula of $(R''_2N)(R')_2Si-L-Si(R')_2(NR''_2)_x$, wherein L, R', and R" can be any described herein.

The precursor can include heterocyclic groups including the silicon and nitrogen atoms. In one embodiment, the precursor has a formula of

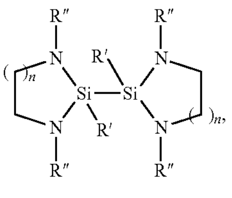

wherein R' and R" can be any described herein, and wherein n is 1, 2, 3, or 4.

In another embodiment, the precursor has a formula of

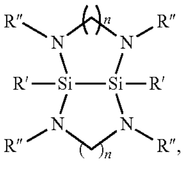

wherein R' and R" can be any described herein, and wherein n is 1, 2, 3, or 4. In yet another embodiment, the precursor has a formula of

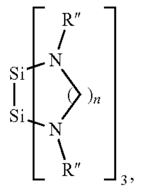

in which each R" can independently be any described herein; and wherein n is 1,2, 3, or 4.

In another embodiment, the precursor has a formula of

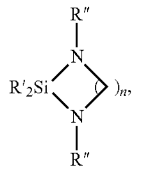

wherein R' and R" can be any described herein, and wherein n is 1, 2, 3, or 4. In yet another embodiment, the precursor has a formula of

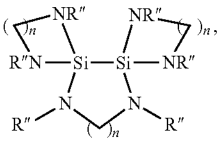

wherein R" can independently be any described herein, and wherein n is 1, 2, 3, or 4.

In any precursor herein, two R" can be taken together, with the nitrogen atom to which each is attached, to form an optionally substituted heterocyclyl.

Precursors can include any of the following, e.g., $(R^{Ak})Si(NH_2)(NR^{Ak}_2)_2$, $(R^{Ak})Si(NR^{Ak}_2)_3$, $(R^{Ak})_2Si(NHR^{Ak}_2)_2$, $(R^{Ak})(H)Si(NHR^{Ak})_2$, $(R^{Ak})_3Si(NR^{Ak}_2)$, $(R^{Ak})_3Si(NHR^{Ak})$, $H_2Si(NHR^{Ak}_2)_2$, $(R^{Ak})(H)Si(NR^{Ak}_2)_2$, $HSi(NH_2)(NR^{Ak}_2)_2$, $HSi(NR^{Ak}_2)_3$, $Si(NR^{Ak}_2)_4$, $(R')(H)Si(NR''_2)_2$, $(R')_2Si(NR^{Ak}_2)_2$, $(R')_2Si(N[SiH_3]_2)_2$, $(R')_2Si(N[SiR''_3]_2)_2$, or $(R')_3Si(NHR^{Ak})$. In some embodiments, each of R' and R", independently, can be any described herein (e.g., H, optionally substituted aliphatic, optionally substituted heteroaliphatic, optionally substituted alkyl, optionally substituted alkenyl, or optionally substituted alkynyl). In other embodiments, each $R^{Ak}$ is, independently, H, optionally substituted aliphatic, optionally substituted heteroaliphatic, optionally substituted alkyl, optionally substituted alkenyl, or optionally substituted alkynyl. In particular embodiments, $R^{Ak}$ is methyl (Me), ethyl (Et), n-propyl (nPr), iso-propyl (iPr), n-butyl (nBu), sec-butyl (sBu), iso-butyl (iBu), tert-butyl (tBu), and the like.

Non-limiting examples of precursor include any of the following: methylaminotrimethylsilane ($SiMe_3[NHMe]$); dimethylaminodimethylsilane ($SiMe_2H[NMe_2]$); dimethylaminotrimethylsilane ($SiMe_3[NMe_2]$); dimethylaminodiethylsilane ($SiHEt_2[NMe_2]$); dimethylaminotriethylsilane ($SiEt_3[NMe_2]$); ethylmethylaminodimethylsilane ($SiHMe_2$

[NMeEt]); ethylmethylaminotrimethylsilane ($SiMe_3$[NMeEt]); ethylmethylaminodiethylsilane ($SiHEt_2$[NMeEt]); ethylmethylaminotriethylsilane ($SiEt_3$[NMeEt]); diethylaminomethylsilane ($SiH_2Me[NEt_2]$); diethylaminoethylsilane ($SiH_2Et[NEt_2]$); ethylaminotrimethylsilane ($SiMe_3$[NHEt]); diethylaminodimethylsilane ($SiHMe_2[NEt_2]$); diethylaminodiethylsilane ($SiHEt_2[NEt_2]$); diethylaminotrimethylsilane ($SiMe_3[NEt_2]$); diethylaminotriethylsilane ($SiEt_3[NEt_2]$); iso-propylaminodimethylsilane ($SiHMe_2$[NHiPr]); iso-propylaminotrimethylsilane ($SiMe_3$[NHiPr]); iso-propylaminodiethylsilane ($SiHEt_2$[NHiPr]); iso-propylaminotriethylsilane ($SiEt_3$[NHiPr]); di-isopropylaminotrimethylsilane ($SiMe_3[NiPr_2]$); di-iso-propylaminosilane ($SiH_3[NiPr_2]$, $C_6H_{17}NSi$, or DIPAS); di-iso-propylaminomethylsilane ($SiH_2Me[NiPr_2]$); di-isopropylaminodimethylsilane ($SiHMe_2[NiPr_2]$); di-iso-propylaminodiethylsilane ($SiHEt_2[NiPr_2]$); di-isopropylaminotriethylsilane ($SiEt_3[NiPr_2]$); n-propylaminotrimethylsilane ($SiMe_3$[NHnPr]); di-sec-butylaminosilane ($SiH_3[NsBu_2]$ or DSBAS); di-sec-butylaminomethylsilane ($SiH_2Me[NsBu_2]$); iso-butylaminotrimethylsilane ($SiMe_3$[NHiBu]); n-butylaminotrimethylsilane ($SiMe_3$[NHnBu]); tert-butylaminodimethylsilane ($SiHMe_2$[NHtBu]); tert-butylaminotrimethylsilane ($SiMe_3$[NHtBu]); tert-butylaminodiethylsilane ($SiHEt_2$[NHtBu]); tert-butylaminotriethylsilane ($SiEt_3$[NHtBu]); dicyclohexylaminosilane ($SiH_3[NCy_2]$, in which Cy is cyclohexyl); N-propylisopropylaminosilane ($SiH_3$[NiPmPr]); N-methylcyclohexylaminosilane ($SiH_3$[NMeCy]); N-ethylcyclohexylaminosilane ($SiH_3$[NEtCy]); allylphenylaminosilane ($SiH_3$[NAllPh]); N-isopropylcyclohexylaminosilane ($SiH_3$[NiPrCy]); allylcyclopentylaminosilane ($SiH_3$[NAllCp]); phenylcyclohexylaminosilane ($SiH_3$[NPhCy]); cyclohexylaminotrimethylsilane ($SiMe_3$[NHCy], in which Cy is cyclohexyl); pyrrolyltrimethylsilane ($SiMe_3$[NHPy], in which Py is pyrrolyl); pyrrolidinotrimethylsilane ($SiMe_3$[NHPyr], in which Pyr is pyrrolindyl); piperidino trimethylsilane ($SiMe_3$[NHPip], in which Pip is piperidinyl); piperazinotrimethylsilane ($SiMe_3$[NHPz], in which Pz is piperazinyl); imidazolyltrimethylsilane ($SiMe_3$[NHIm], in which Im is imidazolyl); bis(dimethylamino)silane ($SiH_2[NMe_2]_2$ or BDMAS); bis(dimethylamino) methylsilane ($SiMeH[NMe_2]_2$); bis(dimethylamino)dimethylsilane ($SiMe_2[NMe_2]_2$ or BDMADMS); bis(dimethylamino)diethylsilane ($SiEt_2[NMe_2]_2$); bis(dimethylamino) methylvinylsilane ($SiMeVi[NMe_2]_2$); bis(ethylamino)dimethylsilane ($SiMe_2[NHEt]_2$); bis(ethylmethylamino)silane ($SiH_2[NMeEt]_2$); bis(ethylmethylamino)dimethylsilane ($SiMe_2[NMeEt]_2$); bis(ethylmethylamino)diethylsilane ($SiEt_2[NMeEt]_2$); bis (ethylmethylamino) methylvinylsilane ($SiMeVi[NMeEt]_2$); bis(diethylamino)silane ($SiH_2[NEt_2]_2$, $C_8H_{22}N_2Si$, or BDEAS); bis(diethylamino)dimethylsilane ($SiMe_2[NEt_2]_2$); bis(diethylamino)methylvinylsilane ($SiMeVi[NEt_2]_2$); bis (diethylamino)diethylsilane ($SiEt_2[NEt_2]_2$); bis(iso-propylamino) dimethylsilane ($SiMe_2[NHiPr]_2$); bis(iso-propylamino)diethylsilane ($SiEt_2[NHiPr]_2$); bis(iso-propylamino) methylvinylsilane ($SiMeVi[NHiPr]_2$); bis(di-iso-propylamino)silane ($SiH_2[NiPr_2]_2$); bis(di-iso-propylamino) dimethylsilane ($SiMe_2[NiPr_2]_2$); bis(di-iso-propylamino) diethylsilane ($SiEt_2[NiPr_2]_2$); bis(di-iso-propylamino)methylvinylsilane ($SiMeVi[NiPr_2]_2$); bis(methylamino)silane ($SiH_2[NHMe]_2$); bis(sec-butylamino)silane ($SiH_2[NHsBu]_2$); bis(sec-butylamino)methylsilane ($SiHMe[NHsBu]_2$); bis(sec-butylamino)ethylsilane ($SiHEt[NHsBu]_2$); bis(tert-butylamino)silane ($SiH_2[NHtBu]_2$ or BTBAS); bis(tert-butylamino)dimethylsilane ($SiMe_2[NHtBu]_2$); bis(tert-butylamino) methylvinylsilane ($SiMeVi[NHtBu]_2$); bis(tert-butylamino)diethylsilane ($SiEt_2[NHtBu]_2$); bis(1-imidazolyl)dimethylsilane ($SiMe_2[Im]_2$, in which Im is imidazolyl); tris(dimethylamino)silane ($SiH[NMe_2]_3$ or 3DMAS); tris(dimethylamino)phenylsilane ($SiPh[NMe_2]_3$); tris(dimethylamino) methylsilane ($SiMe[NMe_2]_3$); tris(dimethylamino)ethylsilane ($SiEt[NMe_2]_3$); tris(ethylmethylamino)silane ($SiH[NEtMe]_3$); tris(diethylamino)silane ($SiH[NEt_2]_3$); tris(iso-propylamino)silane ($SiH[NHiPr]_3$, $C_9H_{25}N_3Si$, or TIPAS); tris(dimethylamino) silylamide ($Si[NMe_2]_3[NH_2]$); tetrakis(dimethylamino)silane ($Si[NMe_2]_4$); tetrakis(ethylmethylamino)silane ($Si[NEtMe]_4$); tetrakis(diethylamino)silane ($Si[NEt_2]_4$); 1,2-diethyl-tetrakis(diethylamino) disilane ($[Et_2N]_2EtSi$-$SiEt[NEt_2]_2$); 1,2-dimethyl-tetrakis(dimethylamino)disilane ($[Me_2N]_2MeSi$-$SiMe[NMe_2]_2$); 1,2-dimethyl-tetrakis(diethylamino)disilane ($[Et_2N]_2MeSi$-$SiMe[NEt_2]_2$); hexakis(methylamino)disilane ($[MeHN]_3Si—Si[NHMe]_3$); hexakis (ethylamino)disilane ($[EtHN]_3Si—Si[NHEt]_3$); hexakis (dimethylamino)disilazane ($Me_2N—Si[NMe_2]_2—Si[NMe_2]_2—NMe_2$), and the like.

Isocyanato Silanes

A silicon-containing precursor can include one or more isocyanato groups, thereby providing a non-limiting isocyanato silane. In one embodiment, the precursor has a formula of $(R')_{4-x}Si(NCO)_x$, wherein:

x is 1, 2, 3, or 4; and each R' is, independently, H, aliphatic, aliphatic-carbonyl, aliphatic-carbonyloxy, aliphatic-oxy, aliphatic-oxycarbonyl, heteroaliphatic, heteroaliphatic-carbonyl, heteroaliphatic-carbonyloxy, heteroaliphatic-oxy, heteroaliphatic-oxycarbonyl, aromatic, aromatic-carbonyl, aromatic-carbonyloxy, aromatic-oxy, aromatic-oxycarbonyl, heteroaromatic, heteroaromatic-oxy, amino, hydrazino, azido, hydroxyl, silyl, silyloxy, cyanato, isocyanato, cyano, or isocyano, in which any of these may be optionally substituted.

In another embodiment, the precursor has a formula of $(R')_zSi(NCO)_x(NR''_2)_y$, wherein:

x is 1, 2, 3, or 4;

each of y and z is, independently, 0, 1, 2, or 3;

$x+y+z=4$;

each R' is, independently, H, aliphatic, aliphatic-carbonyl, aliphatic-carbonyloxy, aliphatic-oxy, aliphatic-oxycarbonyl, heteroaliphatic, heteroaliphatic-carbonyl, heteroaliphatic-carbonyloxy, heteroaliphatic-oxy, heteroaliphatic-oxycarbonyl, aromatic, aromatic-carbonyl, aromatic-carbonyloxy, aromatic-oxy, aromatic-oxycarbonyl, heteroaromatic, heteroaromatic-oxy, amino, hydrazino, azido, hydroxyl, silyl, silyloxy, cyanato, isocyanato, cyano, or isocyano, in which any of these may be optionally substituted; and each R'' is, independently, H, aliphatic, heteroaliphatic, aromatic, heteroaromatic, or amino, in which any of these may be optionally substituted; or optionally in which two R'' can be taken together, with the nitrogen atom to which each is attached, to form an optionally substituted heterocyclyl.

In yet another embodiment, the precursor has a formula of $(NCO)_x(R')_{3-x}Si$-L-$Si(R')_{3-x}(NCO)_x$, wherein:

each x is, independently, 0, 1, 2, or 3;

L is a linker, such as a covalent bond, optionally substituted aliphatic, optionally substituted alkylene, optionally substituted alkenylene, optionally substituted alkynylene, optionally substituted heteroaliphatic, optionally substituted heteroalkylene, optionally substituted heteroalkenylene, optionally substituted heteroalkynylene, optionally substituted aromatic, optionally substituted arylene, optionally substituted heteroaromatic, optionally substituted heteroarylene, oxy (—O—), imino, or silyl; and each R' is, independently, H, aliphatic, aliphatic-carbonyl, aliphatic-carbonyloxy, aliphatic-oxy, aliphatic-oxycarbonyl, heteroaliphatic, heteroaliphatic-carbonyl, heteroaliphatic-carbonyloxy, heteroaliphatic-oxy, heteroaliphatic-oxycarbonyl, aromatic, aromatic-carbonyl, aromatic-carbonyloxy, aromatic-oxy, aromatic-oxycarbonyl, heteroaromatic, heteroaromatic-oxy, amino, hydrazino, azido, hydroxyl, silyl, silyloxy, cyanato, isocyanato, cyano, or isocyano, in which any of these may be optionally substituted.

In some embodiments, R' is H, optionally substituted amino (e.g., —$NR_2$), aliphatic-oxy (e.g., alkoxy or —OR), aliphatic-carbonyl (e.g., alkanoyl or —C(O)R), aliphatic-carbonyloxy (e.g., alkanoyloxy or —OC(O)R), aliphatic-oxycarbonyl (e.g., alkoxycarbonyl or —C(O)OR), silyl (e.g., —$SiR_3$), aliphatic-oxy-silyl (e.g., alkoxysilyl or —Si$(R)_a(OR)_b$), aminosilyl (e.g., —Si$(R)_a(NR_2)_n$), silyloxy (e.g., —O—$SiR_3$), aliphatic-oxy-silyloxy (e.g., alkoxysilyloxy or —O—Si$(R)_a(OR)_b$), aminosilyloxy (e.g., —O—Si$(R)_a(NR_2)_b$), aromatic (e.g., aryl), aromatic-oxy (e.g., aryloxy or —OR), hydroxyl (—OH), formyl (—C(O)H), and the like. In particular embodiments, each R is, independently, H, optionally substituted aliphatic, optionally substituted alkyl, optionally substituted alkenyl, optionally substituted alkynyl, optionally substituted heteroaliphatic, optionally substituted aromatic, optionally substituted aryl, and optionally substituted heteroaromatic; $a \geq 0$; $b \geq 1$; and $a+b=3$. In some embodiments, two R groups can be taken together, with the nitrogen atom to which each is attached, to form an optionally substituted heterocyclyl. In other embodiments, each R is, independently, H, optionally substituted alkyl, optionally substituted alkenyl, optionally substituted alkynyl, or optionally substituted aryl.

In other embodiments, R" is H, optionally substituted aliphatic, optionally substituted heteroaliphatic, optionally substituted alkyl, optionally substituted silyl, or optionally substituted silyloxy. In some embodiments, R" is optionally substituted alkyl (e.g., Me, Et, nPr, iPr, sBu, or tBu). In other embodiments, R" is —$SiR'_3$, —$SiR_3$, —Si$(R')_a(OR)_b$, —Si$(R)_a(OR)_b$, —Si$(R')_a(NR_2)_n$, —Si$(R)_a(NR_2)_b$, —Si$(R')_a(OR)_b(NR_2)_c$, —Si$(R)_a(OR)_b(NR_2)_c$, —O—$SiR'_3$, —O—$SiR_3$, —O—Si$(R')_a(OR)_b$, —O—Si$(R)_a(OR)_b$, —O—Si$(R')_a(NR_2)_b$, —O—Si$(R)_a(NR_2)_b$, —O—Si$(R')_a(OR)_b(NR_2)_c$, or —O—Si$(R)_a(OR)_b(NR_2)_c$ in which each R' is, independently, H, aliphatic, heteroaliphatic, aromatic, heteroaromatic, amino, hydrazino, azido, hydroxyl, silyl, silyloxy, cyanato, isocyanato, cyano, or isocyano, in which any of these may be optionally substituted; each R is, independently, H, optionally substituted aliphatic, optionally substituted heteroaliphatic, optionally substituted aromatic, or optionally substituted heteroaromatic; each of a, b, and $c \geq 0$; and $a+b+c=3$ or $a+b=3$ (if c is not present). In particular embodiments, R is H, optionally substituted alkyl, optionally substituted alkenyl, or optionally substituted alkynyl.

Precursors can include any of the following, e.g., $(R')Si(NCO)(NR''_2)_2$, $(R')_2Si(NCO)(NR''_2)$, $(R')_2Si(NCO)(N[SiR_3]_2)$, or tetraisocyanatosilane ($Si[NCO]_4$). In some embodiments, each of R' and R", independently, can be any described herein (e.g., H, optionally substituted aliphatic, optionally substituted heteroaliphatic, optionally substituted alkyl, optionally substituted alkenyl, or optionally substituted alkynyl). In other embodiments, each R is, independently, H, optionally substituted aliphatic, optionally substituted heteroaliphatic, optionally substituted alkyl, optionally substituted alkenyl, optionally substituted alkynyl, optionally substituted alkoxy, optionally substituted aromatic, optionally substituted heteroaromatic, optionally substituted aryl, or optionally substituted heteroaryl.

Azido Silanes

A silicon-containing precursor can include one or more azido groups, thereby providing a non-limiting azido silane. In one embodiment, the precursor has a formula of $(R')_{4-x}Si(N_3)_x$, wherein:

x is 1, 2, 3, or 4; and each R' is, independently, H, aliphatic, aliphatic-carbonyl, aliphatic-carbonyloxy, aliphatic-oxy, aliphatic-oxycarbonyl, heteroaliphatic, heteroaliphatic-carbonyl, heteroaliphatic-carbonyloxy, heteroaliphatic-oxy, heteroaliphatic-oxycarbonyl, aromatic, aromatic-carbonyl, aromatic-carbonyloxy, aromatic-oxy, aromatic-oxycarbonyl, heteroaromatic, heteroaromatic-oxy, amino, hydrazino, azido, hydroxyl, silyl, silyloxy, cyanato, isocyanato, cyano, or isocyano, in which any of these may be optionally substituted.

In another embodiment, the precursor has a formula of $(R')_zSi(N_3)_x(NR''_2)_y$, wherein:

x is 1, 2, 3, or 4;

each of y and z is, independently, 0, 1, 2, or 3;

$x+y+z=4$;

each R' is, independently, H, aliphatic, aliphatic-carbonyl, aliphatic-carbonyloxy, aliphatic-oxy, aliphatic-oxycarbonyl, heteroaliphatic, heteroaliphatic-carbonyl, heteroaliphatic-carbonyloxy, heteroaliphatic-oxy, heteroaliphatic-oxycarbonyl, aromatic, aromatic-carbonyl, aromatic-carbonyloxy, aromatic-oxy, aromatic-oxycarbonyl, heteroaromatic, heteroaromatic-oxy, amino, hydrazino, azido, hydroxyl, silyl, silyloxy, cyanato, isocyanato, cyano, or isocyano, in which any of these may be optionally substituted; and each R" is, independently, H, aliphatic, heteroaliphatic, aromatic, heteroaromatic, or amino, in which any of these may be optionally substituted; or optionally in which two R" can be taken together, with the nitrogen atom to which each is attached, to form an optionally substituted heterocyclyl.

In yet another embodiment, the precursor has a formula of $(N_3)_x(R')_{3-x}Si\text{-}L\text{-}Si(R')_{3-x}(N_3)_x$, wherein:

each x is, independently, 0, 1, 2, or 3;

L is a linker, such as a covalent bond, optionally substituted aliphatic, optionally substituted alkylene, optionally substituted alkenylene, optionally substituted alkynylene, optionally substituted heteroaliphatic, optionally substituted heteroalkylene, optionally substituted heteroalkenylene, optionally substituted heteroalkynylene, optionally substituted aromatic, optionally substituted arylene, optionally substituted heteroaromatic, optionally substituted heteroarylene, oxy (—O—), imino, or silyl; and each R' is, independently, H, aliphatic, aliphatic-carbonyl, aliphatic-carbonyloxy, aliphatic-oxy, aliphatic-oxycarbonyl, heteroaliphatic, heteroaliphatic-carbonyl, heteroaliphatic-carbonyloxy, heteroaliphatic-oxy, heteroaliphatic-oxycarbonyl, aromatic, aromatic-carbonyl, aromatic-carbonyloxy, aromatic-oxy, aromatic-oxycarbonyl, heteroaromatic, heteroaromatic-oxy, amino, hydrazino, azido, hydroxyl, silyl, silyloxy, cyanato, isocyanato, cyano, or isocyano, in which any of these may be optionally substituted.

In some embodiments, R' is H, optionally substituted amino (e.g., —$NR_2$), aliphatic-oxy (e.g., alkoxy or —OR), aliphatic-carbonyl (e.g., alkanoyl or —C(O)R), aliphatic-carbonyloxy (e.g., alkanoyloxy or —OC(O)R), aliphatic-oxycarbonyl (e.g., alkoxycarbonyl or —C(O)OR), silyl (e.g., $—SiR_3$), aliphatic-oxy-silyl (e.g., alkoxysilyl or $—Si(R)_a(OR)_b$), aminosilyl (e.g., $—Si(R)_a(NR_2)_n$), silyloxy (e.g., $—O—SiR_3$), aliphatic-oxy-silyloxy (e.g., alkoxysilyloxy or $—O—Si(R)_a(OR)_b$), aminosilyloxy (e.g., $—O—Si(R)_a(NR_2)_b$), aromatic (e.g., aryl), aromatic-oxy (e.g., aryloxy or —OR), hydroxyl (—OH), formyl (—C(O)H), and the like. In particular embodiments, each R is, independently, H, optionally substituted aliphatic, optionally substituted alkyl, optionally substituted alkenyl, optionally substituted alkynyl, optionally substituted heteroaliphatic, optionally substituted aromatic, optionally substituted aryl, and optionally substituted heteroaromatic; $a \geq 0$; $b \geq 1$; and $a+b=3$. In some embodiments, two R groups can be taken together, with the nitrogen atom to which each is attached, to form an optionally substituted heterocyclyl. In other embodiments, each R is, independently, H, optionally substituted alkyl, optionally substituted alkenyl, optionally substituted alkynyl, or optionally substituted aryl.

In other embodiments, R" is H, optionally substituted aliphatic, optionally substituted heteroaliphatic, optionally substituted alkyl, optionally substituted silyl, or optionally substituted silyloxy. In some embodiments, R" is optionally substituted alkyl (e.g., Me, Et, nPr, iPr, sBu, or tBu). In other embodiments, R" is $—SiR'_3$, $—SiR_3$, $—Si(R')_a(OR)_b$, $—Si(R)_a(OR)_b$, $—Si(R')_a(NR_2)_b$, $—Si(R)_a(NR_2)_b$, $—Si(R')_a(OR)_b(NR_2)_c$, $—Si(R)_a(OR)_b(NR_2)_c$, $—O—SiR'_3$, $—O—SiR_3$, $—O—Si(R')_a(OR)_b$, $—O—Si(R)_a(OR)_b$, $—O—Si(R')_a(NR_2)_b$, $—O—Si(R)_a(NR_2)_b$, $—O—Si(R')_a(OR)_b(NR_2)_c$, or $—O—Si(R)_a(OR)_b(NR_2)_c$ in which each R' is, independently, H, aliphatic, heteroaliphatic, aromatic, heteroaromatic, amino, hydrazino, azido, hydroxyl, silyl, silyloxy, cyanato, isocyanato, cyano, or isocyano, in which any of these may be optionally substituted; each R is, independently, H, optionally substituted aliphatic, optionally substituted heteroaliphatic, optionally substituted aromatic, or optionally substituted heteroaromatic; each of a, b, and $c \geq 0$; and $a+b+c=3$ or $a+b=3$ (if c is not present). In particular embodiments, R is H, optionally substituted alkyl, optionally substituted alkenyl, or optionally substituted alkynyl.

Precursors can include any of the following, e.g., $(R')_3Si(N_3)$, $(R')_2Si(N_3)_2$, $(R')Si(N_3)_3$, or $Si(N_3)(NR''_2)_3$. In some embodiments, each of R' and R", independently, can be any described herein (e.g., H, optionally substituted aliphatic, optionally substituted heteroaliphatic, optionally substituted alkyl, optionally substituted alkenyl, or optionally substituted alkynyl). Non-limiting examples of precursors also include tris(dimethylamino)silylazide ($[Me_2N]_3SiN_3$); di-tert-butyl diazidosilane ($tBu_2Si(N_3)_2$); ethylsilicon triazide ($EtSi(N_3)_3$); and the like.

Hydrazino Silanes

A silicon-containing precursor can include one or more optionally substituted hydrazino groups, thereby providing a non-limiting hydrazino silane. In one embodiment, the precursor has a formula of $(R')_{4-x}Si(NR''—NR''_2)_x$, wherein:

x is 1, 2, 3, or 4;

each R' is, independently, H, aliphatic, aliphatic-carbonyl, aliphatic-carbonyloxy, aliphatic-oxy, aliphatic-oxycarbonyl, heteroaliphatic, heteroaliphatic-carbonyl, heteroaliphatic-carbonyloxy, heteroaliphatic-oxy, heteroaliphatic-oxycarbonyl, aromatic, aromatic-carbonyl, aromatic-carbonyloxy, aromatic-oxy, aromatic-oxycarbonyl, heteroaromatic, heteroaromatic-oxy, amino, hydrazino, azido, hydroxyl, silyl, silyloxy, cyanato, isocyanato, cyano, or isocyano, in which any of these may be optionally substituted; and each R" is, independently, H, aliphatic, heteroaliphatic, aromatic, heteroaromatic, or amino, in which any of these may be optionally substituted; or optionally in which two R" can be taken together, with the nitrogen atom to which each is attached, to form an optionally substituted heterocyclyl.

In another embodiment, the precursor has a formula of $(NR''_2—NR'')_x(R')_{3-x}Si\text{-}L\text{-}Si(R')_{3-x}(NR''—NR''_2)_x$, wherein:

each x is, independently, 0, 1, 2, or 3;

L is a linker, such as a covalent bond, optionally substituted aliphatic, optionally substituted heteroaliphatic, optionally substituted aromatic, optionally substituted heteroaromatic, oxy (—O—), imino, or silyl;

each R' is, independently, H, aliphatic, aliphatic-carbonyl, aliphatic-carbonyloxy, aliphatic-oxy, aliphatic-oxycarbonyl, heteroaliphatic, heteroaliphatic-carbonyl, heteroaliphatic-carbonyloxy, heteroaliphatic-oxy, heteroaliphatic-oxycarbonyl, aromatic, aromatic-carbonyl, aromatic-carbonyloxy, aromatic-oxy, aromatic-oxycarbonyl, heteroaromatic, heteroaromatic-oxy, amino, hydrazino, azido, hydroxyl, silyl, silyloxy, cyanato, isocyanato, cyano, or isocyano, in which any of these may be optionally substituted; and each R" is, independently, H, aliphatic, heteroaliphatic, aromatic, heteroaromatic, or amino, in which any of these may be optionally substituted; or optionally in which two R" can be taken together, with the nitrogen atom to which each is attached, to form an optionally substituted heterocyclyl.

In yet another embodiment, the precursor has a formula of $(R')_{4-x}Si(NR''\text{-}L\text{-}NR''_2)_x$, wherein: x is 1, 2, 3, or 4; and each L, R', and R" can be any described herein.

In particular embodiments, L is optionally substituted imino, such as —NR—, in which R is H, optionally substituted aliphatic, optionally substituted alkyl, optionally substituted alkenyl, optionally substituted alkynyl, or optionally substituted aromatic. In other embodiments, L is optionally substituted silyl, such as $—SiR_2—$, in which each R is, independently, H, optionally substituted aliphatic, optionally substituted alkyl, optionally substituted alkenyl, optionally substituted alkynyl, or optionally substituted aromatic. In yet other embodiments, L is —NR—NR—, in which R is any described herein (e.g., R is H, optionally substituted aliphatic, optionally substituted alkyl, optionally substituted alkenyl, optionally substituted alkynyl, or optionally substituted aromatic).

In one instance, at least one x is not 0. In another embodiment, x can be 0 (e.g., if L includes a carbon atom or a heteroatom). In yet another embodiment, x is 0; and/or L includes optionally substituted aliphatic, optionally substituted alkylene, optionally substituted alkenylene, optionally substituted alkynylene, optionally substituted heteroaliphatic, optionally substituted heteroalkylene, optionally substituted heteroalkenylene, optionally substituted heteroalkynylene, optionally substituted aromatic, optionally substituted arylene, optionally substituted heteroaromatic, optionally substituted heteroarylene, oxy (—O—), imino, or silyl.

The precursor can include any useful combination of R' and hydrazino groups. In one embodiment, the precursor has a formula of $(R')_3Si(NR''\text{-}L\text{-}NR''_2)$ or $(R')_3Si(NR''—NR''_2)$, wherein L, R', and R" can be any described herein.

The precursor can include a plurality of hydrazino groups. In one embodiment, the precursor has a formula of $(R')_2Si(NR''\text{-}L\text{-}NR''_2)_2$, $(R')_2Si(NR''—NR''_2)_2$, or $(R')_2Si(NH—NHR'')_2$, wherein L, R', and R" can be any described herein.

The precursor can include at least two silicon atoms. In one embodiment, the precursor has a formula of $(NR''_2—NR'')(R')_2Si—Si(R')_2(NR''—NR''_2)$, wherein each R' and R" can be any described herein.

Non-limiting precursors can include bis(tert-butylhydrazino)diethylsilane ($SiEt_2[NH—NHtBu]_2$); tris(dimethylhydrazino)silane ($SiH[NH—NMe_2]_3$); and the like.

Siloxanes and Derivatives Thereof

A silicon-containing precursor can include one or more aliphatic-oxy, aromatic-oxy groups, and/or oxy groups, thereby providing a siloxane or a derivative thereof having one or more Si—O, O—Si—O, or Si—O—Si bonds. In one embodiment, the precursor has a formula of $(R')_{4-x}Si(OR''')_x$, wherein:

x is 1, 2, 3, or 4;

each R' is, independently, H, aliphatic, aliphatic-carbonyl, aliphatic-carbonyloxy, aliphatic-oxy, aliphatic-oxycarbonyl, heteroaliphatic, heteroaliphatic-carbonyl, heteroaliphatic-carbonyloxy, heteroaliphatic-oxy, heteroaliphatic-oxycarbonyl, aromatic, aromatic-carbonyl, aromatic-carbonyloxy, aromatic-oxy, aromatic-oxycarbonyl, heteroaromatic, heteroaromatic-oxy, amino, hydrazino, azido, hydroxyl, silyl, silyloxy, cyanato, isocyanato, cyano, or isocyano, in which any of these may be optionally substituted; and each R''' is, independently, H, aliphatic, heteroaliphatic, aromatic, heteroaromatic, silyl, or silyloxy, in which any of these may be optionally substituted.

In another embodiment, the precursor has a formula of $(R'''O)_x(R')_{3-x}Si\text{-}L\text{-}Si(R')_{3-x}(OR''')_x$, wherein:

each x is, independently, 0, 1, 2, or 3;

L is a linker, such as a covalent bond, optionally substituted aliphatic, optionally substituted heteroaliphatic, optionally substituted aromatic, optionally substituted heteroaromatic, oxy (—O—), imino, or silyl;

each R' is, independently, H, aliphatic, aliphatic-carbonyl, aliphatic-carbonyloxy, aliphatic-oxy, aliphatic-oxycarbonyl, heteroaliphatic, heteroaliphatic-carbonyl, heteroaliphatic-carbonyloxy, heteroaliphatic-oxy, heteroaliphatic-oxycarbonyl, aromatic, aromatic-carbonyl, aromatic-carbonyloxy, aromatic-oxy, aromatic-oxycarbonyl, heteroaromatic, heteroaromatic-oxy, amino, hydrazino, azido, hydroxyl, silyl, silyloxy, cyanato, isocyanato, cyano, or isocyano, in which any of these may be optionally substituted; and each R''' is, independently, H, aliphatic, heteroaliphatic, aromatic, heteroaromatic, silyl, or silyloxy, in which any of these may be optionally substituted.

In particular embodiments, L is optionally substituted imino, such as —NR—, in which R is H, optionally substituted aliphatic, optionally substituted alkyl, optionally substituted alkenyl, optionally substituted alkynyl, or optionally substituted aromatic. In other embodiments, L is optionally substituted silyl, such as $—SiR_2—$, in which each R is, independently, H, optionally substituted aliphatic, optionally substituted alkyl, optionally substituted alkenyl, optionally substituted alkynyl, or optionally substituted aromatic. In other embodiments, L is —O-L'-O—, in which L' is optionally substituted aliphatic, optionally substituted heteroaliphatic, optionally substituted aromatic, optionally substituted heteroaromatic, optionally substituted silyl (e.g., $—SiR_2—$), optionally substituted alkylene (e.g., $—(CH_2)_n—$, in which n is 1 to 6), optionally substituted arylene, and the like. In yet other embodiments, L is oxy.

In one instance, at least one x is not 0. In another embodiment, x can be 0 (e.g., if L includes a carbon atom or a heteroatom). In yet another embodiment, x is 0; and/or L includes optionally substituted aliphatic, optionally substituted alkylene, optionally substituted alkenylene, optionally substituted alkynylene, optionally substituted heteroaliphatic, optionally substituted heteroalkylene, optionally substituted heteroalkenylene, optionally substituted heteroalkynylene, optionally substituted aromatic, optionally substituted arylene, optionally substituted heteroaromatic, optionally substituted heteroarylene, oxy (—O—), imino, or silyl.

In some embodiments, R' is H, optionally substituted amino (e.g., $—NR_2$), aliphatic-oxy (e.g., alkoxy or —OR), aliphatic-carbonyl (e.g., alkanoyl or —C(O)R), aliphatic-carbonyloxy (e.g., alkanoyloxy or —OC(O)R), aliphatic-oxycarbonyl (e.g., alkoxycarbonyl or —C(O)OR), silyl (e.g., $—SiR_3$), aliphatic-oxy-silyl (e.g., alkoxysilyl or $—Si(R)_a(OR)_b$), aminosilyl (e.g., $—Si(R)_a(NR_2)_b$), silyloxy (e.g., $—O—SiR_3$), aliphatic-oxy-silyloxy (e.g., alkoxysilyloxy or $—O—Si(R)_a(OR)_b$), aminosilyloxy (e.g., $—O—Si(R)_a(NR_2)_b$), aromatic (e.g., aryl), aromatic-oxy (e.g., aryloxy or —OR), hydroxyl (—OH), formyl (—C(O)H), and the like. In particular embodiments, each R is, independently, H, optionally substituted aliphatic, optionally substituted alkyl, optionally substituted alkenyl, optionally substituted alkynyl, optionally substituted heteroaliphatic, optionally substituted aromatic, optionally substituted aryl, and optionally substituted heteroaromatic; $a \geq 0$; $b \geq 1$; and $a+b=3$. In some embodiments, two R groups can be taken together, with the nitrogen atom to which each is attached, to form an optionally substituted heterocyclyl. In other embodiments, each R is, independently, H, optionally substituted alkyl, optionally substituted alkenyl, optionally substituted alkynyl, or optionally substituted aryl.

In other embodiments, R''' is H, optionally substituted aliphatic, optionally substituted heteroaliphatic, optionally substituted alkyl, optionally substituted silyl, or optionally substituted silyloxy. In some embodiments, R''' is optionally substituted alkyl (e.g., Me, Et, nPr, iPr, sBu, or tBu). In other embodiments, R''' is $—SiR'_3$, $—SiR_3$, $—Si(R')_a(OR)_b$, $—Si(R)_a(OR)_b$, $—Si(R')_a(NR_2)_b$, $—Si(R)_a(NR_2)_b$, $—Si(R')_a(OR)_b(NR_2)_c$, $—Si(R)_a(OR)_b(NR_2)_c$, $—O—SiR'_3$, $—O—SiR_3$, $—O—Si(R')_a(OR)_b$, $—O—Si(R)_a(OR)_b$, $—O—Si(R')_a(NR_2)_b$, $—O—Si(R)_a(NR_2)_b$, $—O—Si(R')_a(OR)_b(NR_2)_c$, or $—O—Si(R)_a(OR)_b\,(NR_2)_c$ in which each R' is, independently, H, aliphatic, heteroaliphatic, aromatic, heteroaromatic, amino, hydrazino, azido, hydroxyl, silyl, silyloxy, cyanato, isocyanato, cyano, or isocyano, in which any of these may be optionally substituted; each R is, independently, H, optionally substituted aliphatic, optionally substituted heteroaliphatic, optionally substituted aromatic, or optionally substituted heteroaromatic; each of a, b, and $c \geq 0$; and $a+b+c=3$ or $a+b=3$ (if c is not present). In particular embodiments, R is H, optionally substituted alkyl, optionally substituted alkenyl, or optionally substituted alkynyl.

The precursor can include one or more hydrogen atoms attached to the silicon atom. In one embodiment, the precursor has a formula of $H_3Si(OR''')$, $H_2Si(OR''')_2$, or $HSi(OR''')_3$, wherein each R''' can independently be any described herein.

The precursor can include any combination of R' and OR''' groups within the precursor. In one embodiment, the precursor has a formula of $(R')_3Si(OR''')$, $(R')_2Si(OR''')_2$, or $(R')Si(OR''')_3$, wherein each of R' and R''' can independently be any described herein. The precursor can include alkyl groups, such as in the precursor having a formula of $(R^{Ak})_3Si(OR^{Ak})$, $(R^{Ak})_2Si(OR^{Ak})_2$, or $(R^{Ak})Si(OR^{Ak})_3$, in which $R^{Ak}$ is optionally substituted alkyl.

In some instances, the precursor can have two or more silicon atoms, in which the precursor can include a Si—Si bond. In a particular embodiment, the precursor has a formula of $(R'''O)_x(R')_{3-x}Si—Si(R')_{3-x}(OR''')_x$, wherein R' and R''' can be any described herein. In one embodiment, the precursor has a formula of $(R'''O)(R')_2Si—Si(R')_2(OR''')$, wherein R' and R''' can be any described herein.

The precursor can include a combination of R' groups with a linker having a heteroatom. In one instance, the precursor has a formula of $(R')_3Si—O—Si(R')_3$, wherein R' can be any described herein. In another instance, the precursor has a formula of $(R')_3Si—O-L'-O—Si(R')_3$, wherein L' and R' can be any described herein. In yet another instance, the precursor has a formula of $(R')_3Si—(OSiR'_2)_z—R'$, wherein R' can be any described herein; and in which z is 1, 2, 3, 4, or more. In another instance, the precursor has a formula of $(R')_{4-x}Si—[(OSiR'_2)_z—R']_x$, wherein R' can be any described herein; x is 1, 2, 3, or 4; and z is 1, 2, 3, 4, or more.

The precursor can include any useful combination of R' and OR''' groups in combination with two silicon atoms. In one instance, the precursor has a formula of $(R'''O)_x(R')_{3-x}Si—O—Si(R')_{3-x}(OR''')_x$, wherein R' and R''' can be any described herein. In another instance, the precursor has a formula of $(R'''O)_x(R')_{3-x}Si—O-L'-O—Si(R')_{3-x}(OR''')_x$, wherein L', R', and R''' can be any described herein.

Non-limiting precursors can include methoxydimethylsilane ($SiHMe_2[OMe]$); ethoxydimethylsilane ($SiHMe_2[OEt]$); iso-propoxydimethylsilane ($SiHMe_2[OiPr]$); t-butoxydimethylsilane ($SiHMe_2[OtBu]$); t-pentoxydimethylsilane ($SiHMe_2[OtPe]$); phenoxy dimethylsilane ($SiHMe_2[OPh]$); acetoxydimethylsilane ($SiHMe_2[OAc]$); methoxytrimethylsilane ($SiMe_3[OMe]$); ethoxytrimethylsilane ($SiMe_3[OEt]$); iso-propoxytrimethylsilane ($SiMe_3[OiPr]$); t-butoxytrimethylsilane ($SiMe_3[OtBu]$); t-pentoxytrimethylsilane ($SiMe_3[OtPe]$); phenoxy trimethylsilane ($SiMe_3[OPh]$); acetoxytrimethylsilane ($SiMe_3[OAc]$); methoxytriethylsilane ($SiEt_3[OMe]$); ethoxytriethylsilane ($SiEt_3[OEt]$); iso-propoxytriethylsilane ($SiEt_3[OiPr]$); t-butoxytriethylsilane ($SiEt_3[OtBu]$); t-pentoxytriethylsilane ($SiEt_3[OtPe]$); phenoxytriethylsilane ($SiEt_3[OPh]$); acetoxytriethylsilane ($SiEt_3[OAc]$); dimethoxysilane ($SiH_2[OMe]_2$); diethoxysilane ($SiH_2[OEt]_2$); di-iso-propoxysilane ($SiH_2[OPr]_2$); di-tert-butoxysilane ($SiH_2[OtBu]_2$ or DTBOS); di-tert-pentoxysilane ($SiH_2[OtPe]_2$ or DTPOS); diacetoxysilane ($SiH_2[OAc]_2$); dimethoxy dimethylsilane ($SiMe_2[OMe]_2$); diethoxydimethylsilane ($SiMe_2[OEt]_2$); di-iso-propoxy dimethylsilane ($SiMe_2[OPr]_2$); di-tert-butoxydimethylsilane ($SiMe_2[OtBu]_2$); diacetoxy dimethylsilane ($SiMe_2[OAc]_2$); dimethoxydiethylsilane ($SiEt_2[OMe]_2$); diethoxydiethylsilane ($SiEt_2[OEt]_2$); di-iso-propoxydiethylsilane ($SiEt_2[OiPr]_2$); di-tert-butoxydiethylsilane ($SiEt_2[OtBu]_2$); diacetoxydiethylsilane ($SiEt_2[OAc]_2$); dimethoxydiphenylsilane ($SiPh_2[OMe]_2$); dimethoxydi-iso-propylsilane ($Si[iPr]_2[OMe]_2$); diethoxydi-iso-propylsilane ($Si[iPr]_2[OEt]_2$); di-iso-propoxydi-iso-propylsilane ($Si[iPr]_2[OiPr]_2$); di-tert-butoxydi-iso-propylsilane ($Si[iPr]_2[OtBu]_2$); diacetoxydi-iso-propylsilane ($Si[iPr]_2[OAc]_2$); dimethoxymethylvinylsilane ($SiMeVi[OMe]_2$); diethoxymethylvinylsilane ($SiMeVi[OEt]_2$); di-iso-propoxymethylvinylsilane ($SiMeVi[OiPr]_2$); di-tert-butoxymethylvinylsilane ($SiMeVi[OtBu]_2$); diacetoxymethylvinylsilane ($SiMeVi[OAc]_2$); triethoxysilane ($SiH[OEt]_3$ or TES); trimethoxyethylsilane ($SiEt[OMe]_3$); triethoxymethylsilane ($SiMe[OEt]_3$); triethoxyphenylsilane ($SiPh[OEt]_3$); tetramethoxysilane ($Si[OMe]_4$); tetraethoxysilane ($Si[OEt]_4$ or TEOS); tetra-n-propoxysilane ($Si[OnPr]_4$); tetra-iso-propoxysilane ($Si[OiPr]_4$); tetra-n-butoxysilane ($Si[OnBu]_4$); tetra-t-butoxysilane ($Si[OtBu]_4$); tetramethyldisiloxane ($O[SiHMe_2]_2$ or TMDO); hexamethyldisiloxane ($O[SiMe_3]_2$); hexaethyldisiloxane ($O[SiEt_3]_2$); hexapropyldisiloxane ($O[SiPr_3]_2$); hexaphenyldisiloxane ($O[SiPh_3]_2$); hexamethyltrisiloxane ($Me_2SiH—O—SiMe_2-O—SiHMe_2$); and the like.

Mixed Silanes Including Oxygen and Nitrogen

A silicon-containing precursor can include one or more optionally substituted amino groups with either aliphatic-oxy or aromatic-oxy groups, thereby providing a non-limiting mixed silane. In one embodiment, the precursor has a formula of $(R')_zSi(OR''')_x(NR''_2)_y$, wherein:

each of x and y is, independently, 1, 2, 3, or 4;

z is 0, 1, or 2;

$x+y+z=4$;

each R' is, independently, H, aliphatic, aliphatic-carbonyl, aliphatic-carbonyloxy, aliphatic-oxy, aliphatic-oxycarbonyl, heteroaliphatic, heteroaliphatic-carbonyl, heteroaliphatic-carbonyloxy, heteroaliphatic-oxy, heteroaliphatic-oxycarbonyl, aromatic, aromatic-carbonyl, aromatic-carbonyloxy, aromatic-oxy, aromatic-oxycarbonyl, heteroaromatic, heteroaromatic-oxy, amino, hydrazino, azido, hydroxyl, silyl, silyloxy, cyanato, isocyanato, cyano, or isocyano, in which any of these may be optionally substituted;

each R'' is, independently, H, aliphatic, heteroaliphatic, aromatic, heteroaromatic, or amino, in which any of these may be optionally substituted; or optionally in which two R'' can be taken together, with the nitrogen atom to which each is attached, to form an optionally substituted heterocyclyl; and each R''' is, independently, H, aliphatic, heteroaliphatic, aromatic, heteroaromatic, silyl, or silyloxy, in which any of these may be optionally substituted.

In another embodiment, the precursor has a formula of $(R''_2N)_y(R'''O)_x(R')_zSi-L-Si(R')_z(OR''')_x(NR''_2)_y$, wherein:

each of x and y is more than 0 (e.g., 1 or 2);

z is 0 or 1;

$x+y+z=3$;

L is a linker, such as a covalent bond, optionally substituted aliphatic, optionally substituted alkylene, optionally substituted alkenylene, optionally substituted alkynylene, optionally substituted heteroaliphatic, optionally substituted heteroalkylene, optionally substituted heteroalkenylene, optionally substituted heteroalkynylene, optionally substituted aromatic, optionally substituted arylene, optionally substituted heteroaromatic, optionally substituted heteroarylene, oxy (—O—), imino, or silyl;

each R' is, independently, H, aliphatic, aliphatic-carbonyl, aliphatic-carbonyloxy, aliphatic-oxy, aliphatic-oxycarbonyl, heteroaliphatic, heteroaliphatic-carbonyl, heteroaliphatic-carbonyloxy, heteroaliphatic-oxy, heteroaliphatic-oxycarbonyl, aromatic, aromatic-carbonyl, aromatic-carbonyloxy, aromatic-oxy, aromatic-oxycarbonyl, heteroaromatic, heteroaromatic-oxy, amino, hydrazino, azido, hydroxyl, silyl, silyloxy, cyanato, isocyanato, cyano, or isocyano, in which any of these may be optionally substituted;

each R'' is, independently, H, aliphatic, heteroaliphatic, aromatic, heteroaromatic, or amino, in which any of these may be optionally substituted; or optionally in which two R'' can be taken together, with the nitrogen atom to which each is attached, to form an optionally substituted heterocyclyl; and each R''' is, independently, H, aliphatic, heteroaliphatic, aromatic, heteroaromatic, silyl, or silyloxy, in which any of these may be optionally substituted.

Non-limiting examples of R', R'', and R''' are described herein, e.g., such as for amino silane, siloxane, or derivatives thereof.

The precursor can include any combination of R', $NR''_2$, and OR''' groups. In one embodiment, the precursor has a formula of $(R')Si(OR''')_2(NR''_2)$ or $(R')_2Si(OR''')_2(NR''_2)$, wherein each of R', R'', and R''' can independently be any described herein. In other embodiments, the precursor has a formula of $(R')_2Si(OR''')(N[SiR_3]_2)$, wherein each of R' and R''' can independently be any described herein; and R is, independently, H, optionally substituted aliphatic, optionally substituted heteroaliphatic, optionally substituted aromatic, or optionally substituted heteroaromatic.

The precursor can include only amino and oxy-containing groups attached to the silicon atom. In one embodiment, the precursor has a formula of $Si(OR'')_3(NR''_2)$, $Si(OR'')_2(NR''_2)_2$, or $Si(OR'')(NR''_2)_3$, wherein each of R'' and R''' can independently be any described herein. Non-limiting precursors can include, e.g., diethoxy(iso-propylamino)silane ($SiH[NHiPr][OEt]_2$); diethoxy(tert-butylamino)silane ($SiH[NHtBu][OEt]_2$); diethoxy(tert-pentylamino)silane ($SiH[NHMe][OtBu]_2$); di-tert-($SiH[NHtPe][OEt]_2$); di-tert-butoxy(methylamino)silane butoxy(ethylamino)silane ($SiH[NHEt][OtBu]_2$); di-tert-butoxy(iso-propylamino)silane ($SiH[NHiPr][OtBu]_2$); di-tert-butoxy(n-butylamino)silane ($SiH[NHnBu][OtBu]_2$); di-tert-butoxy(sec-butylamino)silane ($SiH[NHsBu][OtBu]_2$); di-tert-butoxy(iso-butylamino) silane ($SiH[NHiBu][OtBu]_2$); di-tert-butoxy(tert-butylamino)silane ($SiH[NHtBu][OtBu]_2$); di-tert-pentoxy (methylamino)silane ($SiH[NHMe][OtPe]_2$); di-tert-pentoxy (ethylamino)silane ($SiH[NHEt][OtPe]_2$); di-tert-pentoxy (iso-propylamino)silane ($SiH[NHiPr][OtPe]_2$); di-tert-pentoxy(n-butylamino)silane ($SiH[NHnBu][OtPe]_2$); di-tert-pentoxy(sec-butylamino)silane ($SiH[NHsBu][OtPe]_2$); di-tert-pentoxy(iso-butylamino)silane ($SiH[NHiBu][OtPe]_2$); di-tert-pentoxy(tert-butylamino)silane ($SiH[NHtBu][OtPe]_2$); dimethoxy(phenylmethylamino)silane ($SiH[NPhMe][OMe]_2$); diethoxy(phenylmethylamino)silane ($SiH[NPhMe][OEt]_2$); dimethoxy(phenylmethylamino) methylsilane ($SiMe[NPhMe][OMe]_2$); diethoxy(phenylmethylamino)ethylsilane ($SiEt[NPhMe][OEt]_2$); and the like.

Silyl Amines

A silicon-containing precursor can include one or more optionally substituted silyl groups attached to a nitrogen atom, thereby providing a non-limiting silyl amine. In one embodiment, the precursor has a formula of $(R'')_{3-y}N(SiR'_3)_y$, wherein:

y is 1, 2, or 3;

each R' is, independently, H, aliphatic, aliphatic-carbonyl, aliphatic-carbonyloxy, aliphatic-oxy, aliphatic-oxycarbonyl, heteroaliphatic, heteroaliphatic-carbonyl, heteroaliphatic-carbonyloxy, heteroaliphatic-oxy, heteroaliphatic-oxycarbonyl, aromatic, aromatic-carbonyl, aromatic-carbonyloxy, aromatic-oxy, aromatic-oxycarbonyl, heteroaromatic, heteroaromatic-oxy, amino, hydrazino, azido, hydroxyl, silyl, silyloxy, cyanato, isocyanato, cyano, or isocyano, in which any of these may be optionally substituted; and each R'' is, independently, H, aliphatic, heteroaliphatic, aromatic, heteroaromatic, amino, silyl, or silyloxy, in which any of these may be optionally substituted; or optionally in which two R'' can be taken together, with the nitrogen atom to which each is attached, to form an optionally substituted heterocyclyl.

In another embodiment, the precursor has a formula of $(R'_3Si)_y(R'')_{2-y}N\text{-}L\text{-}N(R'')_{2-y}(SiR'_3)_y$, wherein:

each y is, independently, 0, 1, or 2;

L is a linker, such as a covalent bond, optionally substituted aliphatic, optionally substituted heteroaliphatic, optionally substituted aromatic, optionally substituted heteroaromatic, oxy (—O—), imino, or silyl;

each R' is, independently, H, aliphatic, aliphatic-carbonyl, aliphatic-carbonyloxy, aliphatic-oxy, aliphatic-oxycarbonyl, heteroaliphatic, heteroaliphatic-carbonyl, heteroaliphatic-carbonyloxy, heteroaliphatic-oxy, heteroaliphatic-oxycarbonyl, aromatic, aromatic-carbonyl, aromatic-carbonyloxy, aromatic-oxy, aromatic-oxycarbonyl, heteroaromatic, heteroaromatic-oxy, amino, hydrazino, azido, hydroxyl, silyl, silyloxy, cyanato, isocyanato, cyano, or isocyano, in which any of these may be optionally substituted; and each R'' is, independently, H, aliphatic, heteroaliphatic, aromatic, heteroaromatic, or amino, in which any of these may be optionally substituted; or optionally in which two R'' can be taken together, with the nitrogen atom to which each is attached, to form an optionally substituted heterocyclyl, optionally in which N-L-N, taken together, forms a multivalent heterocyclyl group.

In one instance, at least one y is not 0. In another embodiment, y can be 0 (e.g., if L includes a carbon atom or a heteroatom). In yet another embodiment, y is 0; and/or L includes optionally substituted aliphatic, optionally substituted alkylene, optionally substituted alkenylene, optionally substituted alkynylene, optionally substituted heteroaliphatic, optionally substituted heteroalkylene, optionally substituted heteroalkenylene, optionally substituted heteroalkynylene, optionally substituted aromatic, optionally substituted arylene, optionally substituted heteroaromatic, optionally substituted heteroarylene, oxy (—O—), imino (e.g., —NR— or —$N(SiR_3)$—), or silyl (e.g., —$SiR_2$—), as well as combinations thereof (e.g., —$SiR_2$—NR—, —NR—$SiR_2$—, —$SiR_2$—NR—$SiR_2$—, and the like). In particular embodiments, each R is, independently, H, optionally substituted aliphatic, optionally substituted alkyl, optionally substituted alkenyl, optionally substituted alkynyl, optionally substituted heteroaliphatic, optionally substituted aromatic, optionally substituted aryl, and optionally substituted heteroaromatic.

In some embodiments, R' is H, optionally substituted amino (e.g., —$NR_2$), aliphatic-oxy (e.g., alkoxy or —OR), aliphatic-carbonyl (e.g., alkanoyl or —C(O)R), aliphatic-carbonyloxy (e.g., alkanoyloxy or —OC(O)R), aliphatic-oxycarbonyl (e.g., alkoxycarbonyl or —C(O)OR), silyl (e.g., —$SiR_3$ or —$SiR_2$-L-$SiR_3$), aliphatic-oxy-silyl (e.g., alkoxysilyl or —$Si(R)_a(OR)_b$), aminosilyl (e.g., —$Si(R)_a(NR_2)_b$), silyloxy (e.g., —O—$SiR_3$), aliphatic-oxy-silyloxy (e.g., alkoxysilyloxy or —O—$Si(R)_a(OR)_b$), aminosilyloxy (e.g., —O—$Si(R)_a(NR_2)_b$), aromatic (e.g., aryl), aromatic-oxy (e.g., aryloxy or —OR), hydroxyl (—OH), formyl (—C(O)H), and the like. In particular embodiments, each R is, independently, H, optionally substituted aliphatic, optionally substituted alkyl, optionally substituted alkenyl, optionally substituted alkynyl, optionally substituted heteroaliphatic, optionally substituted aromatic, optionally substituted aryl, and optionally substituted heteroaromatic; $a \geq 0$; $b \geq 1$; and $a+b=3$. In some embodiments, two R groups can be taken together, with the nitrogen atom to which each is attached, to form an optionally substituted heterocyclyl. In other embodiments, each R is, independently, H, optionally substituted alkyl, optionally substituted alkenyl, optionally substituted alkynyl, or optionally substituted aryl. L can be any useful linker (e.g., a covalent bond, optionally substituted alkylene, optionally substituted heteroalkylene, oxy, imino, silyl, or the like).

In other embodiments, R" is H, optionally substituted aliphatic, optionally substituted heteroaliphatic, optionally substituted alkyl, optionally substituted silyl, or optionally substituted silyloxy. In some embodiments, R" is optionally substituted alkyl (e.g., Me, Et, nPr, iPr, sBu, or tBu). In other embodiments, R" is —SiR'$_3$, —SiR$_3$, —Si(R')$_a$(OR)$_b$, —Si(R)$_a$(OR)$_b$, —Si(R')$_a$(NR$_2$)$_b$, —Si(R)$_a$(NR$_2$)$_b$, —Si(R')$_a$(OR)$_b$(NR$_2$)$_c$, —Si(R)$_a$(OR)$_b$(NR$_2$)$_c$, —O—SiR'$_3$, —O—SiR$_3$, —O—Si(R')$_a$(OR)$_b$, —O—Si(R)$_a$(OR)$_b$, —O—Si(R')$_a$(NR$_2$)$_b$, —O—Si(R)$_a$(NR$_2$)$_b$, —O—Si(R')$_a$(OR)$_b$(NR$_2$)$_c$, or —O—Si(R)$_a$(OR)$_b$(NR$_2$)$_c$ in which each R' is, independently, H, aliphatic, heteroaliphatic, aromatic, heteroaromatic, amino, hydrazino, azido, hydroxyl, silyl, silyloxy, cyanato, isocyanato, cyano, or isocyano, in which any of these may be optionally substituted; each R is, independently, H, optionally substituted aliphatic, optionally substituted heteroaliphatic, optionally substituted aromatic, or optionally substituted heteroaromatic; each of a, b, and c≥0; and a+b+c=3 or a+b=3 (if c is not present). In particular embodiments, R is H, optionally substituted alkyl, optionally substituted alkenyl, or optionally substituted alkynyl.

The precursor can include at least one R" group attached to the nitrogen atom. In one embodiment, the precursor has a formula of (R")N(SiR'$_3$)$_2$ or (R")$_2$N(SiR'$_3$), wherein R' and R" can be any described herein. In another embodiment, the precursor has a formula of (R")$_2$N(SiH$_3$) or (R")N(SiH$_3$)$_2$, wherein R" can be any described herein. In particular embodiments, R' is optionally substituted alkyl, amino, or alkoxy; and R" is optionally substituted alkyl or amino, optionally wherein two R" are taken together, with the nitrogen atom to which each are attached, to form a heterocyclyl.

The precursor can include at least one hydrogen atom attached to the nitrogen atom. In one embodiment, the precursor has a formula of (H)N(SiR'$_3$)$_2$, wherein R' can be any described herein. In another embodiment, the precursor has a formula of (H)N(SiR$^{Ak}_3$)$_2$, wherein R$^{Ak}$ can be optionally substituted aliphatic, optionally substituted alkyl, optionally substituted alkenyl, or optionally substituted alkynyl.

The precursor can include three silicon atoms attached to the nitrogen atom. In one embodiment, the precursor has a formula of N(SiR'$_3$)$_3$, wherein R' can be any described herein. In another embodiment, the precursor has a formula of N(SiH$_3$)(SiR'$_3$)$_2$, wherein R' can be any described herein. In yet another embodiment, the precursor has a formula of N(SiH$_3$)(SiR$^{Ak}_3$)$_2$, wherein R$^{Ak}$ can be optionally substituted aliphatic, optionally substituted alkyl, optionally substituted alkenyl, or optionally substituted alkynyl.

The precursor can have two or more nitrogen atoms, in which the precursor includes a N—N bond. In one instance, the precursor has a formula of (R'$_3$Si)$_2$N—N(SiR'$_3$)$_2$, wherein R' can be any described herein.

A linker can be present between nitrogen atoms. In one instance, the precursor has a formula of (R'$_3$Si)(R")N-L-N(R")(SiR'$_3$) or (R'$_3$Si)$_2$N-L-N(SiR'$_3$)$_2$, wherein R' and R" can be any described herein. In some embodiments, L is a covalent bond, optionally substituted alkylene, optionally substituted heteroalkylene, —O—, —SiR$_2$—, or —Si—. In particular embodiments, at least one of R" is not H. In another instance, the precursor has a formula of (H$_3$Si)(R")N-L-N(R")(SiH$_3$), wherein R" can be any described herein.

The linker can include a silicon atom. In one instance, the precursor has a formula of (R'$_3$Si)$_2$N—SiR'$_2$—N(SiR'$_3$)$_2$, wherein R' can be any described herein. In another instance, the precursor has a formula of (R'$_3$Si)(R")N—SiR'$_2$—N(R")(SiR'$_3$) or (R'$_3$Si)$_2$N—SiR'$_2$—N(R")$_2$, wherein R' and R" can be any described herein.

The linker can include a SiH$_2$ group. In one instance, the precursor has a formula of (R'$_3$Si)$_2$N—SiH$_2$—N(SiR'$_3$)$_2$, wherein R' can be any described herein. In another instance, the precursor has a formula of (R'$_3$Si)HN—SiH$_2$—NH(SiR'$_3$) or (R'$_3$Si)$_2$N—SiH$_2$—N(R")$_2$, wherein R' and R" can be any described herein.

A plurality of nitrogen- and silicon-containing moieties may be present within the precursor. In one embodiment, the precursor has a formula of (R'$_3$Si)(R")N—SiR'$_2$—N(R")—SiR'$_2$—N(R")(SiR'$_3$), wherein R' and R" can be any described herein.

Non-limiting precursors can include, e.g., 1,1,3,3-tetramethyldisilazane (NH[SiHMe$_2$]$_2$ or TMDS); 1,1,2,3,3-pentamethyldisilazane (NMe[SiHMe$_2$]$_2$); 1,1,1,3,3,3-hexamethyldisilazane (NH[SiMe$_3$]$_2$ or HMDS); heptamethyldisilazane (NMe[SiMe$_3$]$_2$); 1,1,1,3,3,3-hexamethyl-2-ethyldisilazane (NEt[SiMe$_3$]$_2$); 1,1,1,3,3,3-hexamethyl-2-isopropyldisilazane (NiPr[SiMe$_3$]$_2$); 1,1,1,3,3,3-hexaethyl-2-isopropyldisilazane (NiPr[SiEt$_3$]$_2$); 1,1,3,3-tetramethyl-2-isopropyl disilazane (NiPr[SiHMe$_2$]$_2$); 1,1,3,3-tetraethyl-2-isopropyldisilazane (NiPr [SiHEt$_2$]$_2$); 1,3-diethyltetramethyldisilazane (NH[SiMe$_2$Et]$_2$); 1,1,3,3-tetraethyldisilazane (NH[SiHEt$_2$]$_2$); 1,1,3,3-tetraethyl-2-methyldisilazane (NMe[SiHEt$_2$]$_2$); 1,1,1,3,3,3-hexaethyldisilazane (NH[SiEt$_3$]$_2$); 1,1,1,3,3,3-hexaethyl-2-methyldisilazane (NMe[SiEt$_3$]$_2$); 1,1,1,2,3,3,3-heptaethyldisilazane (NEt[SiEt$_3$]$_2$); 1,2,3-trimethyltrisilazane (N[SiH$_2$Me]$_3$); nonamethyltrisilazane (N[SiMe$_3$]$_3$); di-iso-propylsilylamine (NiPr$_2$[SiH$_3$]); diethylsilylamine (NEt$_2$[SiH$_3$]); di-sec-butylsilylamine (NsBu$_2$[SiH$_3$]); di-tert-butylsilylamine (NtBu$_2$[SiH$_3$]); disilylmethylamine (NMe[SiH$_3$]$_2$); disilylethylamine (NEt[SiH$_3$]$_2$); disilylisopropylamine (NiPr[SiH$_3$]$_2$); disilyl-tert-butylamine (NtBu[SiH$_3$]$_2$); bis(trimethylsilyl) amine (NH[SiMe$_3$]$_2$); bis(triethylsilyl)amine (NH[SiEt$_3$]$_2$); and the like.

Silazanes and Derivatives Thereof

A silicon-containing precursor can include one or more amino, silyl, and/or imino groups, thereby providing a silazane or a derivative thereof having one or more Si—N, N—Si—N, Si—N—Si, N—Si—Si, or N—Si—N—Si bonds. In one embodiment, the precursor has a formula of (R")$_{3-y}$N(SiR'$_2$-L-SiR'$_3$)$_y$, wherein:

y is 1, 2, or 3;

L is a linker, such as a covalent bond, optionally substituted aliphatic, optionally substituted heteroaliphatic, optionally substituted aromatic, optionally substituted heteroaromatic, oxy (—O—), imino, or silyl, as well as combinations thereof;

each R' is, independently, H, aliphatic, aliphatic-carbonyl, aliphatic-carbonyloxy, aliphatic-oxy, aliphatic-oxycarbonyl, heteroaliphatic, heteroaliphatic-carbonyl, heteroaliphatic-carbonyloxy, heteroaliphatic-oxy, heteroaliphatic-oxycarbonyl, aromatic, aromatic-carbonyl, aromatic-carbonyloxy, aromatic-oxy, aromatic-oxycarbonyl, heteroaromatic, heteroaromatic-oxy, amino, hydrazino, azido, hydroxyl, silyl, silyloxy, cyanato, isocyanato, cyano, or isocyano, in which any of these may be optionally substituted; and each R" is, independently, H, aliphatic, heteroaliphatic, aromatic, heteroaromatic, amino, silyl, or silyloxy, in which any of these may be optionally substituted; or optionally in which two R" can be taken together, with the nitrogen atom to which each is attached, to form an optionally substituted heterocyclyl.

In another embodiment, the precursor has a formula of $(R'')_{3-y}N(SiR'_2\text{-L-}SiR'_2—NR''_2)_y$, wherein y is 1, 2, or 3; and each of L, R', and R'' can be any described herein.

In yet another embodiment, the precursor has a formula of $(R'')_{3-y}N(SiR'_2\text{-L-}NR''_2)_y$, wherein y is 1, 2, or 3; and each of L, R', and R'' can be any described herein.

In one embodiment, the precursor has a formula of $(R')_{4-x}Si(NR''\text{-L-}SiR'_3)_x$, wherein:

x is 1, 2, 3, or 4;

L is a linker, such as a covalent bond, optionally substituted aliphatic, optionally substituted heteroaliphatic, optionally substituted aromatic, optionally substituted heteroaromatic, oxy (—O—), imino, or silyl, as well as combinations thereof;

each R' is, independently, H, aliphatic, aliphatic-carbonyl, aliphatic-carbonyloxy, aliphatic-oxy, aliphatic-oxycarbonyl, heteroaliphatic, heteroaliphatic-carbonyl, heteroaliphatic-carbonyloxy, heteroaliphatic-oxy, heteroaliphatic-oxycarbonyl, aromatic, aromatic-carbonyl, aromatic-carbonyloxy, aromatic-oxy, aromatic-oxycarbonyl, heteroaromatic, heteroaromatic-oxy, amino, hydrazino, azido, hydroxyl, silyl, silyloxy, cyanato, isocyanato, cyano, or isocyano, in which any of these may be optionally substituted; and each R'' is, independently, H, aliphatic, heteroaliphatic, aromatic, heteroaromatic, amino, silyl, or silyloxy, in which any of these may be optionally substituted; or optionally in which two R'' can be taken together, with the nitrogen atom to which each is attached, to form an optionally substituted heterocyclyl.

In another embodiment, the precursor has a formula of $(R''_2N)—(SiR'_2\text{-L})_z\text{-}SiR'_3$, wherein z is 1, 2, or 3; and each of L, R', and R'' can be any described herein.

In some embodiments, L includes optionally substituted aliphatic, optionally substituted alkylene, optionally substituted alkenylene, optionally substituted alkynylene, optionally substituted heteroaliphatic, optionally substituted heteroalkylene, optionally substituted heteroalkenylene, optionally substituted heteroalkynylene, optionally substituted aromatic, optionally substituted arylene, optionally substituted heteroaromatic, optionally substituted heteroarylene, oxy (—O—), imino (e.g., —NR— or —$N(SiR_3)$—), or silyl (e.g., —$SiR_2$—), as well as combinations thereof (e.g., —$SiR_2$—NR—, —NR—$SiR_2$—, —$SiR_2$—NR—$SiR_2$—, and the like). In particular embodiments, each R is, independently, H, optionally substituted aliphatic, optionally substituted alkyl, optionally substituted alkenyl, optionally substituted alkynyl, optionally substituted heteroaliphatic, optionally substituted aromatic, optionally substituted aryl, and optionally substituted heteroaromatic.

In some embodiments, R' is H, optionally substituted amino (e.g., —$NR_2$), aliphatic-oxy (e.g., alkoxy or —OR), aliphatic-carbonyl (e.g., alkanoyl or —C(O)R), aliphatic-carbonyloxy (e.g., alkanoyloxy or —OC(O)R), aliphatic-oxycarbonyl (e.g., alkoxycarbonyl or —C(O)OR), silyl (e.g., —$SiR_3$ or —$SiR_2$-L-$SiR_3$), aliphatic-oxy-silyl (e.g., alkoxysilyl or —$Si(R)_a(OR)_b$), aminosilyl (e.g., —$Si(R)_a(NR_2)_b$), silyloxy (e.g., —O—$SiR_3$), aliphatic-oxy-silyloxy (e.g., alkoxysilyloxy or —O—$Si(R)_a(OR)_b$), aminosilyloxy (e.g., —O—$Si(R)_a(NR_2)_b$), aromatic (e.g., aryl), aromatic-oxy (e.g., aryloxy or —OR), hydroxyl (—OH), formyl (—C(O)H), and the like. In particular embodiments, each R is, independently, H, optionally substituted aliphatic, optionally substituted alkyl, optionally substituted alkenyl, optionally substituted alkynyl, optionally substituted heteroaliphatic, optionally substituted aromatic, optionally substituted aryl, and optionally substituted heteroaromatic; $a \geq 0$; $b \geq 1$; and $a+b=3$. In some embodiments, two R groups can be taken together, with the nitrogen atom to which each is attached, to form an optionally substituted heterocyclyl. In other embodiments, each R is, independently, H, optionally substituted alkyl, optionally substituted alkenyl, optionally substituted alkynyl, or optionally substituted aryl. L can be any useful linker (e.g., a covalent bond, optionally substituted alkylene, optionally substituted heteroalkylene, oxy, imino, silyl, or the like).

In other embodiments, R'' is H, optionally substituted aliphatic, optionally substituted heteroaliphatic, optionally substituted alkyl, optionally substituted silyl, or optionally substituted silyloxy. In some embodiments, R'' is optionally substituted alkyl (e.g., Me, Et, nPr, iPr, sBu, or tBu). In other embodiments, R'' is —$SiR'_3$, —$SiR_3$, —$Si(R')_a(OR)_b$, —$Si(R)_a(OR)_b$, —$Si(R')_a(NR_2)_b$, —$Si(R)_a(NR_2)_b$, —$Si(R')_a(OR)_b(NR_2)_c$, —$Si(R)_a(OR)_b(NR_2)_c$, —O—$SiR'_3$, —O—$SiR_3$, —O—$Si(R')_a(OR)_b$, —O—$Si(R)_a(OR)_b$, —O—$Si(R')_a(NR_2)_b$, —O—$Si(R)_a(NR_2)_b$, —O—$Si(R')_a(OR)_b(NR_2)_c$, or —O—$Si(R)_a(OR)_b(NR_2)_c$ in which each R' is, independently, H, aliphatic, heteroaliphatic, aromatic, heteroaromatic, amino, hydrazino, azido, hydroxyl, silyl, silyloxy, cyanato, isocyanato, cyano, or isocyano, in which any of these may be optionally substituted; each R is, independently, H, optionally substituted aliphatic, optionally substituted heteroaliphatic, optionally substituted aromatic, or optionally substituted heteroaromatic; each of a, b, and $c \geq 0$; and $a+b+c=3$ or $a+b=3$ (if c is not present). In particular embodiments, R is H, optionally substituted alkyl, optionally substituted alkenyl, or optionally substituted alkynyl.

The precursor can include one or more disilanyl groups and amino groups. In one embodiment, the precursor has a formula of $R''_2N—SiR'_2—SiR'_3$, wherein L, R', and R'' can be any described herein. In other embodiments, the precursor has a formula of $R''_2N—SiH_2—SiH_3$, wherein R'' is any described herein. In another embodiment, the precursor has a formula of $(R'')_{3-y}N—(SiR'_2—SiR'_3)_y$, wherein y, R', and R'' can be any described herein. In yet another embodiment, the precursor has a formula of $(R'')_{3-y}N—(SiH_2—SiH_3)_y$, wherein y and R'' can be any described herein.

The precursor can include a bivalent disilanyl group. In one embodiment, the precursor has a formula of $R''_2N—SiR'_2—SiR'_2\text{-L-}NR''_2$, wherein L, R', and R'' can be any described herein. In another embodiment, the precursor has a formula of $R''_2N—SiR'_2—SiR'_2—NR''_2$, wherein R' and R'' can be any described herein.

A linker L can be present between two silyl group. In one embodiment, the precursor has a formula of $R''_2N—SiR'_2\text{-L-}SiR'_3$ or $R''N—(SiR'_2\text{-L-}SiR'_3)_2$, wherein L, R', and R'' can be any described herein. In another embodiment, the precursor has a formula of $R''_2N—SiR'_2\text{-L-}SiR'_2—NR''_2$, wherein L, R', and R'' can be any described herein. In yet another embodiment, the precursor has a formula of $(R'')_{3-y}N—(SiR'_2\text{-L-}SiH_3)_y$, wherein y, L, R', and R'' can be any described herein.

The precursor can include —$SiH_3$ as the silyl group. In one embodiment, the precursor has a formula of $R''_2N—SiH_2—SiH_3$, wherein R'' can be any described herein. In another embodiment, the precursor has a formula of $(R'')N—(SiH_2\text{-L-}SiH_3)_2$ or $(R'')_2N—(SiH_2\text{-L-}SiH_3)$, wherein L and R'' can be any described herein.

The precursor can include a silyl-substituted amino group, such as, e.g., —NR''—$SiR'_3$, in which R' and R'' can be any described herein. In one embodiment, the precursor has a formula of $(R')_{4-x}Si(NR''—SiR'_3)_x$ or $(R')_{4-x}Si(NH—SiR'_3)_x$, wherein x is 1, 2, 3, or 4; and in which R' and R" can be any described herein. In another embodiment, the precursor has a formula of $H_2Si(NR''—SiR'_3)_3$, wherein R' and R" can be any described herein.

The precursor can include a bis-trisilylamino group, such as, e.g., $—N(SiR'_3)_2$ in which R' can be any described herein. In one embodiment, the precursor has a formula of $R''_2N—SiR'_2—N(SiR'_3)_2$, in which R' and R" can be any described herein. In another embodiment, the precursor has a formula of $R''_2N—SiH_2—N(SiH_3)_2$, in which R' can be any described herein. In yet another embodiment, the precursor has a formula of $(R'_3Si)_2N—[SiR'_2—N(SiR'_3)]_z(SiR'_3)$, wherein z is 0, 1, 2, or 3; and in which R' and R" can be any described herein.

The precursor can include a linker L disposed between a silicon atom and a nitrogen atom. In one embodiment, the precursor has a formula of $R''_2N—SiR'_2$-L-$NR''_2$, wherein L, R', and R" can be any described herein.

The precursor can include a linker L disposed between two nitrogen atoms. In one embodiment, the precursor has a formula of $R'_3Si—SiR'_2—NR''$-L-$NR''—SiR'_2—SiR'_3$, wherein L, R', and R" can be any described herein.

The linker can include a silylimino group, such as, e.g., $—N(SiR'_3)—$, in which R' can be any described herein. In one embodiment, the precursor has a formula of $R''_2N—[SiR'_2—N(SiR'_3)]z$-$SiR'_3$ or $R''_2N—[N(SiR'_3)]z$-$SiR'_3$, in which z is 1, 2, 3, or more; and wherein R' and R" can be any described herein.

The linker can include both a silyl group and an imino group. In one embodiment, the precursor has a formula of $R''_2N—[SiR'_2—NR'']z$-$SiR'_3$, in which z is 1, 2, 3, or more; and wherein R' and R" can be any described herein.

Non-limiting precursors include, e.g., di-iso-propylaminodisilane ($[iPr_2N]—SiH_2—SiH_3$); di-sec-butylaminodisilane ($[sBu_2N]—SiH_2—SiH_3$); methylcyclohexylaminodisilane ($[MeCyN]—SiH_2—SiH_3$); methylphenylaminodisilane ($[MePhN]—SiH_2—SiH_3$); piperidinodisilane; 3,5-dimethylpiperidinodisilane; di-iso-propylaminotrisilylamine ($[iPr_2N]—SiH_2—N[SiH_3]_2$); diethyl aminotrisilylamine ($[Et_2N]—SiH_2—N[SiH_3]_2$); iso-propylaminotrisilylamine ($[iPrHN]—SiH_2—N[SiH_3]_2$); and the like.

Mixed Amines Including Silicon and Oxygen

A silicon-containing precursor can include one or more amino groups substituted with a silyl group, thereby providing a non-limiting mixed amine. In one embodiment, the precursor has a formula of $(R'')_{3-y}N[Si(OR''')_xR'_{3-x}]_y$, wherein:

each of x and y is, independently, 1, 2, or 3;

each R' is, independently, H, aliphatic, aliphatic-carbonyl, aliphatic-carbonyloxy, aliphatic-oxy, aliphatic-oxycarbonyl, heteroaliphatic, heteroaliphatic-carbonyl, heteroaliphatic-carbonyloxy, heteroaliphatic-oxy, heteroaliphatic-oxycarbonyl, aromatic, aromatic-carbonyl, aromatic-carbonyloxy, aromatic-oxy, aromatic-oxycarbonyl, heteroaromatic, heteroaromatic-oxy, amino, hydrazino, azido, hydroxyl, silyl, silyloxy, cyanato, isocyanato, cyano, or isocyano, in which any of these may be optionally substituted;

each R" is, independently, H, aliphatic, heteroaliphatic, aromatic, heteroaromatic, or amino, in which any of these may be optionally substituted; or optionally in which two R" can be taken together, with the nitrogen atom to which each is attached, to form an optionally substituted heterocyclyl; and each R''' is, independently, H, aliphatic, heteroaliphatic, aromatic, heteroaromatic, silyl, or silyloxy, in which any of these may be optionally substituted.

Non-limiting examples of R', R", and R''' are described herein, e.g., such as for amino silane, siloxane, silyl amine, or derivatives thereof.

The precursor can include any combination of R" groups and silicon-containing groups. In one embodiment, the precursor has a formula of $(R'')_{3-y}N[Si(OR^{Ak})_xR^{Ak}{}_{3-x}]_y$ or $(R^{Ak})_{3-y}N\,[Si(OR^{Ak})_xR^{Ak}{}_{3-x}]_y$, in which R", x, and y is any described herein; and wherein $R^{Ak}$ is H, optionally substituted aliphatic, or optionally substituted heteroaliphatic. In particular embodiments, $R^{Ak}$ is H, optionally substituted alkyl, optionally substituted alkenyl, or optionally substituted alkynyl. In other embodiments, the precursor has a formula of $(R'')_{3-y}N\,[Si(OR^{Ak})_xH_{3-x}]_y$ or $(R'')_{3-y}N[Si(OR^{Ak})H(R^{Ak})]_y$, in which R", $R^{Ak}$, x, and y is any described herein.

The precursor can include two silicon-containing groups. In one embodiment, the precursor has a formula of $(R'')N[Si(OR^{Ak})_xR^{Ak}{}_{3-x}]_2$ or $(R^{Ak})N[Si(OR^{Ak})_xR^{Ak}{}_{3-x}]_2$, in which R", $R^{Ak}$, x, and y is any described herein. In particular embodiments, x is 1 or 2.

The precursor can include a hydrogen atom attached to the nitrogen atom. In one embodiment, the precursor has a formula of $(H)_{3-y}N[Si(OR^{Ak})_xR^{Ak}{}_{3-x}]_y$ or $(H)_{3-y}N[Si(OR^{Ak})_xH_{3-x}]_y$ or $(H)_{3-y}N[Si(OR^{Ak})H(R^{Ak})]_y$, in which $R^{Ak}$, x, and y is any described herein. In particular embodiments, x is 1 or 2.

Non-limiting precursors include, e.g., bis(dimethoxysilyl)amine ($NH[Si(OMe)_2H]_2$); bis(diethoxysilyl)amine ($NH[Si(OEt)_2H]_2$); N-iso-propylbis(diethoxysilyl)amine ($NiPr[Si(OEt)_2H]_2$); bis(methoxymethylsilyl)amine ($NH[Si(OMe)MeH]_2$); tris(dimethoxysilyl) amine ($N[Si(OMe)_2H]_3$); tris(methoxymethylsilyl)amine ($N[Si(OMe)MeH]_3$); tris(diethoxysilyl) amine ($N[Si(OEt)_2H]_3$); tris(trimethoxysilyl) amine ($N[Si(OMe)_3]_3$); and the like.

Cyclic Silazanes

A silicon-containing precursor can include a cyclic group having one or more nitrogen atoms. In one embodiment, the precursor has a formula of $[NR''—(SiR'_2)_n]_z$, wherein:

z is 1, 2, 3, 4, 5, or more;

n is 1, 2, or 3;

each R' is, independently, H, aliphatic, aliphatic-carbonyl, aliphatic-carbonyloxy, aliphatic-oxy, aliphatic-oxycarbonyl, heteroaliphatic, heteroaliphatic-carbonyl, heteroaliphatic-carbonyloxy, heteroaliphatic-oxy, heteroaliphatic-oxycarbonyl, aromatic, aromatic-carbonyl, aromatic-carbonyloxy, aromatic-oxy, aromatic-oxycarbonyl, heteroaromatic, heteroaromatic-oxy, amino, hydrazino, azido, hydroxyl, silyl, silyloxy, cyanato, isocyanato, cyano, or isocyano, in which any of these may be optionally substituted; and each R" is, independently, H, aliphatic, heteroaliphatic, aromatic, heteroaromatic, amino, silyl, or silyloxy, in which any of these may be optionally substituted; or optionally in which two R" can be taken together, with the nitrogen atom to which each is attached, to form an optionally substituted heterocyclyl.

In one embodiment, the precursor has a formula of $[NR''—(SiR'_2)_n$-L-$(SiR'_2)_n]_z$, wherein:

z is 1, 2, 3, 4, 5, or more;

each n is, independently, 1, 2, or 3;

each L is, independently, a linker, such as a covalent bond, optionally substituted aliphatic, optionally substituted heteroaliphatic, optionally substituted aromatic, optionally substituted heteroaromatic, oxy (—O—), imino, or silyl, as well as combinations thereof;

each R' is, independently, H, aliphatic, aliphatic-carbonyl, aliphatic-carbonyloxy, aliphatic-oxy, aliphatic-oxycarbonyl, heteroaliphatic, heteroaliphatic-carbonyl, heteroaliphatic-carbonyloxy, heteroaliphatic-oxy, heteroaliphatic-oxycarbonyl, aromatic, aromatic-carbonyl, aromatic-carbonyloxy, aromatic-oxy, aromatic-oxycarbonyl, heteroaromatic, heteroaromatic-oxy, amino, hydrazino, azido, hydroxyl, silyl, silyloxy, cyanato, isocyanato, cyano, or isocyano, in which any of these may be optionally substituted; and each R" is, independently, H, aliphatic, heteroaliphatic, aromatic, heteroaromatic, amino, silyl, or silyloxy, in which any of these may be optionally substituted; or optionally in which two R" can be taken together, with the nitrogen atom to which each is attached, to form an optionally substituted heterocyclyl.

In another embodiment, the precursor has a formula of $[NR''\text{-}L\text{-}NR''—(SiR'_2)_n]_z$, wherein:

z is 1, 2, 3, 4, 5, or more; each n is, independently, 1, 2, or 3; and in which R' and R" can be any described herein.

In yet another embodiment, the precursor has a formula of $[L\text{-}(SiR'_2)_n]_z$, wherein:

z is 1, 2, 3, 4, 5, or more; each n is, independently, 1, 2, or 3; L is imino (e.g., —NR—), optionally substituted aliphatic, optionally substituted heteroaliphatic, or combinations thereof; and in which R' can be any described herein. In particular embodiments, if L does not include a heteroatom, then R' includes one or more heteroatoms (e.g., nitrogen atoms).

In one embodiment, the precursor has a formula of

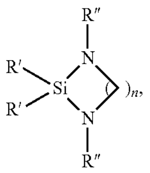

wherein R' and R" can be any described herein, and wherein n is 1, 2, 3, or 4.

In another embodiment, the precursor has a formula of

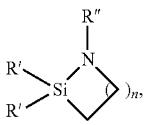

wherein R' and R" can be any described herein, and wherein n is 1, 2, 3, or 4.

In yet another embodiment, the precursor has a formula of

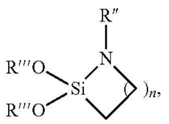

wherein R" and R"' can be any described herein, and wherein n is 1, 2, 3, or 4. In particular embodiments, each R"' is, independently, H, aliphatic, heteroaliphatic, aromatic, heteroaromatic, silyl, or silyloxy, in which any of these may be optionally substituted.

In one embodiment, the precursor has a formula of

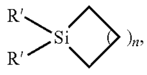

wherein R' can include a heteroatom (e.g., a nitrogen atom, such as in optionally substituted amino, azido, isocyanato, or optionally substituted hydrazino), and wherein n is 1, 2, 3, or 4.

In some embodiments, L includes optionally substituted aliphatic, optionally substituted alkylene, optionally substituted alkenylene, optionally substituted alkynylene, optionally substituted heteroaliphatic, optionally substituted heteroalkylene, optionally substituted heteroalkenylene, optionally substituted heteroalkynylene, optionally substituted aromatic, optionally substituted arylene, optionally substituted heteroaromatic, optionally substituted heteroarylene, oxy (—O—), imino (e.g., —NR— or —$N(SiR_3)$—), or silyl (e.g., —$SiR_2$—), as well as combinations thereof (e.g., —$SiR_2$—NR—, —NR—$SiR_2$—, —$SiR_2$—NR—$SiR_2$—, and the like). In particular embodiments, each R is, independently, H, optionally substituted aliphatic, optionally substituted alkyl, optionally substituted alkenyl, optionally substituted alkynyl, optionally substituted heteroaliphatic, optionally substituted aromatic, optionally substituted aryl, and optionally substituted heteroaromatic.

In other embodiments, L is an optionally substituted alkylene, and at least one R' includes an optionally substituted heteroaliphatic, optionally substituted amino, optionally substituted aliphatic-oxy, or optionally substituted alkoxy.

In some embodiments, each R' is, independently, H, optionally substituted aliphatic, optionally substituted alkyl, optionally substituted alkenyl, optionally substituted alkynyl, optionally substituted aromatic, or optionally substituted aryl. In other embodiments, each R' is, independently, optionally substituted heteroaliphatic, optionally substituted amino, or optionally substituted alkoxy.

In other embodiments, each R" is, independently, H, optionally substituted aliphatic, optionally substituted alkyl, optionally substituted alkenyl, optionally substituted alkynyl, optionally substituted silyl, optionally substituted amino, optionally substituted aromatic, optionally substituted aryl, optionally substituted heteroaromatic, or optionally substituted heteroaryl.

Non-limiting precursors include 1,3,3-trimethylcyclodisilazane ($[NH—SiMe_2][NH—SiMeH]$); hexamethylcyclotrisilazane ($[NH—SiMe_2]_3$); octamethylcyclotetrasilazane ($[NH—SiMe_2]_4$); and the like.

Cyclic Siloxanes

A silicon-containing precursor can include a cyclic group having one or more oxygen atoms. In one embodiment, the precursor has a formula of $[L\text{-}(SiR'_2)_n]_z$, wherein:

z is 1, 2, 3, 4, 5, or more;

n is 1, 2, or 3;

L is an oxygen-containing linker (e.g., oxy or heteroalkylene); and each R' is, independently, H, aliphatic, aliphatic-carbonyl, aliphatic-carbonyloxy, aliphatic-oxy, aliphatic-oxycarbonyl, heteroaliphatic, heteroaliphatic-carbonyl, heteroaliphatic-carbonyloxy, heteroaliphatic-oxy, heteroaliphatic-oxycarbonyl, aromatic, aromatic-carbonyl, aromatic-carbonyloxy, aromatic-oxy, aromatic-oxycarbonyl, heteroaromatic, heteroaromatic-oxy, amino, hydrazino, azido, hydroxyl, silyl, silyloxy, cyanato, isocyanato, cyano, or isocyano, in which any of these may be optionally substituted.

In one embodiment, the precursor has a formula of [O-L'-O—$(SiR'_2)_n]_z$, wherein:

z is 1, 2, 3, 4, 5, or more;

n is 1, 2, or 3;

each L' is, independently, a linker, such as optionally substituted aliphatic, optionally substituted heteroaliphatic, optionally substituted aromatic, optionally substituted heteroaromatic, optionally substituted silyl (e.g., —$SiR_2$—), optionally substituted alkylene (e.g., —$(CH_2)_n$—, in which n is 1 to 6), and optionally substituted arylene; and in which R' is any described herein.

In another embodiment, the precursor has a formula of [O—$(SiR'_2)_n$-L-$(SiR'_2)_n]_z$, wherein:

z is 1, 2, 3, 4, 5, or more;

each n is, independently, 1, 2, or 3;

each L is, independently, a linker, such as a covalent bond, optionally substituted aliphatic, optionally substituted heteroaliphatic, optionally substituted aromatic, optionally substituted heteroaromatic, oxy (—O—), imino, or silyl, as well as combinations thereof, and in which R' is any described herein.

In yet another embodiment, the precursor has a formula of [L-$(SiR'_2)_n]_z$, wherein:

z is 1, 2, 3, 4, 5, or more; each n is, independently, 1, 2, or 3; L is oxy (—O—), optionally substituted aliphatic, optionally substituted heteroaliphatic, or combinations thereof, and in which R' can be any described herein. In particular embodiments, if L does not include a heteroatom, then R' includes one or more heteroatoms (e.g., oxygen atoms).

In one embodiment, the precursor has a formula of

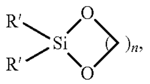

wherein R' can be any described herein, and wherein n is 1, 2, 3, or 4.

In another embodiment, the precursor has a formula of

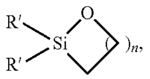

wherein R' and R" can be any described herein, and wherein n is 1, 2, 3, or 4.

In yet another embodiment, the precursor has a formula of

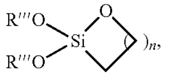

wherein R''' can be any described herein, and wherein n is 1, 2, 3, or 4. In particular embodiments, each R''' is, independently, H, aliphatic, heteroaliphatic, aromatic, heteroaromatic, silyl, or silyloxy, in which any of these may be optionally substituted.

In one embodiment, the precursor has a formula of

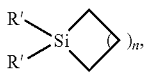

wherein R' can include a heteroatom (e.g., an oxygen atom, such as in optionally substituted aliphatic-oxy, aliphatic-oxycarbonyl, aliphatic-carbonyl, aliphatic-carbonyloxy, optionally substituted alkoxy, optionally substituted alkoxycarbonyl, optionally substituted alkanoyl, optionally substituted alkanoyloxy, and the like), and wherein n is 1, 2, 3, or 4.

In some embodiments, each R' is, independently, H, optionally substituted aliphatic, optionally substituted alkyl, optionally substituted alkenyl, optionally substituted alkynyl, optionally substituted aminoalkyl, optionally substituted aromatic, or optionally substituted aryl. In other embodiments, each R' is, independently, optionally substituted heteroaliphatic, optionally substituted amino, or optionally substituted alkoxy.

Non-limiting precursors include, e.g., tetramethylcyclotetrasiloxane ($[OSiHMe]_4$ or TMCTS); hexamethylcyclotetrasiloxane ($[OSiMe_2OSiHMe]_2$ or HMCTS); octamethyl cyclotetrasiloxane ($[OSiMe_2]_4$, $C_8H_{24}O_4Si_4$, or OMCTS); decamethylcyclopentasiloxane ($[OSiMe_2]_5$ or $C_{10}H_{30}O_5Si_5$); 2-dimethylamino-2,4,4,6,6-pentamethylcyclotrisiloxane ($[OSiMe_2]_2[OSiMe(NMe_2)]$); 2-dimethylamino-2,4,4,6,6,8,8-heptamethylcyclotetrasiloxane ($[OSiMe_2]_3[OSiMe(NMe_2)]$); and the like.

Amino Siloxane and Derivatives Thereof

A silicon-containing precursor can include siloxane or a derivative thereof and having one or more amino substitutions, thereby providing a siloxane or a derivative thereof having one or more Si—O, O—Si—O, or Si—O—Si bonds and having one or more —$NR_2$ substitutions. In one embodiment, the precursor has a formula of $(R'')_{3-y}N[SiR'_2$—$(OSiR'_2)_z$—$R']_y$, wherein:

y is 1, 2, or 3;

z is 1, 2, 3, or more;

each R' is, independently, H, aliphatic, aliphatic-carbonyl, aliphatic-carbonyloxy, aliphatic-oxy, aliphatic-oxycarbonyl, heteroaliphatic, heteroaliphatic-carbonyl, heteroaliphatic-carbonyloxy, heteroaliphatic-oxy, heteroaliphatic-oxycarbonyl, aromatic, aromatic-carbonyl, aromatic-carbonyloxy, aromatic-oxy, aromatic-oxycarbonyl, heteroaromatic, heteroaromatic-oxy, amino, hydrazino, azido, hydroxyl, silyl, silyloxy, cyanato, isocyanato, cyano, or isocyano, in which any of these may be optionally substituted; and each R" is, independently, H, aliphatic, heteroaliphatic, aromatic, heteroaromatic, or amino, in which any of these may be optionally substituted; or optionally in which two R" can be taken together, with the nitrogen atom to which each is attached, to form an optionally substituted heterocyclyl.

In another embodiment, the precursor has a formula of $(R'')_{3-y}N$ $[(SiR'_2$—$O)_z$—$SiR'_3]_y$, wherein R', R", y, and z can be any described herein.

The precursor can include an optionally substituted amino group with an optionally substituted silyl group. In one embodiment, the precursor has a formula of $R''_2N$—$SiR'_2$—$(OSiR'_2)_z$—R' or $R''_2N$—$SiR'_2$—O—$SiR'_3$, wherein R', R", and z can be any described herein. In another embodiment, the precursor has a formula of $R''_2N(SiR'_2$—$O)_z$—$SiR'_3$, wherein R', R", and z can be any described herein.

The precursor can include two optionally substituted amino group. In one embodiment, the precursor has a formula of $R''_2N—SiR'_2—(OSiR'_2)_z—NR''_2$, wherein R', R", and z can be any described herein.

In some embodiments, R' is H, optionally substituted aliphatic, optionally substituted alkyl, optionally substituted alkenyl, or optionally substituted alkynyl. In other embodiments, R" is H, optionally substituted aliphatic, optionally substituted alkyl, optionally substituted alkenyl, or optionally substituted alkynyl. In particular embodiments, z is 1, 2, or 3.

Non-limiting precursors can include, e.g., 1-dimethylamino-pentamethyldisiloxane ($Me_2N—SiMe_2$-$OSiMe_3$); 1-diethylamino-pentamethyldisiloxane ($Et_2N—SiMe_2$-$OSiMe_3$); 1-ethylmethylamino-pentamethyldisiloxane (EtMeN-$SiMe_2$-$OSiMe_3$); 1,3-bis(dimethylamino) tetramethyldisiloxane ($Me_2N—SiMe_2$-$OSiMe_2$-$NMe_2$); 1-dimethylamino-heptamethyltrisiloxane ($Me_2N—SiMe_2$-$[OSiMe_2]_2$-Me); 1,5-bis(dimethylamino) hexamethyltrisiloxane ($Me_2N—SiMe_2$-$[OSiMe_2]_2—NMe_2$); and the like.

Silanols, Including Alkyl Silanols or Alkoxy Silanols

A silicon-containing precursor can include one or more hydroxyl groups, thereby providing a non-limiting silanol. In one embodiment, the precursor has a formula of $(R')_{4-x}Si(OH)_x$, wherein:

x is 1, 2, 3, or 4; and each R' is, independently, H, aliphatic, aliphatic-carbonyl, aliphatic-carbonyloxy, aliphatic-oxy, aliphatic-oxycarbonyl, heteroaliphatic, heteroaliphatic-carbonyl, heteroaliphatic-carbonyloxy, heteroaliphatic-oxy, heteroaliphatic-oxycarbonyl, aromatic, aromatic-carbonyl, aromatic-carbonyloxy, aromatic-oxy, aromatic-oxycarbonyl, heteroaromatic, heteroaromatic-oxy, amino, hydrazino, azido, hydroxyl, silyl, silyloxy, cyanato, isocyanato, cyano, or isocyano, in which any of these may be optionally substituted.

In other embodiments, the precursor has a formula of $(R')_zSi(OH)_x(OR''')_y$, wherein:

x is 1, 2, 3, or 4;

each of y and z is, independently, 0, 1, 2, or 3;

$x+y+z=4$;

each R' is, independently, H, aliphatic, aliphatic-carbonyl, aliphatic-carbonyloxy, aliphatic-oxy, aliphatic-oxycarbonyl, heteroaliphatic, heteroaliphatic-carbonyl, heteroaliphatic-carbonyloxy, heteroaliphatic-oxy, heteroaliphatic-oxycarbonyl, aromatic, aromatic-carbonyl, aromatic-carbonyloxy, aromatic-oxy, aromatic-oxycarbonyl, heteroaromatic, heteroaromatic-oxy, amino, hydrazino, azido, hydroxyl, silyl, silyloxy, cyanato, isocyanato, cyano, or isocyano, in which any of these may be optionally substituted; and each R''' is, independently, H, aliphatic, heteroaliphatic, aromatic, heteroaromatic, silyl, or silyloxy, in which any of these may be optionally substituted.

The precursor can have one hydroxyl group. In one embodiment, the precursor has a formula of $(R')_3Si(OH)$, in which each R' can be any described herein. In another embodiment, the precursor has a formula of $Si(OH)(OR''')_3$, in which each R''' can be any described herein. In particular embodiments, R''' is optionally substituted alkyl (e.g., Me, Et, nPr, iPr, sBu, or tBu), in which the optionally substituted alkyl is linear, branched, substituted, or unsubstituted.

Non-limiting precursors include, e.g., tri(t-butoxy)silanol ($SiOH[OtBu]_3$); tri(t-pentoxy)silanol ($SiOH[OtPe]_3$); and the like.

Carbonyloxy Silanes

A silicon-containing precursor can include one or more optionally substituted aliphatic-carbonyloxy groups, thereby providing a non-limiting carbonyloxy silane. In one embodiment, the precursor has a formula of $(R')_{4-x}Si(OC(O)—R'''')_x$, wherein:

x is 1, 2, 3, or 4;

each R' is, independently, H, aliphatic, aliphatic-carbonyl, aliphatic-oxy, aliphatic-oxycarbonyl, heteroaliphatic, heteroaliphatic-carbonyl, heteroaliphatic-oxy, heteroaliphatic-oxycarbonyl, aromatic, aromatic-carbonyl, aromatic-oxy, aromatic-oxycarbonyl, heteroaromatic, heteroaromatic-oxy, amino, hydrazino, azido, hydroxyl, silyl, silyloxy, cyanato, isocyanato, cyano, or isocyano, in which any of these may be optionally substituted; and each R'''' is, independently, H, aliphatic, heteroaliphatic, aromatic, heteroaromatic, amino, or aminooxy, in which any of these may be optionally substituted.

In another embodiment, the precursor has a formula of $(R''''—C(O)O)_x(R')_{3-x}Si$-L-$Si(R')_{3-x}(OC(O)—R'''')_x$, wherein:

each x is, independently, 0, 1, 2, or 3;

L is a linker, such as a covalent bond, optionally substituted aliphatic, optionally substituted heteroaliphatic, optionally substituted aromatic, optionally substituted heteroaromatic, oxy (—O—), imino, or silyl;

each R' is, independently, H, aliphatic, aliphatic-carbonyl, aliphatic-oxy, aliphatic-oxycarbonyl, heteroaliphatic, heteroaliphatic-carbonyl, heteroaliphatic-oxy, heteroaliphatic-oxycarbonyl, aromatic, aromatic-carbonyl, aromatic-oxy, aromatic-oxycarbonyl, heteroaromatic, heteroaromatic-oxy, amino, hydrazino, azido, hydroxyl, silyl, silyloxy, cyanato, isocyanato, cyano, or isocyano, in which any of these may be optionally substituted; and each R'''' is, independently, H, aliphatic, heteroaliphatic, aromatic, heteroaromatic, amino, or aminooxy, in which any of these may be optionally substituted.

In some embodiments, R' is H, optionally substituted amino (e.g., $—NR_2$), aliphatic-oxy (e.g., alkoxy or —OR), aliphatic-carbonyl (e.g., alkanoyl or —C(O)R), aliphatic-oxycarbonyl (e.g., alkoxycarbonyl or —C(O)OR), silyl (e.g., $—SiR_3$), aliphatic-oxy-silyl (e.g., alkoxysilyl or $—Si(R)_a(OR)_b$), aminosilyl (e.g., $—Si(R)_a(NR_2)_n$), silyloxy (e.g., $—O—SiR_3$), aliphatic-oxy-silyloxy (e.g., alkoxysilyloxy or $—O—Si(R)_a(OR)_b$), aminosilyloxy (e.g., $—O—Si(R)_a(NR_2)_b$), aromatic (e.g., aryl), aromatic-oxy (e.g., aryloxy or —OR), hydroxyl (—OH), formyl (—C(O)H), and the like. In particular embodiments, each R is, independently, H, optionally substituted aliphatic, optionally substituted alkyl, optionally substituted alkenyl, optionally substituted alkynyl, optionally substituted heteroaliphatic, optionally substituted aromatic, optionally substituted aryl, and optionally substituted heteroaromatic; $a \geq 0$; $b \geq 1$; and $a+b=3$. In some embodiments, two R groups can be taken together, with the nitrogen atom to which each is attached, to form an optionally substituted heterocyclyl. In other embodiments, each R is, independently, H, optionally substituted alkyl, optionally substituted alkenyl, optionally substituted alkynyl, or optionally substituted aryl.

In some embodiments, R'''' is H, optionally substituted alkyl, optionally substituted alkenyl, optionally substituted alkynyl, optionally substituted alkoxy, optionally substituted aryloxy, optionally substituted amino, or optionally substituted aminooxy.

Non-limiting precursors include those having a formula of $(R')_2Si(OC(O)—R'''')_2$, wherein R' and R'''' can be any described herein.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method for processing substrates, the method comprising:

providing a semiconductor substrate, wherein the semiconductor substrate includes a metal layer formed in a dielectric layer and a barrier layer between the metal layer and the dielectric layer, the metal layer having an exposed metal surface and the barrier layer having an exposed barrier surface;

selectively depositing graphene on the exposed metal surface;

after selectively depositing graphene on the exposed metal surface, selectively depositing an inhibitor layer on the exposed barrier surface; and selectively depositing a dielectric material on the dielectric layer.

2. The method of claim 1, wherein the inhibitor layer is selectively deposited on the exposed barrier surface before the dielectric material is selectively deposited on the dielectric layer.

3. The method of claim 1, wherein the inhibitor layer is a dielectric material.

4. The method of claim 1, wherein the inhibitor layer is a material selected from the group consisting of amides, beta-diketonates, and halides.

5. The method of claim 1, wherein the inhibitor layer comprises molecules having a hydrocarbon group.

6. The method of claim 1, wherein the inhibitor layer is deposited using an organometallic deposition precursor.

7. The method of claim 1, wherein the inhibitor layer is deposited using reactants selected from the group consisting of alcohols and amides.

8. The method of claim 1, wherein the barrier layer comprises a metal nitride.

9. A semiconductor device comprising:

a first dielectric layer;

a barrier layer lining the first dielectric layer;

a first metal layer formed in the first dielectric layer on the barrier layer;

a selective graphene film selectively formed on a top surface of the first metal layer relative to the first dielectric layer;

a selective inhibitor layer selectively formed on a top surface of the barrier layer relative to the selective graphene film and the first dielectric layer; and a selective dielectric layer selectively formed on a top surface of the first dielectric layer relative to the first metal layer and the barrier layer.

10. An apparatus for processing substrates, the apparatus comprising:

one or more process chambers, each process chamber comprising a chuck;

one or more gas inlets into the process chambers and associated flow-control hardware; and a controller having at least one processor and a memory, wherein the at least one processor and the memory are communicatively connected with one another, the at least one processor is at least operatively connected with the flow-control hardware, and the memory stores computer-executable instructions for controlling the at least one processor to at least control the flow-control hardware to:

cause introduction of a hydrocarbon precursor to selectively deposit graphene on an exposed metal surface of a substrate;

cause introduction of an organometallic deposition precursor to selectively deposit an inhibitor layer on an exposed barrier surface of the substrate; and cause introduction of a dielectric deposition precursor to selectively form a dielectric material on a dielectric layer on the substrate.

* * * * *